(12) United States Patent
Kim et al.

(10) Patent No.: US 12,010,858 B2
(45) Date of Patent: Jun. 11, 2024

(54) ORGANIC LIGHT-EMITTING DEVICE

(71) Applicants: Samsung Electronics Co., Ltd., Suwon-si (KR); Samsung SDI Co., Ltd., Yongin-si (KR)

(72) Inventors: Joonghyuk Kim, Seoul (KR); Hosuk Kang, Suwon-si (KR); Sunghan Kim, Seongnam-si (KR); Jongsoo Kim, Seoul (KR); Youngmok Son, Hwaseong-si (KR); Myungsun Sim, Suwon-si (KR); Sooghang Ihn, Hwaseong-si (KR)

(73) Assignees: SAMSUNG ELECTRONICS CO., LTD., Gyeonggi-Do (KR); SAMSUNG SDI CO., LTD., Gyeonggi-Do (KR)

( * ) Notice: Subject to any disclaimer, the term of this patent is extended or adjusted under 35 U.S.C. 154(b) by 574 days.

(21) Appl. No.: 16/364,684

(22) Filed: Mar. 26, 2019

(65) Prior Publication Data
US 2019/0296256 A1  Sep. 26, 2019

(30) Foreign Application Priority Data

Mar. 26, 2018 (KR) .......................... 10-2018-0034277

(51) Int. Cl.
*H10K 50/11* (2023.01)
*C09K 11/06* (2006.01)
(Continued)

(52) U.S. Cl.
CPC .............. *H10K 50/11* (2023.02); *C09K 11/06* (2013.01); *H10K 85/342* (2023.02);
(Continued)

(58) Field of Classification Search
CPC ............ H01L 51/5016; H01L 51/0085; H01L 51/0072; H01L 2251/5384;
(Continued)

(56) References Cited

U.S. PATENT DOCUMENTS 8,722,206 B2  5/2014  Ono et al.
8,994,043 B2  3/2015  Seo et al.
(Continued)

FOREIGN PATENT DOCUMENTS

CN  107043346 B  9/2021
KR  1020110027579 A  3/2011
(Continued)

OTHER PUBLICATIONS

Kevin P. Klubek "Investigating blue phosphorescent iridium cyclometalated dopant with phenyl-imidazole ligands" Organic Electronics 15 (2014) 3127-3136 (Year: 2014).*
(Continued)

*Primary Examiner* — Michael Y Sun
(74) *Attorney, Agent, or Firm* — CANTOR COLBURN LLP

(57) ABSTRACT

An organic light-emitting device which including a first electrode, a second electrode facing the first electrode, and an emission layer disposed between the first electrode and the second electrode, wherein an emission layer includes a first material, a second material, and a third material satisfying certain conditions.

19 Claims, 1 Drawing Sheet

(51) Int. Cl.
  *H10K 85/30* (2023.01)
  *H10K 85/60* (2023.01)
  *H10K 101/00* (2023.01)
  *H10K 101/10* (2023.01)
  *H10K 101/30* (2023.01)
  *H10K 102/00* (2023.01)

(52) U.S. Cl.
  CPC .. *H10K 85/6572* (2023.02); *C09K 2211/1044* (2013.01); *C09K 2211/185* (2013.01); *H10K 2101/10* (2023.02); *H10K 2101/30* (2023.02); *H10K 2101/90* (2023.02); *H10K 2102/351* (2023.02)

(58) Field of Classification Search
  CPC ......... H01L 2251/552; H01L 2251/558; H01L 51/0071; H01L 2251/55; H01L 51/5024; H01L 51/5076; H01L 51/0073; H01L 51/56; C09K 11/06; C09K 2211/1044; C09K 2211/185
  See application file for complete search history.

(56) References Cited

U.S. PATENT DOCUMENTS

| | | | |
|---|---|---|---|
| 2003/0138657 A1* | 7/2003 | Li | H10K 85/114 428/690 |
| 2011/0057180 A1* | 3/2011 | Ono | H01L 51/5016 257/40 |
| 2012/0126221 A1 | 5/2012 | Kitamura et al. | |
| 2014/0138652 A1* | 5/2014 | Song | H01L 51/0072 548/440 |
| 2015/0318511 A1 | 11/2015 | Kim et al. | |
| 2015/0349286 A1 | 12/2015 | Forrest et al. | |
| 2016/0056401 A1 | 2/2016 | Lee et al. | |
| 2016/0164020 A1 | 6/2016 | Kim et al. | |
| 2017/0040553 A1* | 2/2017 | Watabe | H05B 33/14 |
| 2017/0077421 A1* | 3/2017 | Ihn | C09K 11/06 |
| 2017/0098780 A1 | 4/2017 | Kim et al. | |
| 2017/0186974 A1 | 6/2017 | Jung et al. | |
| 2017/0194570 A1 | 7/2017 | Kang et al. | |
| 2017/0309841 A1 | 10/2017 | Kim et al. | |
| 2019/0040314 A1* | 2/2019 | Ito | H01L 51/0059 |
| 2019/0305229 A1 | 10/2019 | Ihn et al. | |
| 2019/0319210 A1* | 10/2019 | Nakamura | H01L 51/5012 |
| 2023/0118804 A1 | 4/2023 | Kim et al. | |

FOREIGN PATENT DOCUMENTS

| | | | |
|---|---|---|---|
| KR | 2012-0025006 A | 3/2012 | |
| KR | 2015-0077587 A | 7/2015 | |
| KR | 2015-0126525 A | 11/2015 | |
| KR | 2016-0024074 A | 3/2016 | |
| KR | 2016-0045604 A | 4/2016 | |
| KR | 2017-0032148 A | 3/2017 | |
| KR | 20170040697 | 4/2017 | |
| KR | 2017-0078573 A | 7/2017 | |
| KR | 2017-0082126 A | 7/2017 | |
| KR | 20170076474 A | 7/2017 | |
| WO | WO-2017170812 A1 * | 10/2017 | C09K 11/06 |

OTHER PUBLICATIONS

Young-Seo Park et al. "Efficient triplet harvesting by fluorescent molecules through exciplexes for high efficiency organic light-emitting diodes", Applied Physics Letters 102, 153306 (2013).
English translation of Office Action dated Jan. 16, 2023, issued in corresponding KR Patent Application No. 10-2018-0034277, 7 pp.
Office Action dated Jan. 16, 2023, issued in corresponding KR Patent Application No. 10-2018-0034277, 8 pp.
English Translation of Office Action dated Aug. 23, 2023. issued in corresponding KR Patent Application No. 10-2018-0034277, 9 pp.
Office Action dated Aug. 23, 2023. issued in corresponding KR Patent Application No. 10-2018-0034277, 8 pp.
English Translation of Office Action dated Feb. 1, 2024, issued in corresponding CN Patent Application No. 201910231303.7, 8 pp.
Office Action dated Feb. 1, 2024, issued in corresponding CN Patent Application No. 201910231303.7, 6 pp.

* cited by examiner

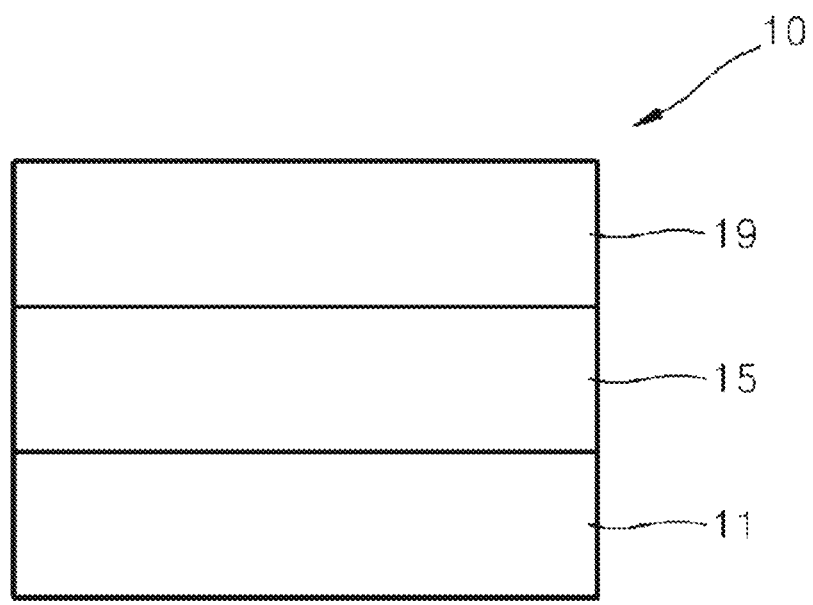

ORGANIC LIGHT-EMITTING DEVICE

CROSS-REFERENCE TO RELATED APPLICATION

This application claims priority to Korean Patent Application No. 10-2018-0034277, filed on Mar. 26, 2018, in the Korean Intellectual Property Office, and all the benefits accruing therefrom under 35 U.S.C. § 119, the content of which is incorporated herein in its entirety by reference.

BACKGROUND

1. Field

One or more embodiments relate to an organic light-emitting device.

2. Description of the Related Art

Organic light-emitting devices (OLEDs) are self-emission devices that produce full-color images, and that also have wide viewing angles, high contrast ratios, short response times, and excellent characteristics in terms of brightness, driving voltage, and response speed, compared to devices in the art.

In an example, an organic light-emitting device includes an anode, a cathode, and an organic layer disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

Various types of organic light emitting devices are known. However, there still remains a need in OLEDs having low driving voltage, high efficiency, high brightness, and long lifespan.

SUMMARY

Aspects of the present disclosure provide an organic light-emitting device including a first material, a second material, and a light-emitting material satisfying a certain condition and having a long lifespan.

Additional aspects will be set forth in part in the description which follows and, in part, will be apparent from the description, or may be learned by practice of the presented embodiments.

An aspect provides an organic light-emitting device including:
a first electrode;
a second electrode facing the first electrode; and
an emission layer disposed between the first electrode and the second electrode,
wherein
the emission layer includes a first material, a second material, and a light-emitting material,
the light-emitting material includes a transition metal-containing phosphorescent material that emits blue light having a maximum emission wavelength in a range of about 420 nanometers to about 480 nanometers,
the emission layer emits blue phosphorescence generated when an exciton of the transition metal-containing phosphorescent material transits from a triplet excited state to a ground state,
the first material and the second material are different from each other,
the first material and the second material form an exciplex,
at least one of an absolute value of a difference between triplet energy (expressed in electron volts) of the first material and singlet energy (expressed in electron volts) of the exciplex and an absolute value of a difference between triplet energy (expressed in electron volts) of the second material and singlet energy (expressed in electron volts) of the exciplex is 0.1 electron volts or less,
the triplet energy of the first material is calculated from a peak wavelength of a phosphorescence spectrum measured at 77 Kelvins with respect to a mixture of the first material and 2-methyl tetrahydrofuran (2-MeTHF),
the triplet energy of the second material is calculated from a peak wavelength of a phosphorescence spectrum measured at 77 Kelvins with respect to a mixture of the second material and 2-MeTHF, and
the singlet energy of the exciplex is calculated from a peak wavelength of a fluorescence spectrum measured at room temperature with respect to a 50-nanometer-thick thin film formed by co-depositing the first material and the second material at a weight ratio of 5:5.

BRIEF DESCRIPTION OF THE DRAWING

These and/or other aspects will become apparent and more readily appreciated from the following description of the embodiments, taken in conjunction with the FIGURE which is a schematic view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the FIGURES, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the FIGURES, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

An organic light-emitting device according to an embodiment may include:
a first electrode;
a second electrode facing the first electrode; and
an emission layer disposed between the first electrode and the second electrode,
wherein the emission layer may include a first material, a second material, and a light-emitting material.

The light-emitting material may include a transition metal-containing phosphorescent material that emits blue light having a maximum emission wavelength in a range of about 420 nanometers (nm) to about 480 nm. The light-emitting material is the same as described herein.

The emission layer may emit blue phosphorescence generated when the exciton of the transition metal-containing phosphorescent material transits from a triplet excited state to a ground state (for example, blue phosphorescence having a maximum emission wavelength in a range of about 420 nm to about 480 nm). Therefore, the organic light-emitting device is completely different from an organic light-emitting device including an emission layer including a fluorescence emitting material and emitting fluorescence by a fluorescence emission mechanism, or an organic light-emitting device emitting red light or green light.

The first material and the second material in the emission layer may be different from each other, and the first material and the second material may form exciplex.

At least one of an absolute value of a difference between triplet energy (electron volts, eV) of the first material and singlet energy (eV) of the exciplex and an absolute value of a difference between triplet energy (eV) of the second material and singlet energy (eV) of the exciplex may be 0.1 eV or less, 0 eV to 0.1 eV, 0 eV to 0.07 eV, or 0 eV to 0.05 eV.

The triplet energy of the first material may be calculated from a peak wavelength of a phosphorescence spectrum measured at 77 Kelvins with respect to a mixture of the first material and 2-MeTHF,
a method of measuring the triplet energy of the second material may be the same as the method of measuring the triplet energy of the first material (that is, the triplet energy of the second material may be calculated from a peak wavelength of a phosphorescence spectrum measured at 77K with respect to a mixture of the second material and 2-MeTHF), and
the singlet energy of the exciplex may be calculated from a peak wavelength of a fluorescence spectrum measured at room temperature with respect to a 50-nm-thick thin film formed by co-depositing the first material and the second material at a weight ratio of 5:5.

Since at least one of the absolute value of the difference between the triplet energy (eV) of the first material and the singlet energy (eV) of the exciplex and the absolute value of the difference between the triplet energy (eV) of the second material and the singlet energy (eV) of the exciplex may be each independently about 0.1 eV or less, hot exciton multi-excited to have high energy may easily move from the first material and/or the second material to the exciplex. Therefore, it is possible to effectively prevent the damage and/or decomposition of the first material and the second material due to hot exciton according to triplet-triplet annihilation (TTA) and triplet-polaron quenching (TPQ), thereby improving the lifespan of the organic light-emitting device.

In an embodiment, photoluminescence quantum yield (PLQY) of the exciplex may be 0.12 or less. For example, the PLQY of the exciplex may be about 0.05 to about 0.12, or about 0.09 to about 0.113, but embodiments of the present disclosure are not limited thereto. The PLQY of the exciplex may be evaluated by measuring the PLQY of the 50-nm-thick thin film formed by co-depositing the first material and the second material at a weight ratio of 5:5.

When the PLQY of the exciplex is within this range, energy transfer from the exciplex to the light-emitting material may be effectively achieved. Therefore, the organic light-emitting device may have high luminescence efficiency and a long lifespan.

In one or more embodiments, the singlet energy of the exciplex may be about 2.80 eV to about 3.00 eV, or about 2.85 eV to about 2.98 eV. For example, the singlet energy of the exciplex may be about 2.86 eV to about 2.92 eV, but embodiments of the present disclosure are not limited thereto.

While not wishing to be bound by theory, it is understood that when the singlet energy of the exciplex is within this range, energy transfer from the exciplex to the light-emitting material may be effectively achieved. Therefore, the organic light-emitting device may have high luminescence efficiency and a long lifespan.

The first material may not include an electron transport moiety, and the second material may include at least one electron transport moiety. For example, the first material may be a hole transport (HT) host, and the second material may be an electron transport (ET) host.

In an embodiment, the absolute value of the difference between the triplet energy (eV) of the second material and the singlet energy (eV) of the exciplex may be about 0.1 eV or less, about 0 eV to about 0.1 eV, about 0 eV to about 0.07 eV, or about 0 eV to about 0.05 eV.

For example,
a lowest unoccupied molecular orbital (LUMO) energy level absolute value of the first material may be in a range of about 0.90 eV to about 1.20 eV,
a highest occupied molecular orbital (HOMO) energy level absolute value of the first material may be in a range of about 5.20 eV to about 5.60 eV, and
a LUMO energy level absolute value of the second material may be in a range of about 1.80 eV to about 2.20 eV,
a HOMO energy level absolute value of the second material may be in a range of about 5.40 eV to about 6.00 eV, but embodiments of the present disclosure are not limited thereto.

While not wishing to be bound by theory, it is understood that when the first material and the second material are within the HOMO and LUMO energy level ranges, the charge and/or exciton movement and/or energy flow in the emission layer may be effectively achieved, thereby implementing the organic light-emitting device having high luminescence efficiency and a long lifespan.

In an embodiment, the triplet energy (eV) of the first material may be higher than or equal to the singlet energy (eV) of the exciplex. In one or more embodiments, the triplet energy (eV) of the second material may be higher than or equal to the singlet energy (eV) of the exciplex. Hot exciton multi-excited to have high energy may easily move from the first material and/or the second material to the exciplex. Therefore, it is possible to effectively prevent the damage and/or decomposition of the first material and the second material due to the hot exciton, thereby improving the lifespan of the organic light-emitting device.

In one or more embodiments, the triplet energy of the first material may be in a range of about 2.90 eV to about 3.10 eV (for example, about 2.95 eV to about 3.05 eV), but embodiments of the present disclosure are not limited thereto. While not wishing to be bound by theory, it is understood that when the first material satisfies the above-described triplet energy range, the organic light-emitting device may have a long lifespan.

In one or more embodiments, the singlet energy (eV) of the exciplex may be higher than the triplet energy (eV) of the light-emitting material.

For example, the triplet energy of the light-emitting material may be in a range of about 2.60 eV to about 2.80 eV (for example, about 2.65 eV to about 2.75 eV). A method of measuring the triplet energy of the light-emitting material may be the same as the method of measuring the triplet energy of the first material (that is, the triplet energy of the light-emitting material may be calculated from a peak wavelength of a phosphorescence spectrum measured at 77 K with respect to a mixture of the light-emitting material and 2-MeTHF).

Hereinafter, the first material, the second material, and the light-emitting material will be described in detail.

The first material may include at least one π electron-depleted nitrogen-free cyclic group and may not include an electron transport moiety, and the second material may include at least one π electron-depleted nitrogen-free cyclic group and at least one electron transport moiety. The electron transport moiety may be selected from a cyano group, a π electron-depleted nitrogen-containing cyclic group, and a group represented by one of the following Formulae:

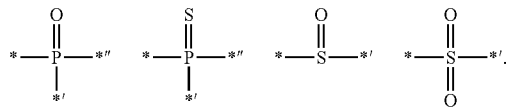

In the formulae above, *, *', and *" each indicate a binding site to a neighboring atom.

The "π electron-depleted nitrogen-containing cyclic group" is a cyclic group having at least one *—N=*' moiety, and examples thereof include an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, an azaindene group, an azaindole group, an azabenzofuran group, an azabenzothiophene group, an azabenzosilole group, an azafluorene group, an azacarbazole group, an azadibenzofuran group, an azadibenzothiophene group, an azadibenzosilole group, and a condensed cyclic group in which a cyclic group is condensed with at least one of the foregoing groups.

The π electron-depleted nitrogen-free cyclic group may be, for example, a benzene group, a heptalene group, an indene group, a naphthalene group, an azulene group, a heptalene group, an indacene group, acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, an isoindole group, an indole group, a furan group, a thiophene group, a benzofuran group, a benzothiophene group, a benzosilole group, a benzocarbazole group, a dibenzocarbazole group, a dibenzofuran group, a dibenzothiophene group, a dibenzothiophene sulfone group, a carbazole group, a dibenzosilole group, an indeno carbazole group, an indolocarbazole group, a benzofurocarbazole group, a benzothienocarbazole group, a benzosilolocarbazole group, a triindolobenzene group, an acridine group, or a dihydroacridine group, but embodiments of the present disclosure are not limited thereto.

In an embodiment, the first material may include at least one compound selected from a compound represented by Formula H-1(1), a compound represented by Formula H-1(2), and a compound represented by Formula H-1(3):

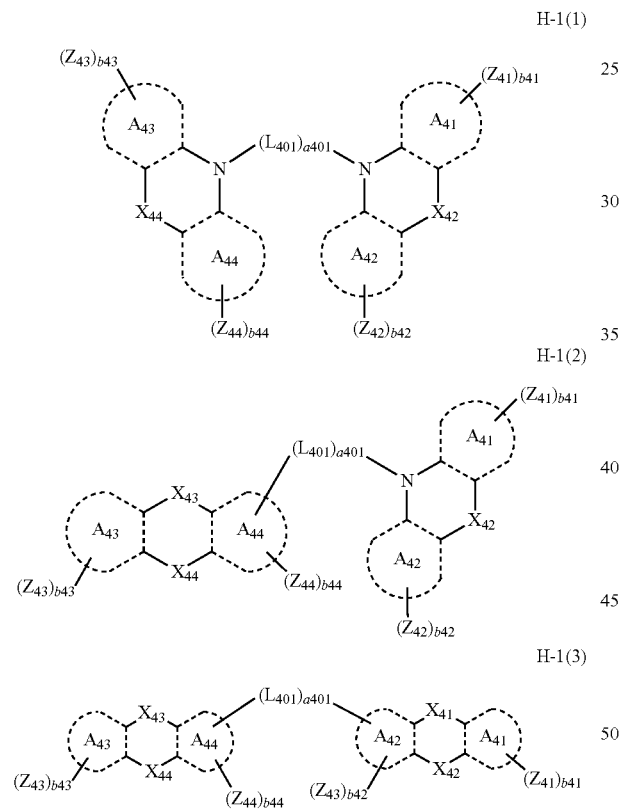

In Formulae H-1(1) to H-1(3), ring $A_{41}$ to ring $A_{44}$ may each independently be a benzene group, a naphthalene group, an indene group, an indole group, a benzofuran group, a benzothiophene group, a benzosilole group, a fluorene group, a carbazole group, a dibenzofuran group, a dibenzothiophene group, or a dibenzosilole group.

For example, ring $A_{41}$ to ring $A_{44}$ may each independently be a benzene group, a fluorene group, a carbazole group, a dibenzofuran group, a dibenzothiophene group, or a dibenzosilole group, and at least one selected from $A_{41}$ and $A_{42}$ may be a benzene group, and at least one selected from $A_{43}$ and $A_{44}$ may be a benzene group.

In Formulae H-1(1) to H-1(3),
$X_{41}$ may be N-[$(L_{411})_{c411}$-$Z_{411}$], $C(Z_{415})(Z_{416})$, O, or S,
$X_{42}$ may be a single bond, N-[$(L_{412})_{c412}$-$Z_{412}$], $C(Z_{417})(Z_{418})$, O, or S,
$X_{43}$ may be N-[$(L_{413})_{c413}$-$Z_{413}$], $C(Z_{419})(Z_{420})$, O, or S, and
$X_{44}$ may be a single bond, N-[$(L_{414})_{c414}$-$Z_{414}$], $C(Z_{421})(Z_{422})$, O, or S.

$L_{401}$ and $L_{411}$ to $L_{414}$ may each independently be selected from:
a single bond; and
a π electron-depleted nitrogen-free cyclic group unsubstituted or substituted with at least one selected from deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, a tetraphenyl group and —Si($Q_{401}$)($Q_{402}$)($Q_{403}$) (for example, a benzene group, a heptalene group, an indene group, a naphthalene group, an azulene group, a heptalene group, an indacene group, acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, an isoindole group, an indole group, a furan group, a thiophene group, a benzofuran group, a benzothiophene group, a benzosilole group, a benzocarbazole group, a dibenzocarbazole group, a dibenzofuran group, a dibenzothiophene group, a dibenzothiophene sulfone group, a carbazole group, a dibenzosilole group, an indeno carbazole group, an indolocarbazole group, a benzofurocarbazole group, a benzothienocarbazole group, a benzosilolocarbazole group, a triindolobenzene group, an acridine group, or a dihydroacridine group, each unsubstituted or substituted with at least one selected from deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, a tetraphenyl group and —Si($Q_{401}$)($Q_{402}$)($Q_{403}$)).

a401 and c411 to c414 respectively indicate the number of $L_{401}$ and $L_{411}$ to $L_{414}$, and may each independently be an integer of 1 to 10. When a401 is two or more, two or more of groups $L_{401}$ may be identical to or different from each other, when c411 is two or more, two or more of groups $L_{411}$ may be identical to or different from each other, when c412 is two or more, two or more of groups $L_{412}$ may be identical to or different from each other, when c413 is two or more, two or more of groups $L_{413}$ may be identical to or different from each other, and when c414 is two or more, two or more of groups $L_{414}$ may be identical to or different from each other.

For example, a401 and c411 to c414 may each independently be 1, 2, or 3.

$Z_{41}$ to $Z_{44}$ and $Z_{411}$ to $Z_{422}$ may each independently be selected from:
hydrogen, deuterium, a $C_1$-$C_{10}$ alkyl group, and a $C_1$-$C_{10}$ alkoxy group; and
a π electron-depleted nitrogen-free cyclic group unsubstituted or substituted with at least one selected from deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, a tetraphenyl group, and —Si($Q_{401}$)($Q_{402}$)($Q_{403}$) (for example, a phenyl group, a biphenyl group, a terphenyl group, a tetraphenyl group, a naphthyl group, a fluorenyl group, a spiro-bifluorenyl group, a benzofluorenyl group, a dibenzofluorenyl group, a phenanthrenyl group, an anthracenyl group, a triphenylenyl group, a pyrenyl group, a chrysenyl group, a pyrrolyl group, an isoindolyl group, an indolyl group, a furanyl group, a thiophenyl group, a benzofuranyl group, a benzothiophenyl group, a benzosilolyl group, a benzocarbazolyl group, a dibenzocarbazolyl group, a dibenzofuranyl group, a dibenzothiophenyl group, a carbazolyl group, a dibenzosilolyl group, an indeno carbazolyl group, an indolocarbazolyl group, a benzofurocarbazolyl group, a benzothienocarbazolyl group, a benzosilolocarbazolyl group, an acridinyl group, or a dihydroacridinyl group, each unsubstituted or substituted with at least one selected from deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, a tetraphenyl group, and —Si($Q_{401}$)($Q_{402}$)($Q_{403}$)).

b41 to b44 respectively indicate the number of $Z_{41}$ to $Z_{44}$, and may each independently be 1, 2, 3, or 4. When b41 is two or more, two or more of groups $Z_{41}$ may be identical to or different from each other, when b42 is two or more, two or more of groups $Z_{42}$ may be identical to or different from each other, when b43 is two or more, two or more of groups $Z_{43}$ may be identical to or different from each other, and when b44 is two or more, two or more of groups $Z_{44}$ may be identical to or different from each other.

For example, b41 to b44 may each independently be 1 or 2, but embodiments of the present disclosure are not limited thereto.

$Q_{401}$ to $Q_{403}$ may each independently be hydrogen, deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, or a tetraphenyl group.

In an embodiment, $L_{401}$ and $L_{411}$ to $L_{414}$ may each independently be selected from:
a single bond; and
a benzene group, a fluorene group, a dibenzofuran group, a dibenzothiophene group, a carbazole group, a dibenzosilole group, an indeno carbazole group, an indolocarbazole group, a benzofurocarbazole group, a benzothienocarbazole group, a benzosilolocarbazole group, an acridine group, or a dihydroacridine group, each unsubstituted or substituted with at least one selected from deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, and a tetraphenyl group, $Z_{41}$ to $Z_{44}$ and $Z_{411}$ to $Z_{422}$ may each independently be selected from:
hydrogen, deuterium, a $C_1$-$C_{10}$ alkyl group, and a $C_1$-$C_{10}$ alkoxy group; and
a phenyl group, a biphenyl group, a terphenyl group, a tetraphenyl group, a fluorenyl group, a dibenzocarbazolyl group, a dibenzofuranyl group, a dibenzothiophenyl group, a carbazolyl group, a dibenzosilolyl group, an indeno carbazolyl group, an indolocarbazolyl group, a benzofurocarbazolyl group, a benzothienocarbazolyl group, a benzosilolocarbazolyl group, an acridinyl group, or a dihydroacridinyl group, each unsubstituted or substituted with at least one selected from deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, and a tetraphenyl group;

but embodiments of the present disclosure are not limited thereto.

In an embodiment, the first material may include at least one compound selected from Compounds H1 to H32, but embodiments of the present disclosure are not limited thereto:

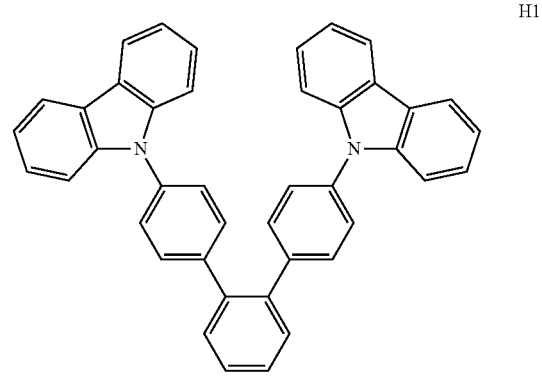

H1

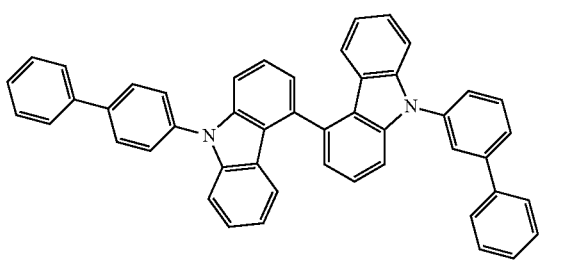

H2

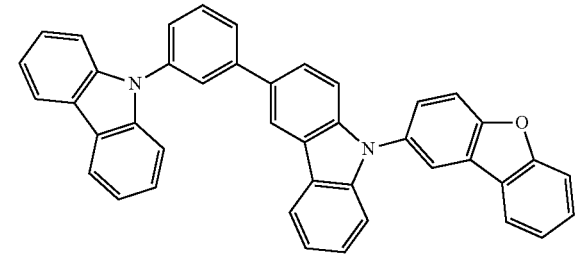

H3

H4
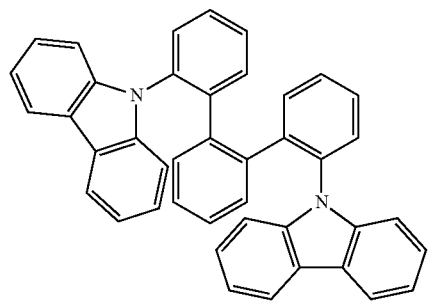
H5
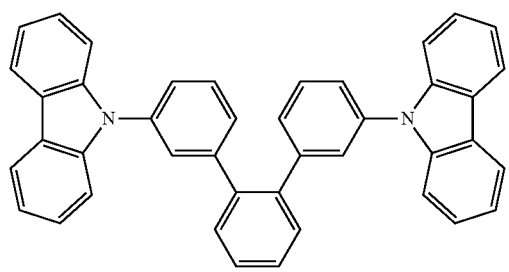
H6
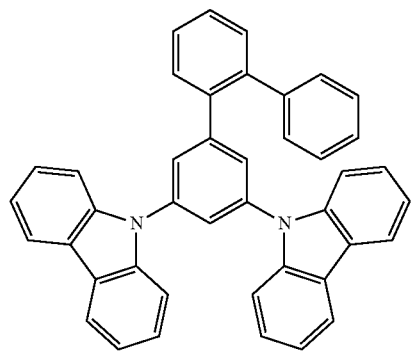
H7
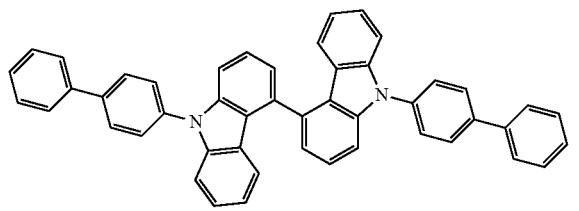
H8
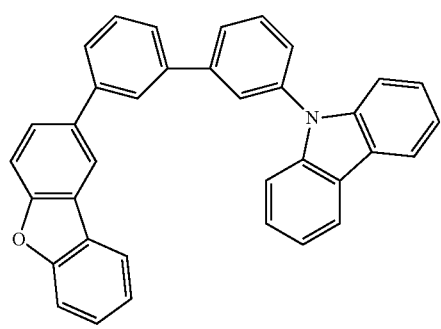
H9
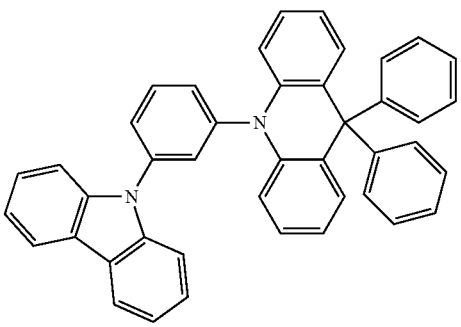
H10
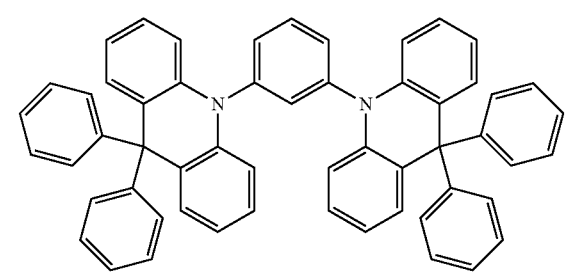
H11
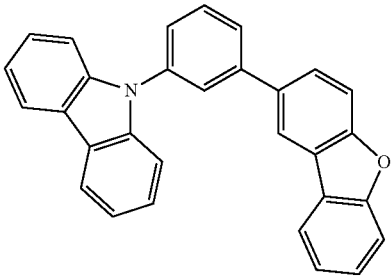
H12
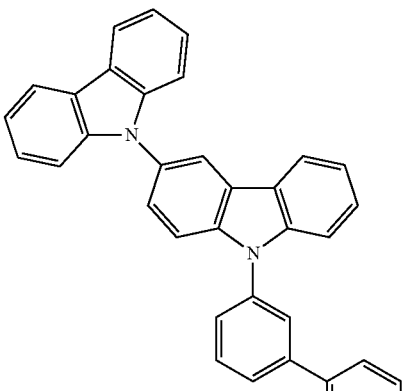
H13
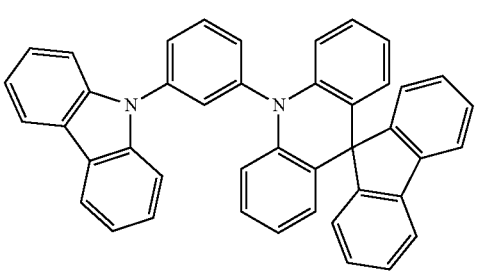

H14
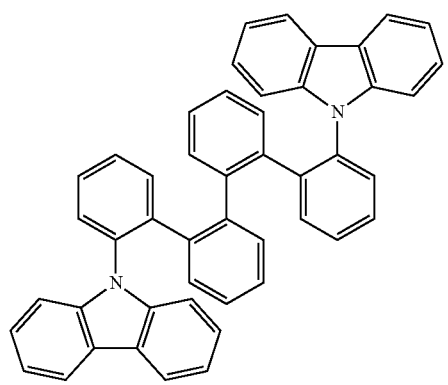
H15
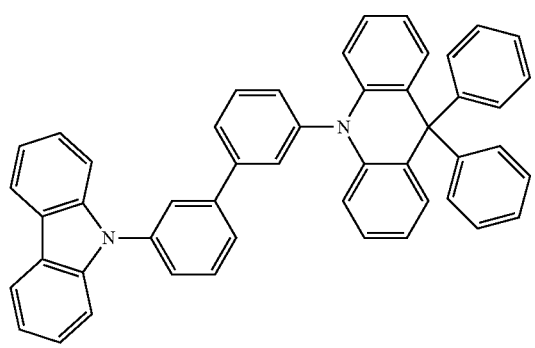
H16
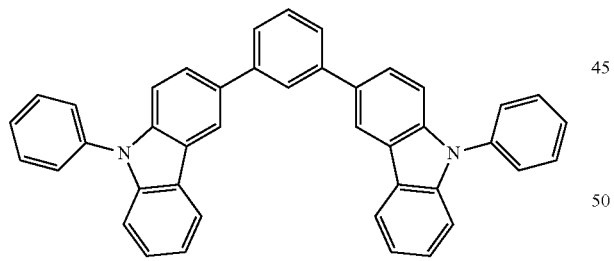
H17
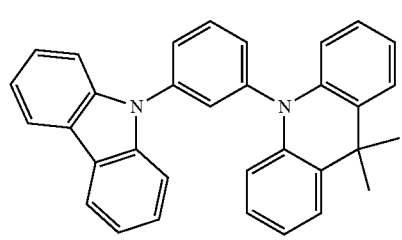
H18
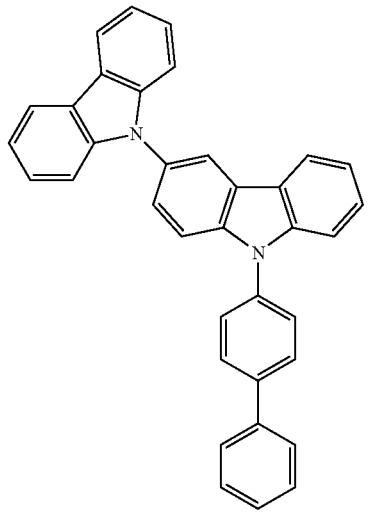
H19
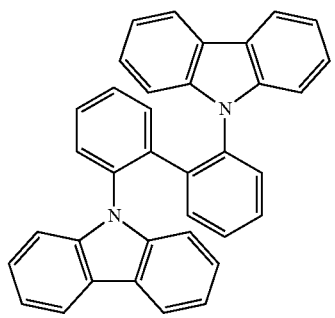
H20
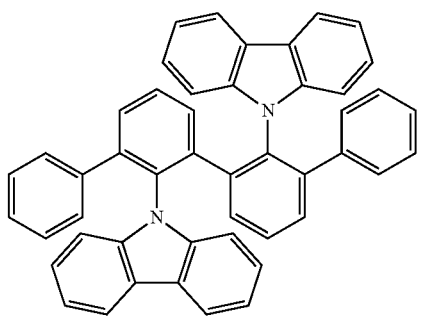

H21
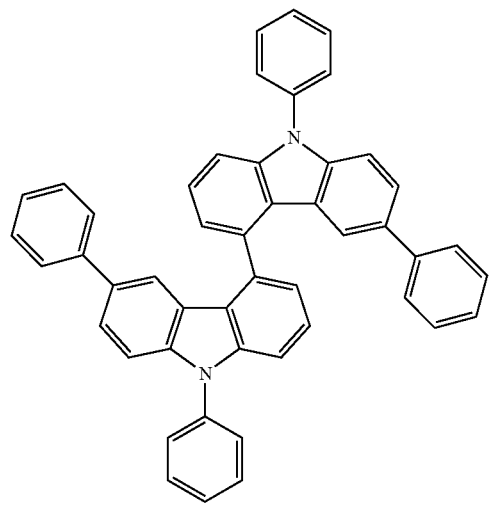
H22
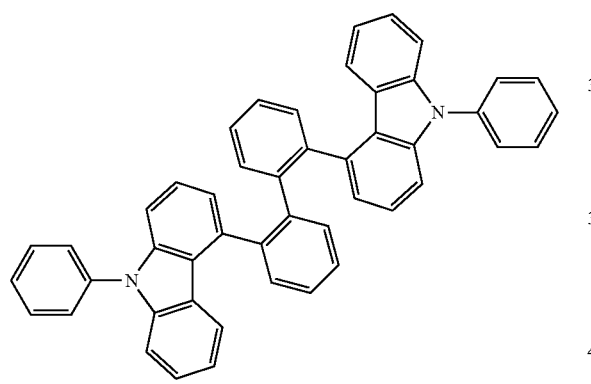
H23
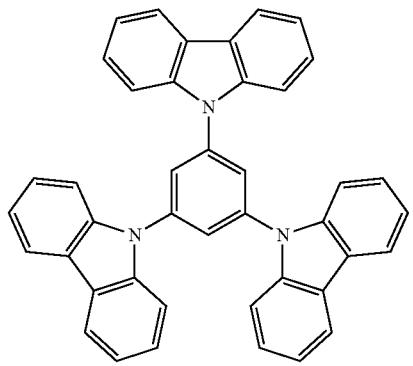
H24
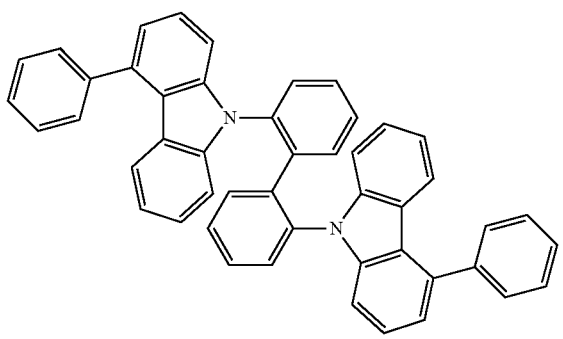
H25
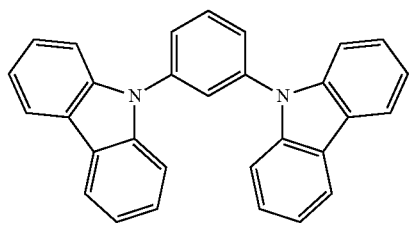
H26
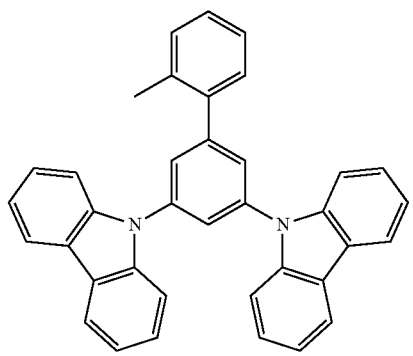
H27
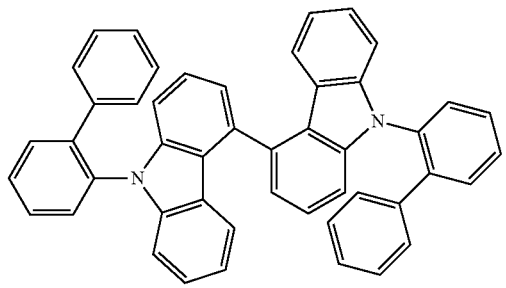
H28
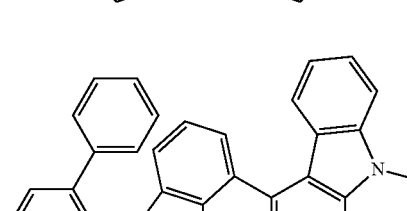

-continued

H29
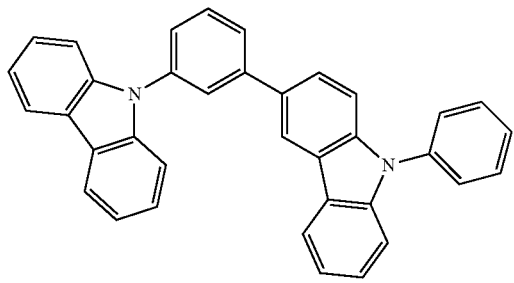

H30
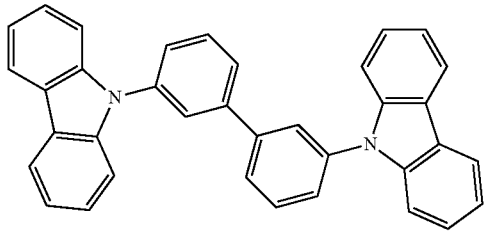

H31
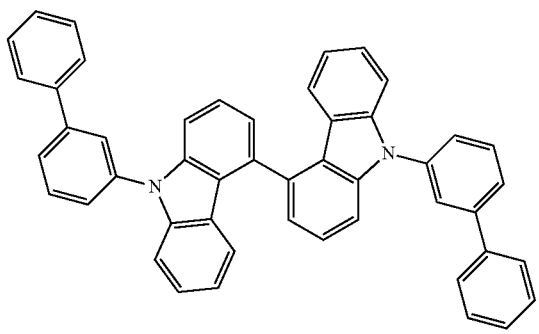

H32
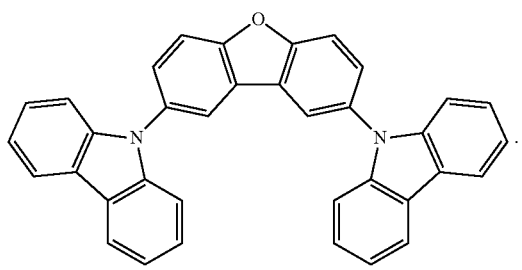

In an embodiment, the first material may not be an amine-based compound.

In one or more embodiments, the first material may not be 1,3-bis(9-carbazolyl)benzene (mCP), tris(4-carbazol-9-ylphenyl)amine (TCTA), 4,4'-bis(N-carbazolyl)-1,1'-biphenyl (CBP), 3,3-bis(carbazol-9-yl)biphenyl (mCBP), (N,N'-di(1-naphthyl)-N,N'-diphenyl-(1,1'-biphenyl)-4,4'-diamine (NPB), 4,4',4''-tris[phenyl(m-tolyl)amino]triphenylamine (m-MTDATA), and N,N'-bis(3-methylphenyl)-N,N'-diphenylbenzidine (TPD).

The second material may include at least one cyano group.

In one or more embodiments, the second material may include a benzene moiety substituted with at least one cyano group, and the benzene moiety substituted with at least one cyano group may not be condensed to a neighboring ring and may be bound to a neighboring ring via a single bond.

For example, Compounds E1 to E6 to be described below belong to a "compound including a benzene moiety substituted with at least one cyano group, wherein the benzene moiety substituted with at least one cyano group may not be condensed to a neighboring ring and may be bound to a neighboring atom via a single bond", but Compound EA to be described below do not belong to a "compound including a benzene moiety substituted with at least one cyano group, wherein the benzene moiety substituted with at least one cyano group may not be condensed to a neighboring ring and may be bound to a neighboring ring via a single bond.

In one or more embodiments, the second material may include a compound represented by Formula E-1:

$$[Ar_{301}]_{xb11}\text{-}[(L_{301})_{xb1}\text{-}R_{301}]_{xb21}.$$   Formula E-1

In Formula E-1, $Ar_{301}$ may be selected from a substituted or unsubstituted $C_5$-$C_{60}$ carbocyclic group and a substituted or unsubstituted $C_1$-$C_{60}$ heterocyclic group, $xb11$ may be 1, 2, or 3, $L_{301}$ may be selected from a single bond, a group represented by one of the following Formulae, a substituted or unsubstituted $C_5$-$C_{60}$ carbocyclic group, and a substituted or unsubstituted $C_1$-$C_{60}$ heterocyclic group, in the Formulae, *, *', and *'' each indicate a binding site to a neighboring atom,

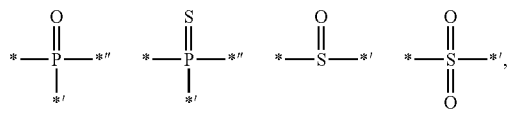

$xb1$ may be an integer from 1 to 5, $R_{301}$ may be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), —S(=O)($Q_{301}$), —P(=O)($Q_{301}$)($Q_{302}$), and —P(=S)($Q_{301}$)($Q_{302}$), $xb21$ may be an integer from 1 to 5, $Q_{301}$ to $Q_{303}$ may each independently be selected from a $C_1$-$C_{10}$ alkyl group, a $C_1$-$C_{10}$ alkoxy group, a phenyl group, a biphenyl group, a terphenyl group, and a naphthyl group, and at least one of Condition 1 to Condition 3 may be satisfied:

Condition 1
at least one of $Ar_{301}$, $L_{301}$, and $R_{301}$ in Formula E-1 may include a π electron-depleted nitrogen-containing cyclic group;

Condition 2
at least one of groups $L_{301}$ in Formula E-1 is a group represented by one of the following Formulae:

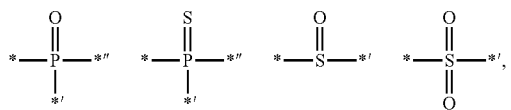

and

Condition 3
at least one of groups $R_{301}$ in Formula E-1 is selected from a cyano group, $-S(=O)_2(Q_{301})$, $-S(=O)(Q_{301})$, $-P(=O)(Q_{301})(Q_{302})$, and $-P(=S)(Q_{301})(Q_{302})$.

In one or more embodiments, the second material may include at least one selected from a compound represented by Formula E-1(1), a compound represented by Formula E-1(2), and a compound represented by Formula E-1(3):

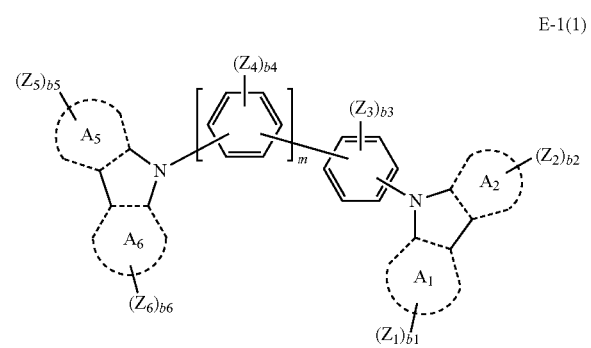

E-1(1)

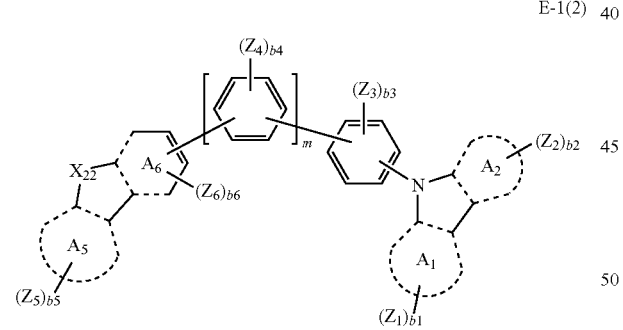

E-1(2)

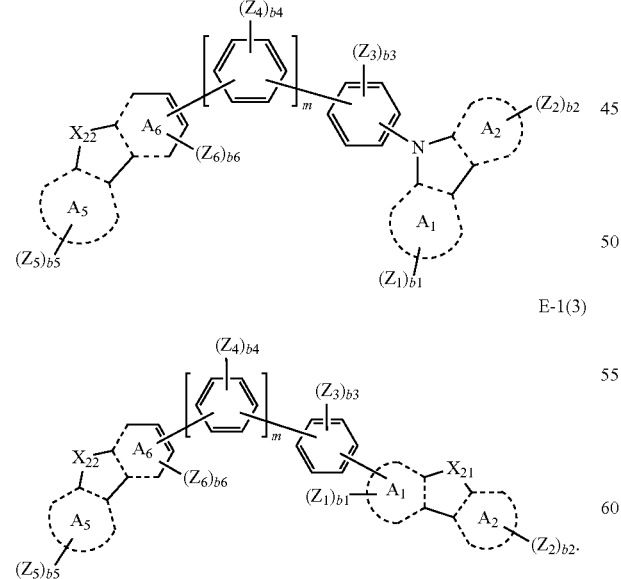

E-1(3)

In Formulae E-1(1) to E-1(3), ring $A_1$, ring $A_2$, ring $A_5$, and ring $A_6$ may each independently be selected from a benzene group, a naphthalene group, an anthracene group, a phenanthrene group, a triphenylene group, a pyrene group, a chrysene group, a cyclopentadiene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, and a phenanthroline group.

For example, in Formulae E-1(1) to E-1(3), ring $A_1$, ring $A_2$, ring $A_5$, and ring $A_6$ may each independently be selected from a benzene group, a naphthalene group, a carbazole group, a fluorene group, a dibenzosilole group, a dibenzothiophene group, a dibenzofuran group, an azacarbazole group, an azafluorene group, an azadibenzosilole group, an azadibenzothiophene group, a pyridine group, a pyrimidine group, a pyrazine group, a pyridazine group, a triazine group, a quinoline group, an isoquinoline group, a quinoxaline group, a quinazoline group and phenanthroline group, but embodiments of the present disclosure are not limited thereto.

In an embodiment, in Formulae E-1(1) to E-1(3), ring $A_1$, ring $A_2$, ring $A_5$, and ring $A_6$ may each independently be represented by one selected from Formulae A(1) to A(18):

A(1)

A(2)

A(3)

A(4)

-continued

A(5) 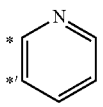

A(6) 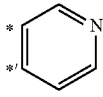

A(7) 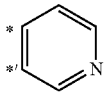

A(8) 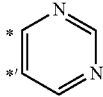

A(9) 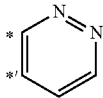

A(10) 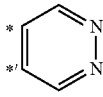

A(11) 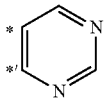

A(12) 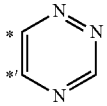

A(13) 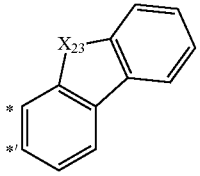

A(14) 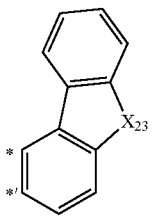

A(15) 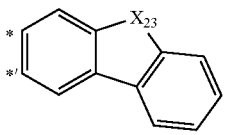

A(16) 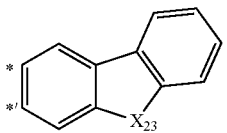

A(17) 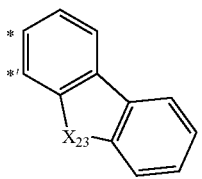

A(18) 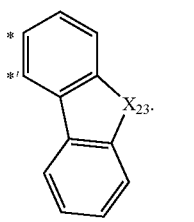

In Formulae A(1) to A(18), $X_{23}$ may be O, S, N($Z_7$), C($Z_7$)($Z_8$), or Si($Z_7$)($Z_8$), $Z_7$ and $Z_8$ are the same as described in connection with $Z_1$, and

* and *' each indicate a position of carbon condensed to

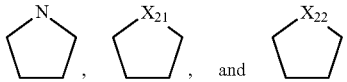

in Formulae E-1(1) to E-1(3) and sharing

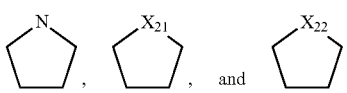

and * indicates carbon of sides of N, $X_{21}$, and $X_{22}$.

$Z_1$ to $Z_6$ in Formulae E-1(1) to E-1(3) may each independently be:

hydrogen, deuterium, or a cyano group (CN); or a $C_1$-$C_{20}$ alkyl group, a phenyl group, a biphenyl group, a terphenyl group, a dibenzofuranyl group or a dibenzothiophenyl group, each unsubstituted or substituted with at least one selected from deuterium, a cyano group, a $C_1$-$C_{20}$ alkyl group, a phenyl group, and a biphenyl group.

For example, $Z_1$ to $Z_6$ in Formulae E-1(1) to E-1(3) may each independently be:

hydrogen, deuterium, or a cyano group; or a $C_3$-$C_{10}$ alkyl group, a phenyl group, a biphenyl group, a terphenyl group, a dibenzofuranyl group, or a dibenzothiophenyl group, each unsubstituted or substituted with at least one selected from deuterium, a cyano group, a $C_3$-$C_{10}$ alkyl group, a phenyl group, and a biphenyl group.

In an embodiment, $Z_1$ to $Z_6$ in Formulae E-1(1) to E-1(3) may each independently be:

hydrogen, deuterium, or a cyano group; or an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, a biphenyl group, or a terphenyl group, each unsubstituted or substituted with at least one selected from deuterium, a cyano group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a biphenyl group.

b1 to b6 in Formulae E-1(1) to E-1(3) indicate the number of groups $Z_1$ to groups $Z_6$, respectively, and may each independently be 1, 2, or 3. When each of b1 to b6 is two or more, two or more groups $Z_1$ to groups $Z_6$ may be identical to or different from each other.

In Formulae E-1(1) to E-1(3), at least one of groups $Z_1$ in the number of b1, groups $Z_2$ in the number of b2, groups $Z_3$ in the number of b3, groups $Z_4$ in the number of b4, groups $Z_5$ in the number of b5, and groups $Z_6$ in the number of b6 may be a cyano group. That is, Formulae E-1(1) to E-1(3) may essentially include at least one cyano group.

For example, the number of cyano groups included in the compound represented by Formula E-1(1), the number of cyano groups included in the compound represented by Formula E-1(2), and the number of cyano groups included in the compound represented by Formula E-1(3) may each independently be 1, 2, or 3, but embodiments of the present disclosure are not limited thereto.

In an embodiment, in Formulae E-1(1) to E-1(3),
at least one of groups $Z_1$ in the number of b1 and groups $Z_2$ in the number of b2 may be a cyano group,
at least one of groups $Z_3$ in the number of b3 and groups $Z_4$ in the number of b4 may be a cyano group,
at least one of groups $Z_5$ in the number of b5 and groups $Z_6$ in the number of b6 may be a cyano group,
at least one of groups $Z_1$ in the number of b1 and groups $Z_2$ in the number of b2 may be a cyano group, and at least one of groups $Z_3$ in the number of b3 and groups $Z_4$ in the number of b4 may be a cyano group,
at least one of groups $Z_1$ in the number of b1 and groups $Z_2$ in the number of b2 may be a cyano group, and at least one of groups $Z_5$ in the number of b5 and groups $Z_6$ in the number of b6 may be a cyano group,
at least one of groups $Z_3$ in the number of b3 and groups $Z_4$ in the number of b4 may be a cyano group, and at least one of groups $Z_5$ in the number of b5 and groups $Z_6$ in the number of b6 may be a cyano group, or
at least one of groups $Z_1$ in the number of b1 and groups $Z_2$ in the number of b2 may be a cyano group, and at least one of groups $Z_3$ in the number of b3 and groups $Z_4$ in the number of b4 may be a cyano group, and at least one of groups $Z_5$ in the number of b5 and groups $Z_6$ in the number of b6 may be a cyano group.

In an embodiment, in Formulae E-1(1) to E-1(3),
at least one of groups $Z_3$ in the number of b3 and groups $Z_4$ in the number of b4 may be a cyano group,
at least one of groups $Z_1$ in the number of b1 and groups $Z_2$ in the number of b2 may be a cyano group, and at least one of groups $Z_3$ in the number of b3 and groups $Z_4$ in the number of b4 may be a cyano group,
at least one of groups $Z_3$ in the number of b3 and groups $Z_4$ in the number of b4 may be a cyano group, and at least one of groups $Z_5$ in the number of b5 and groups $Z_6$ in the number of b6 may be a cyano group, or
at least one of groups $Z_1$ in the number of b1 and groups $Z_2$ in the number of b2 may be a cyano group, and at least one of groups $Z_3$ in the number of b3 and groups $Z_4$ in the number of b4 may be a cyano group, and at least one of groups $Z_5$ in the number of b5 and groups $Z_6$ in the number of b6 may be a cyano group, but embodiments of the present disclosure are not limited thereto.

In Formulae E-1(1) to E-1(3), $X_{21}$ and $X_{22}$ may each independently be O or S, and m may be 0 or 1.

In an embodiment, m in Formulae E-1(1) to E-1(3) may be 1.

In an embodiment, a group represented by

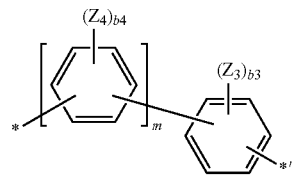

in Formulae E-1(1) to E-1(3) may be one of groups represented by Formulae PO1 to PO25, PM1 to PM25, PP1 to PP18, MO1 to MO37, MM1 to MM37, MP1 to MP25, OO1 to OO37, OM1 to OM37, OP1 to OP25, O1 to O16, M1 to M16, and P1 to P9:

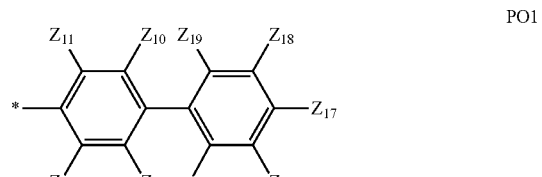

PO1

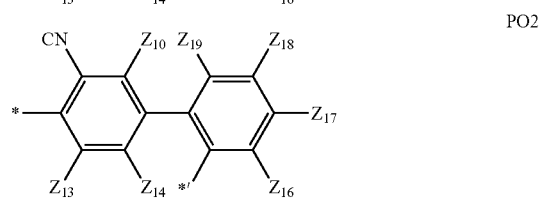

PO2

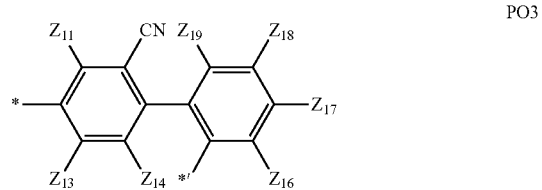

PO3

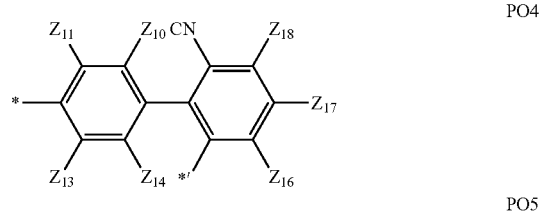

PO4

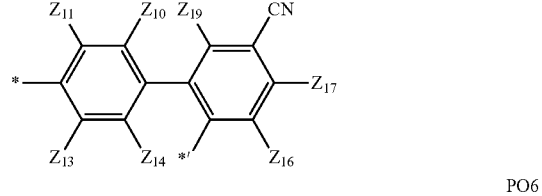

PO5

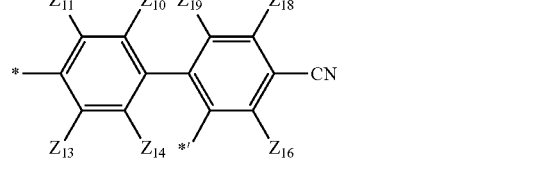

PO6

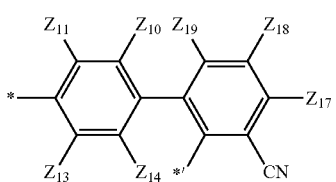 PO7
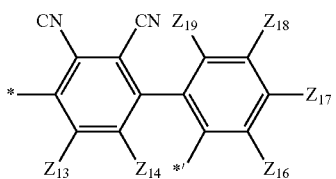 PO8
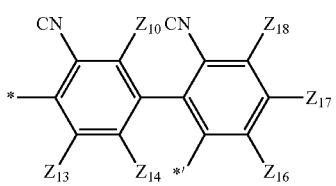 PO9
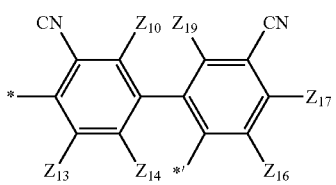 PO10
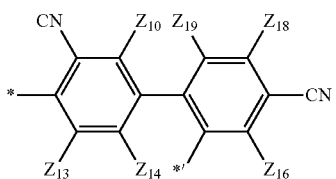 PO11
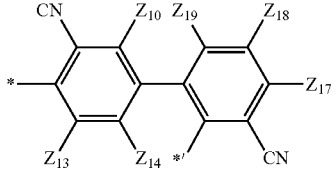 PO12
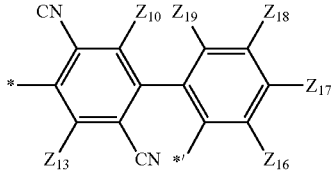 PO13
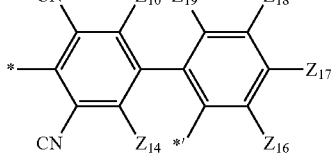 PO14
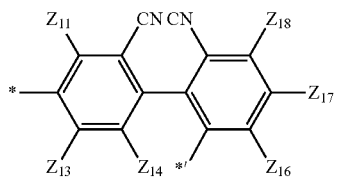 PO15
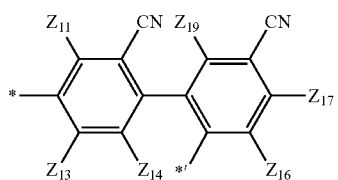 PO16
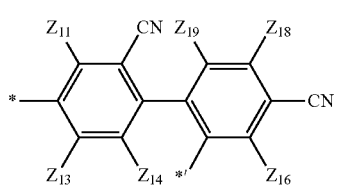 PO17
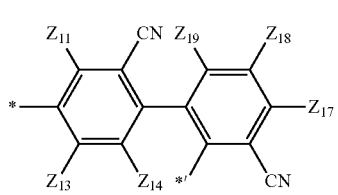 PO18
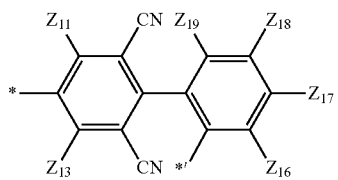 PO19
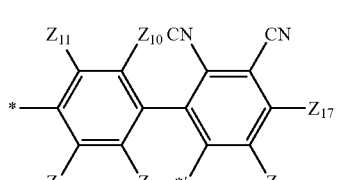 PO20
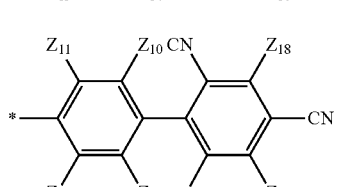 PO21
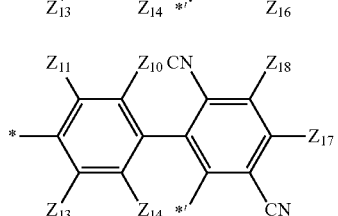 PO22

PO23
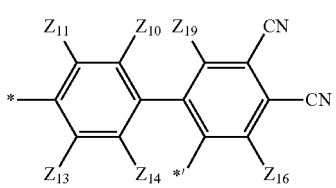
PO24
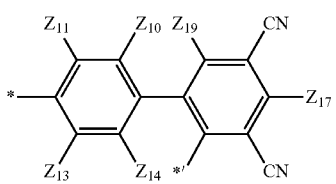
PO25
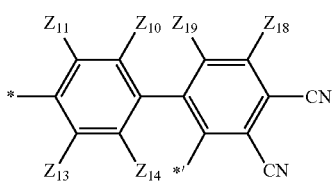
PM1
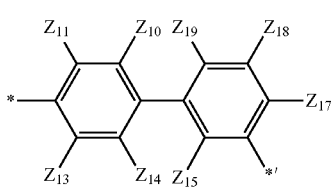
PM2
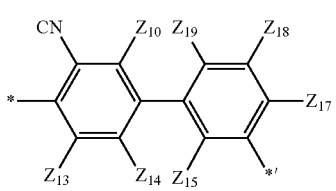
PM3
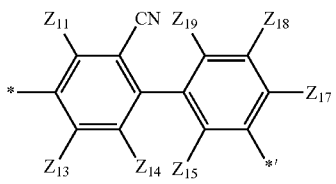
PM4
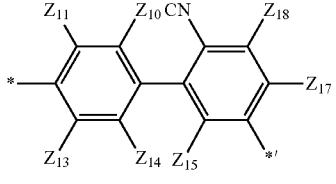
PM5
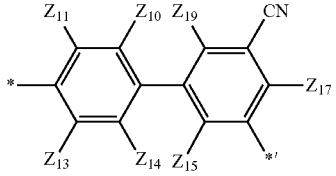
PM6
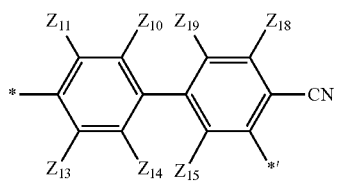
PM7
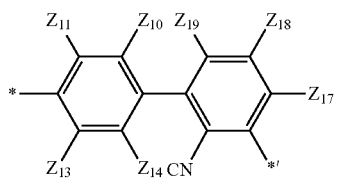
PM8
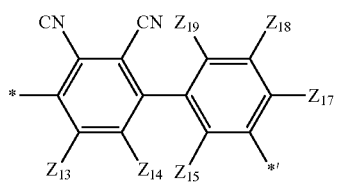
PM9
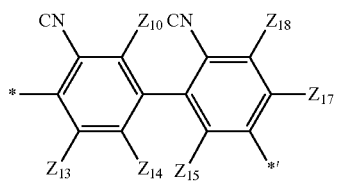
PM10
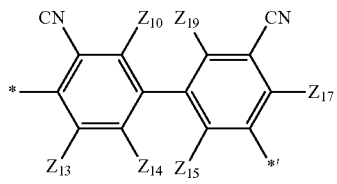
PM11
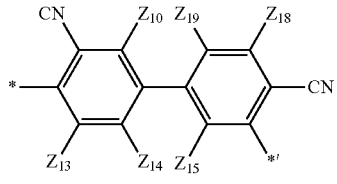
PM12
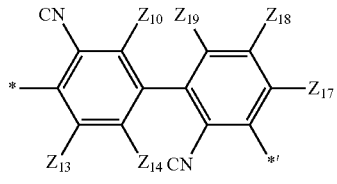
PM13
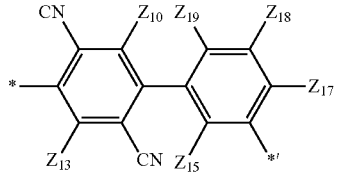

PM14 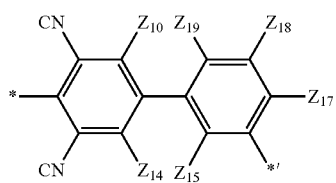
PM15 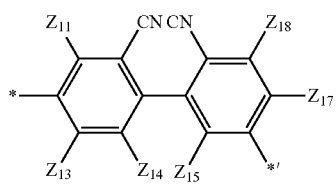
PM16 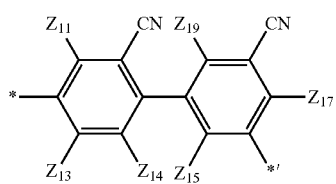
PM17 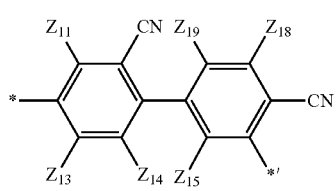
PM18 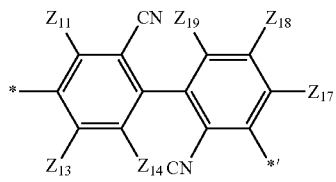
PM19 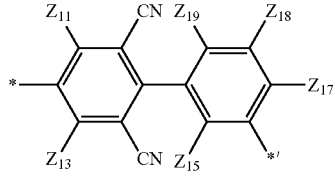
PM20 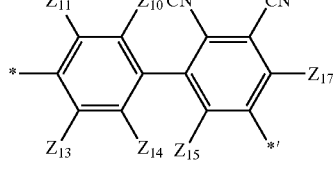
PM21 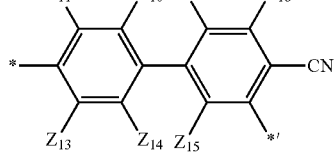
PM22 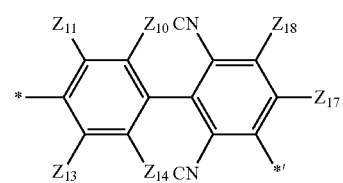
PM23 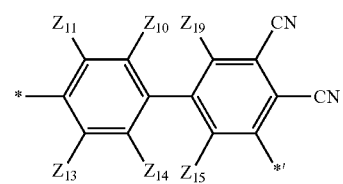
PM24 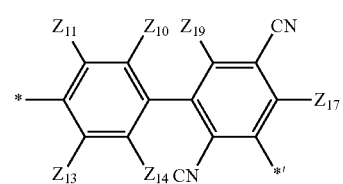
PM25 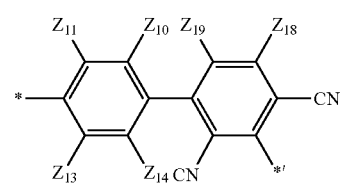
PP1 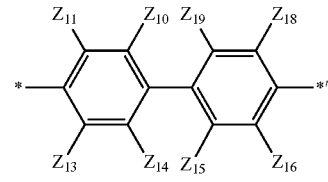
PP2 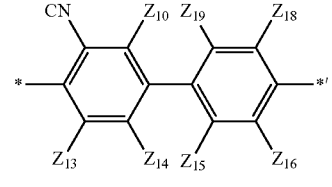
PP3 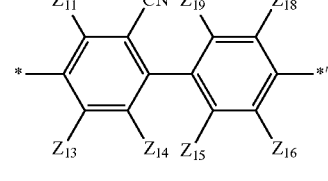
PP4 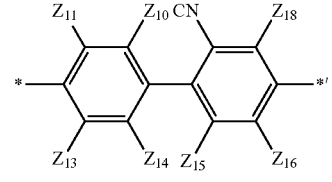

-continued

PP5, PP6, PP7, PP8, PP9, PP10, PP11, PP12, PP13, PP14, PP15, PP16, PP17, PP18, MO1, MO2

-continued
MO3
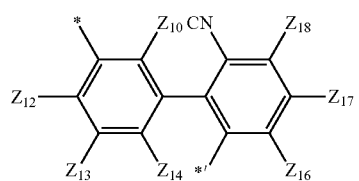
MO4
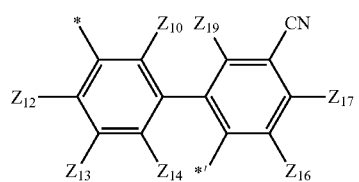
MO5
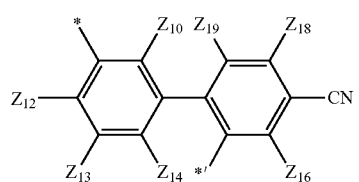
MO6
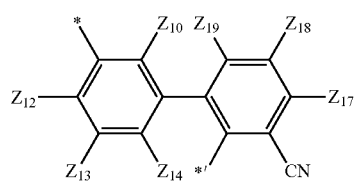
MO7
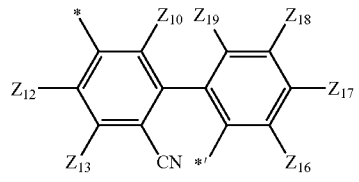
MO8
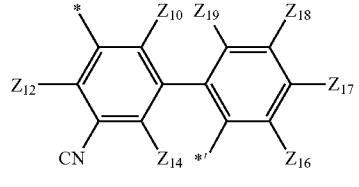
MO9
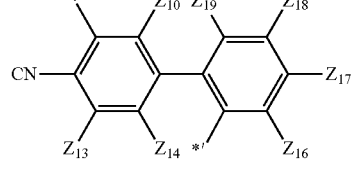
MO10
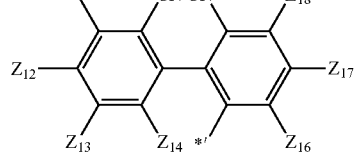
-continued
MO11
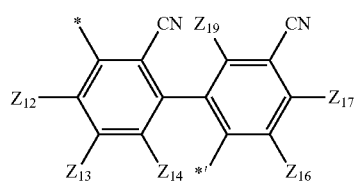
MO12
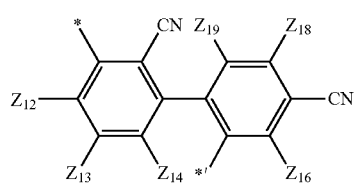
MO13
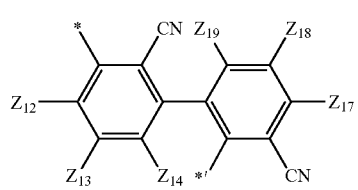
MO14
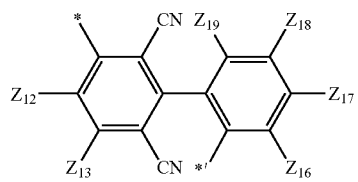
MO15
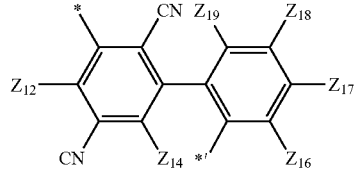
MO16
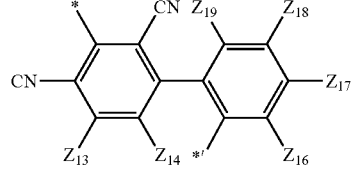
MO17
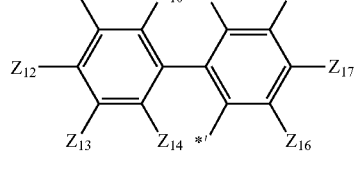
MO18
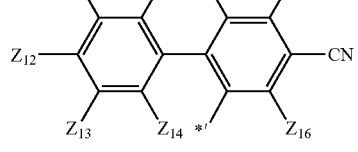

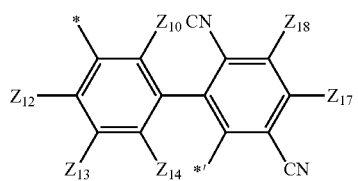 MO19
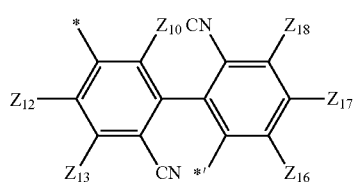 MO20
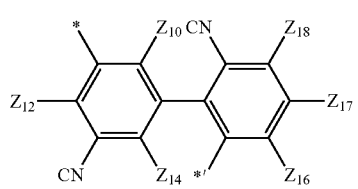 MO21
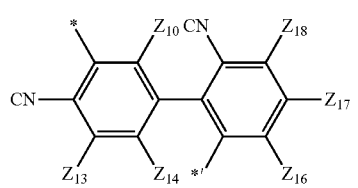 MO22
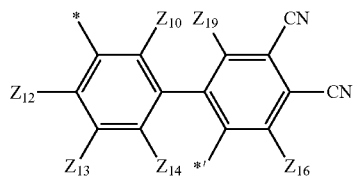 MO23
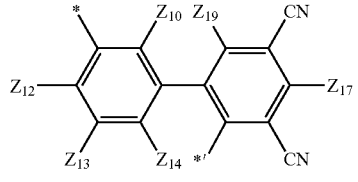 MO24
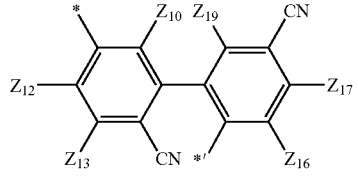 MO25
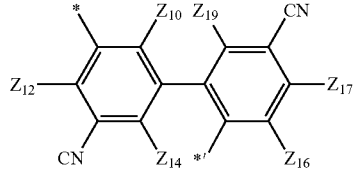 MO26
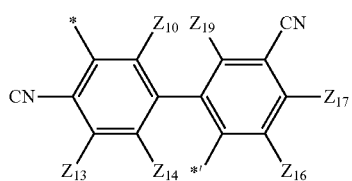 MO27
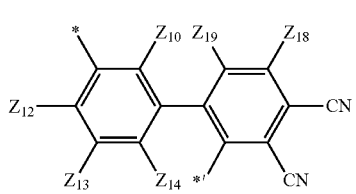 MO28
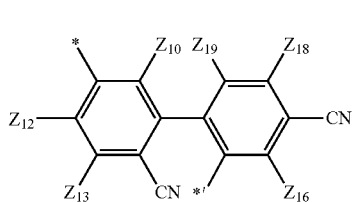 MO29
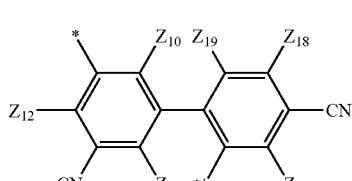 MO30
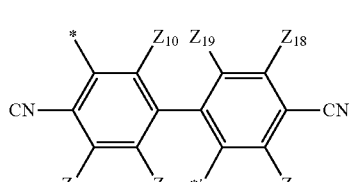 MO31
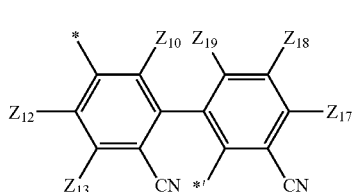 MO32
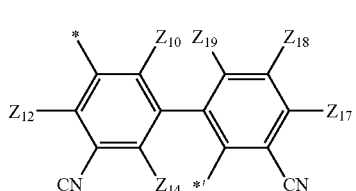 MO33
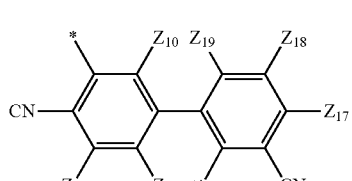 MO34

MO35 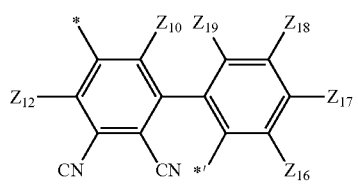
MO36 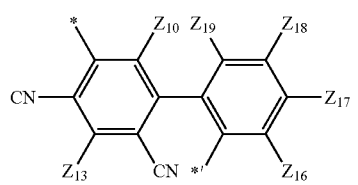
MO37 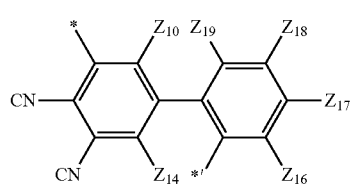
MM1 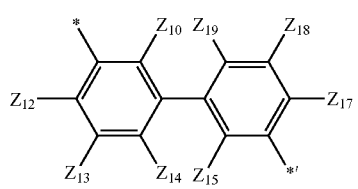
MM2 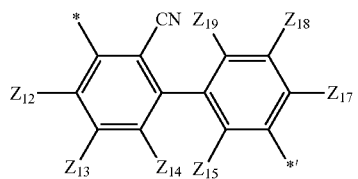
MM3 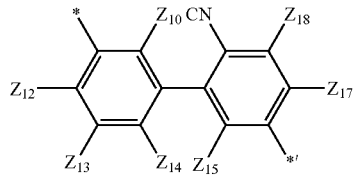
MM4 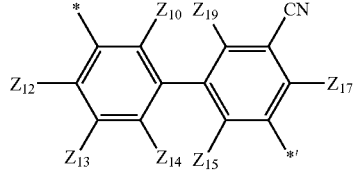
MM5 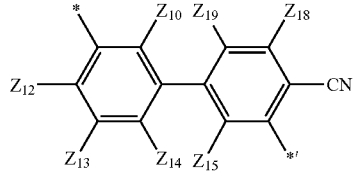
MM6 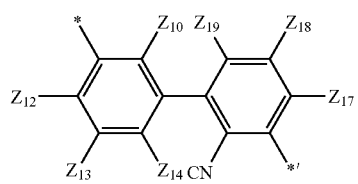
MM7 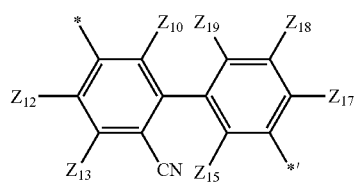
MM8 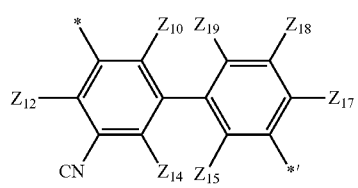
MM9 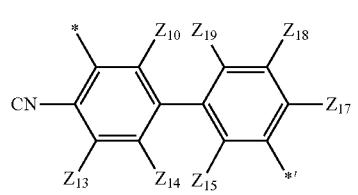
MM10 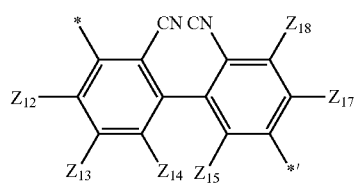
MM11 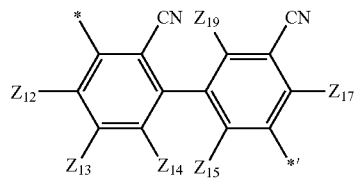
MM12 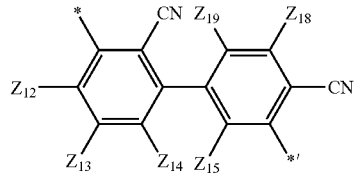
MM13 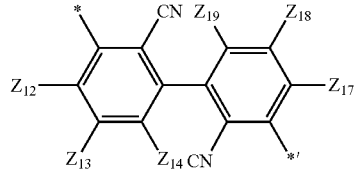

| | |
|---|---|
| 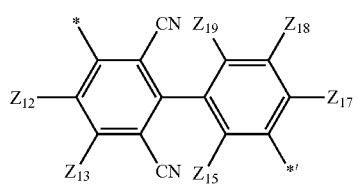 MM14 | 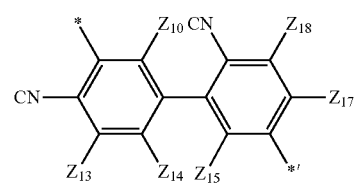 MM22 |
| 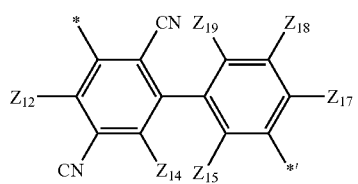 MM15 | 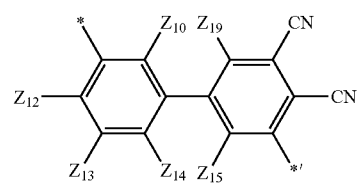 MM23 |
| 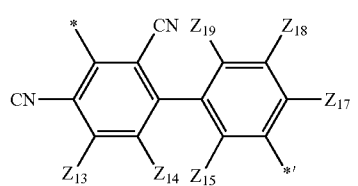 MM16 | 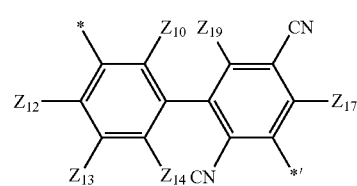 MM24 |
| 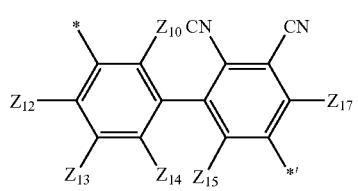 MM17 | 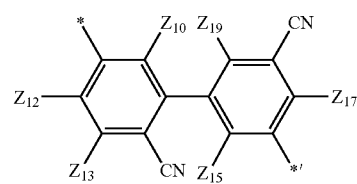 MM25 |
| 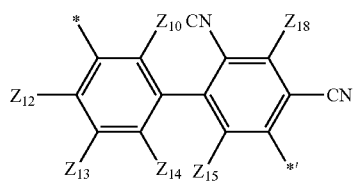 MM18 | 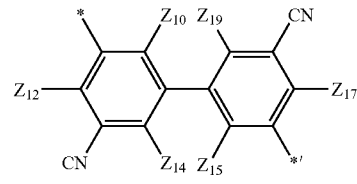 MM26 |
| 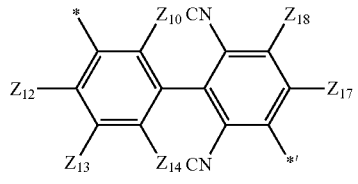 MM19 | 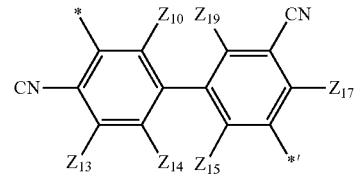 MM27 |
| 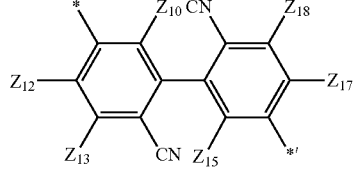 MM20 | 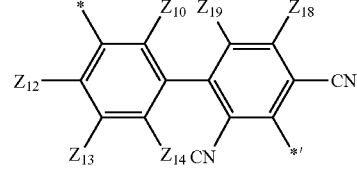 MM28 |
| 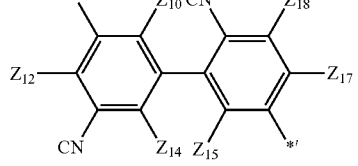 MM21 | 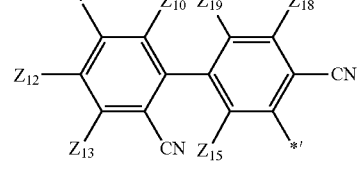 MM29 |

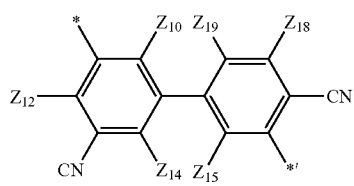 MM30
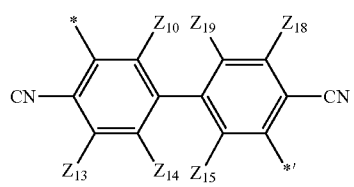 MM31
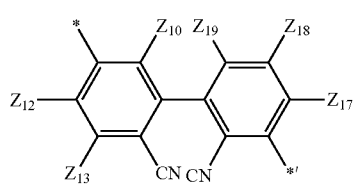 MM32
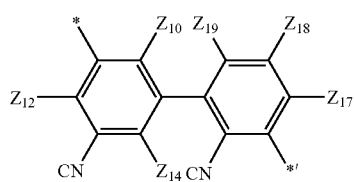 MM33
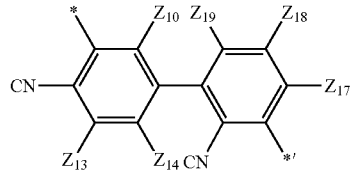 MM34
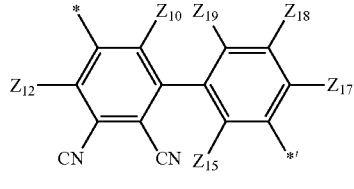 MM35
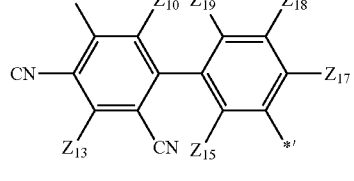 MM36
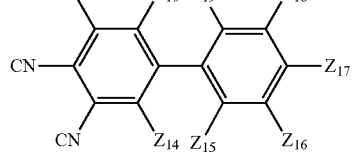 MM37
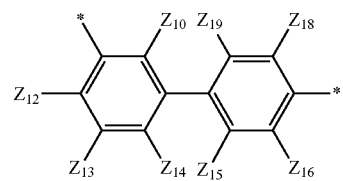 MP1
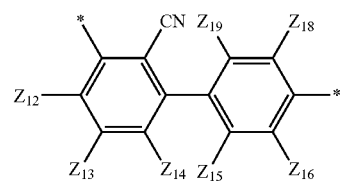 MP2
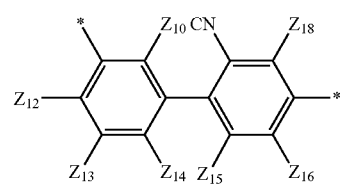 MP3
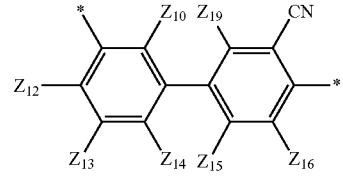 MP4
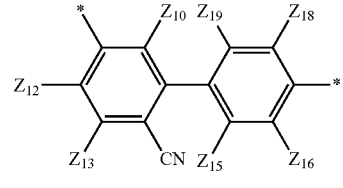 MP5
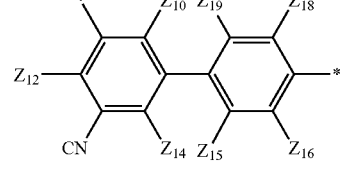 MP6
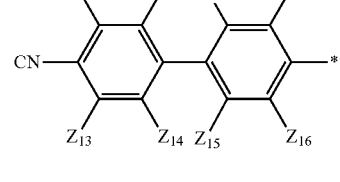 MP7
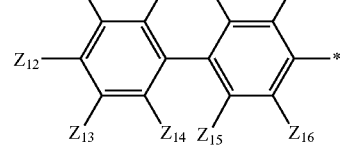 MP8

-continued
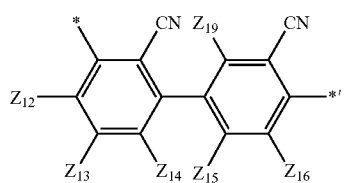
MP9
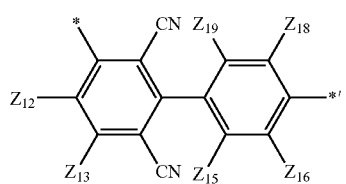
MP10
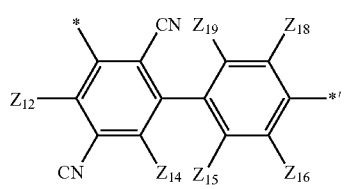
MP11
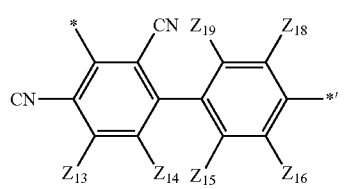
MP12
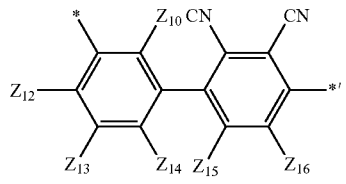
MP13
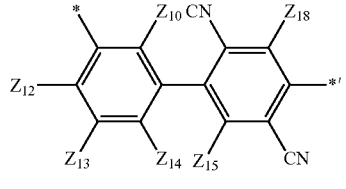
MP14
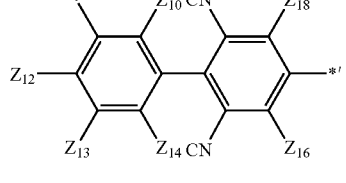
MP15
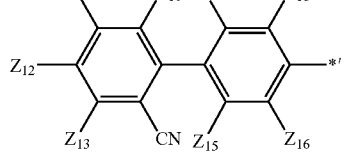
MP16
-continued
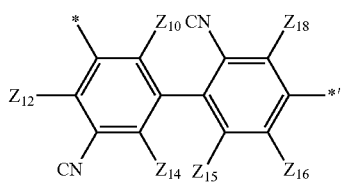
MP17
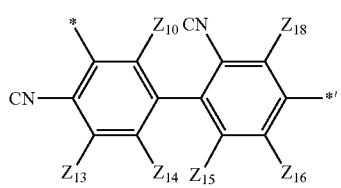
MP18
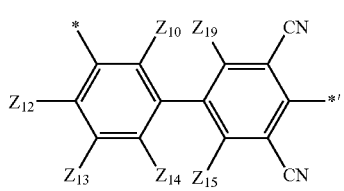
MP19
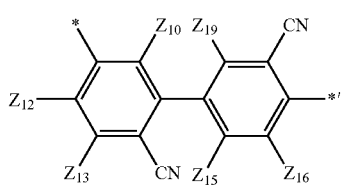
MP20
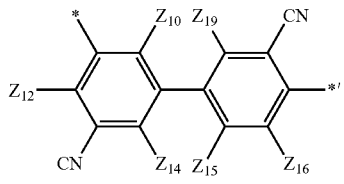
MP21
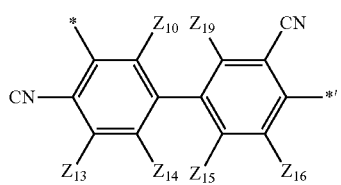
MP22
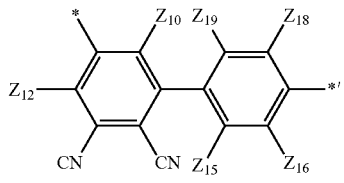
MP23
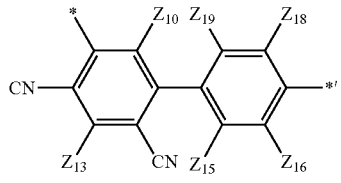
MP24

MP25
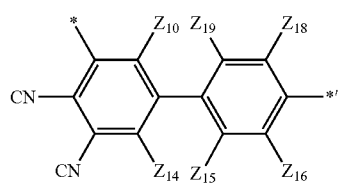
OO1
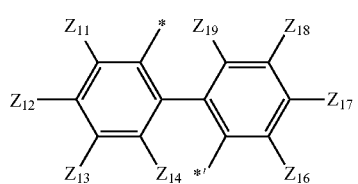
OO2
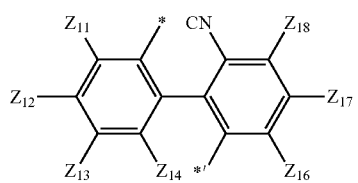
OO3
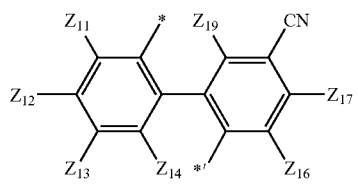
OO4
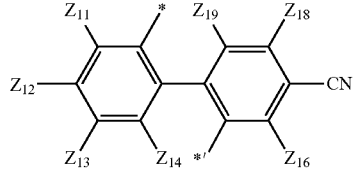
OO5
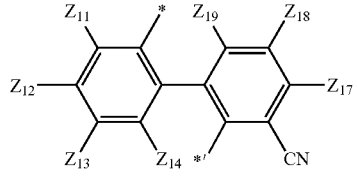
OO6
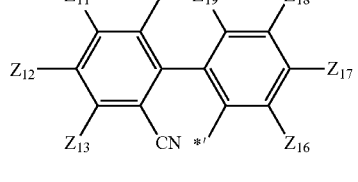
OO7
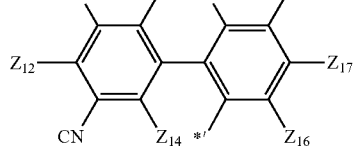
OO8
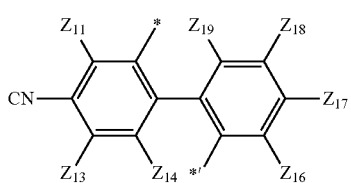
OO9
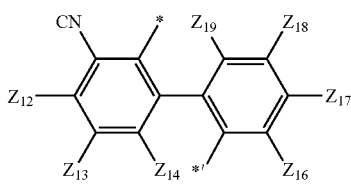
OO10
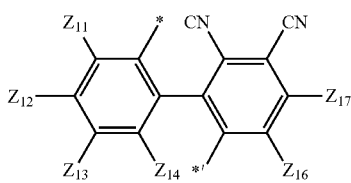
OO11
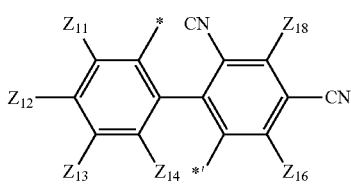
OO12
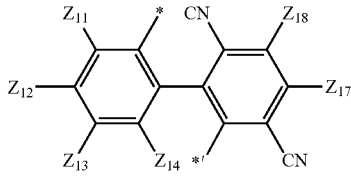
OO13
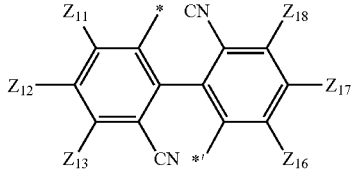
OO14
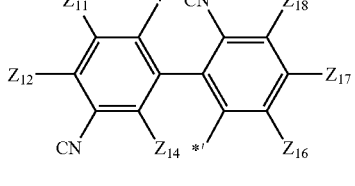
OO15
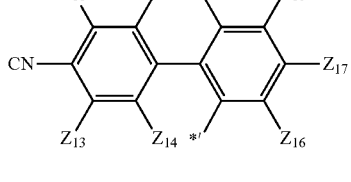

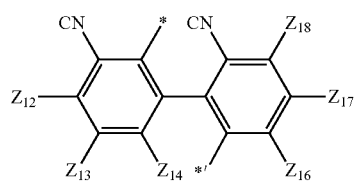
OO16
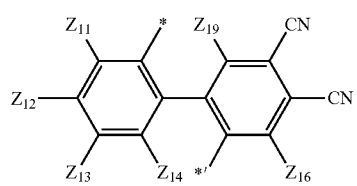
OO17
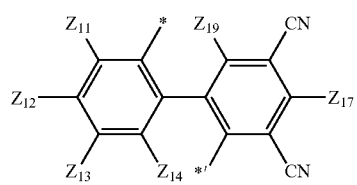
OO18
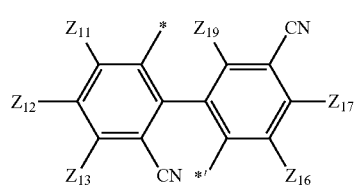
OO19
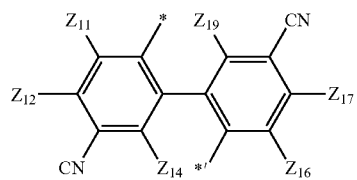
OO20
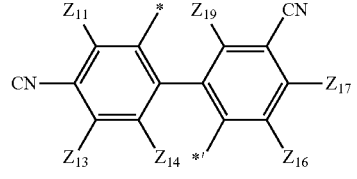
OO21
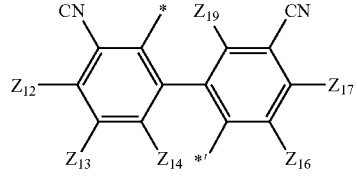
OO22
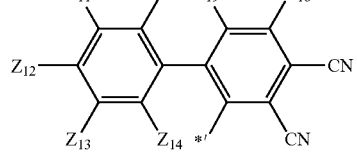
OO23
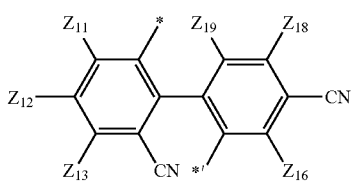
OO24
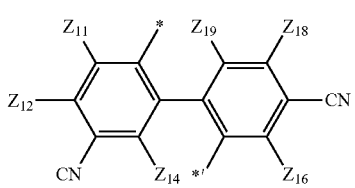
OO25
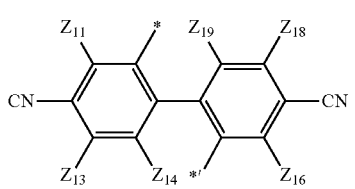
OO26
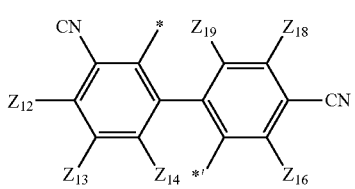
OO27
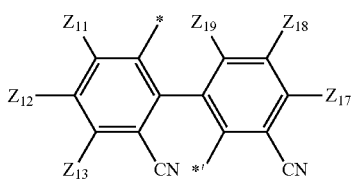
OO28
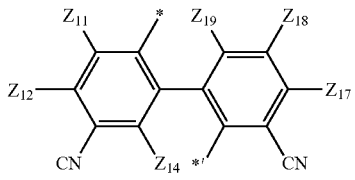
OO29
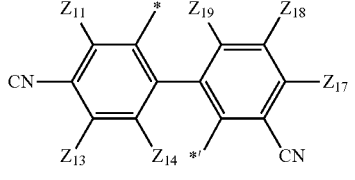
OO30
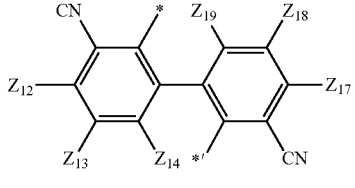
OO31

OO32 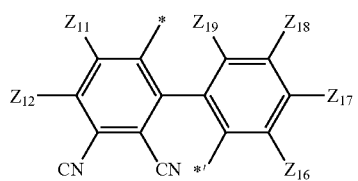
OO33 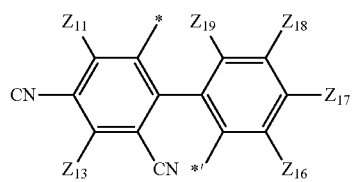
OO34 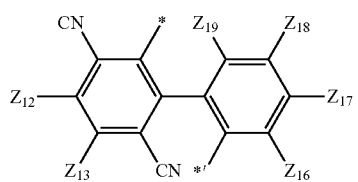
OO35 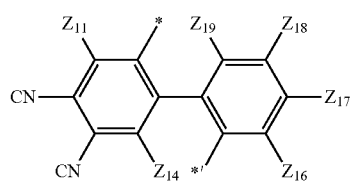
OO36 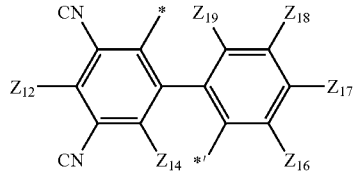
OO37 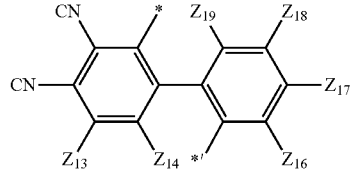
OM1 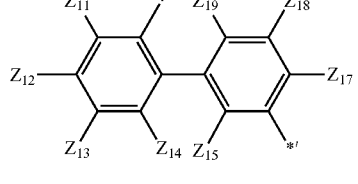
OM2 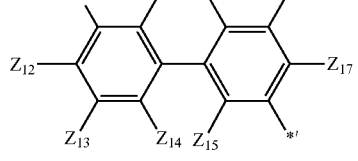
OM3 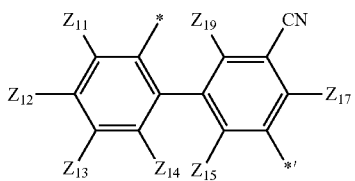
OM4 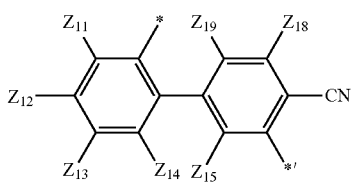
OM5 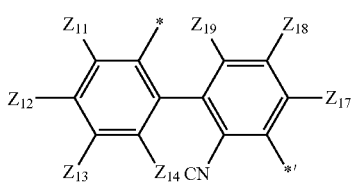
OM6 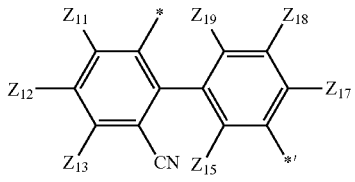
OM7 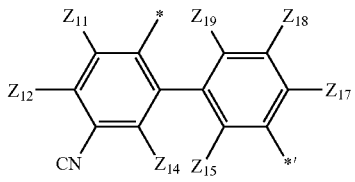
OM8 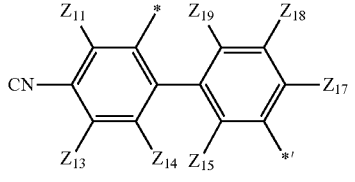
OM9 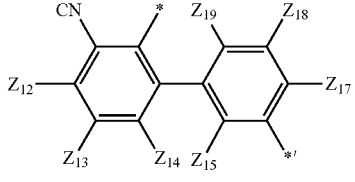
OM10 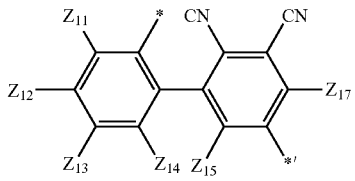

-continued
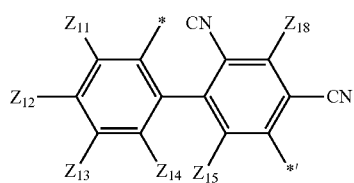 OM11
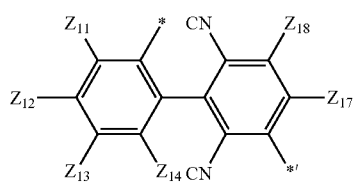 OM12
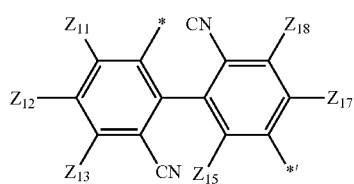 OM13
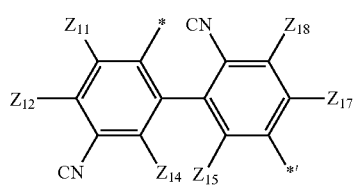 OM14
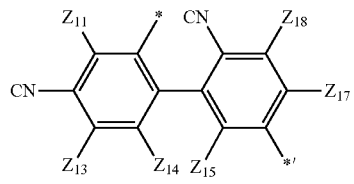 OM15
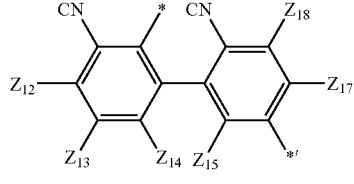 OM16
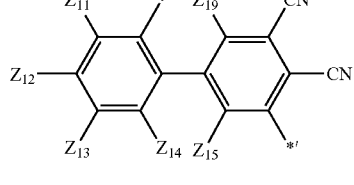 OM17
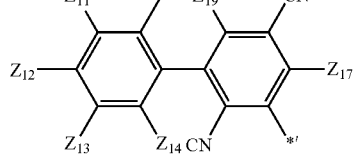 OM18
-continued
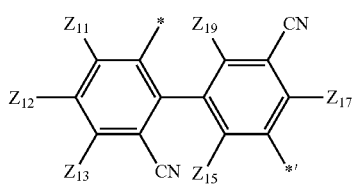 OM19
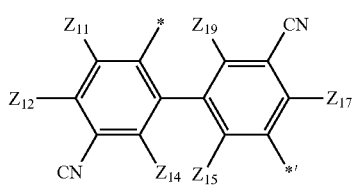 OM20
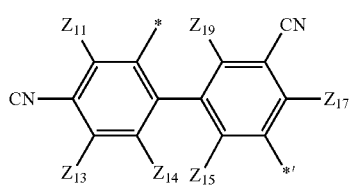 OM21
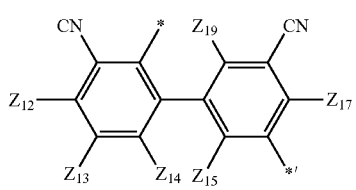 OM22
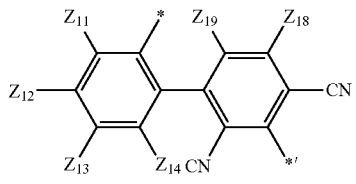 OM23
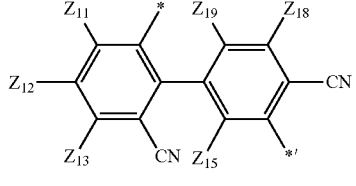 OM24
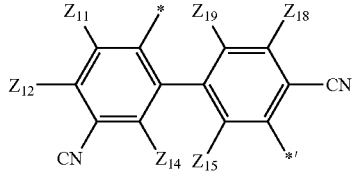 OM25
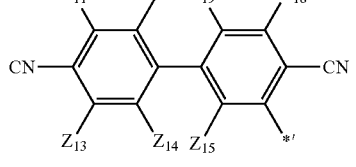 OM26

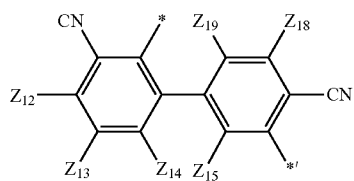 OM27
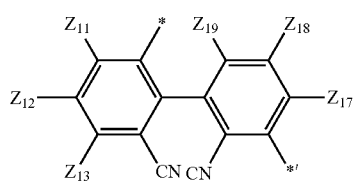 OM28
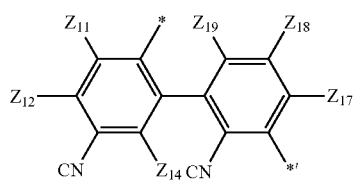 OM29
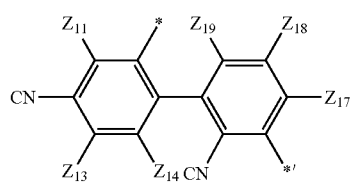 OM30
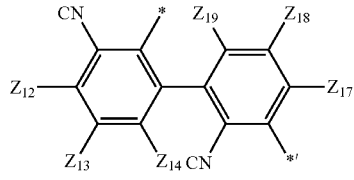 OM31
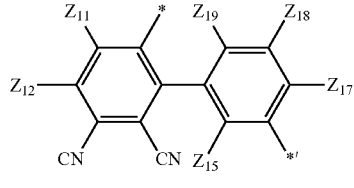 OM32
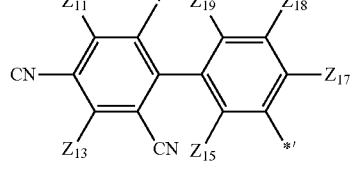 OM33
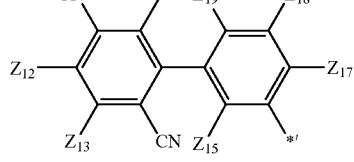 OM34
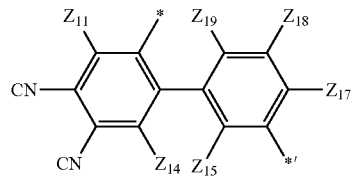 OM35
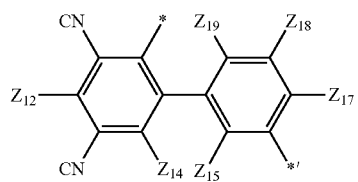 OM36
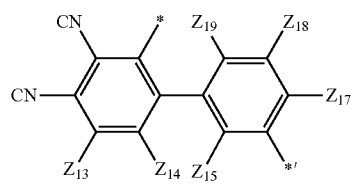 OM37
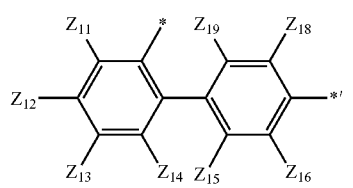 OP1
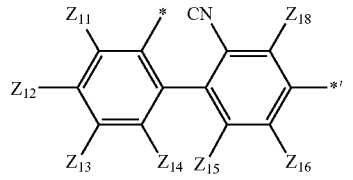 OP2
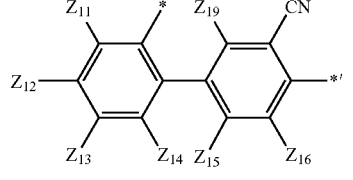 OP3
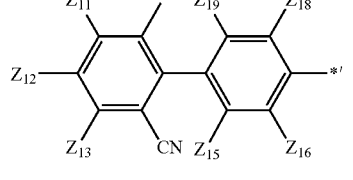 OP4
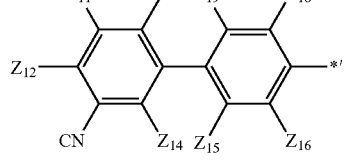 OP5

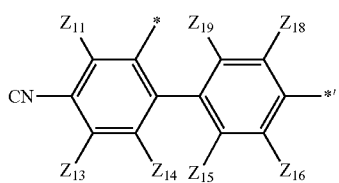
OP6
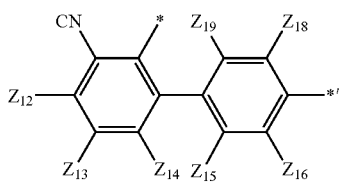
OP7
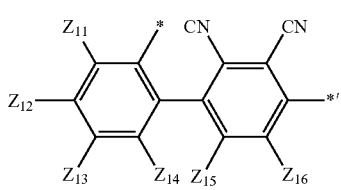
OP8
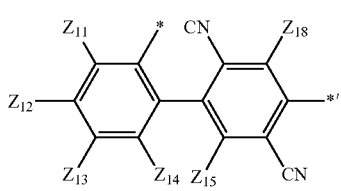
OP9
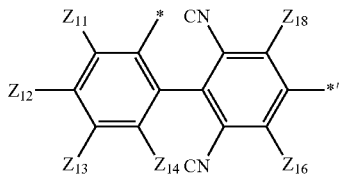
OP10
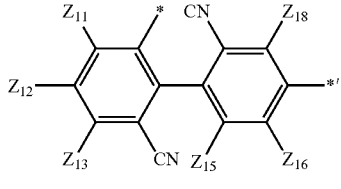
OP11
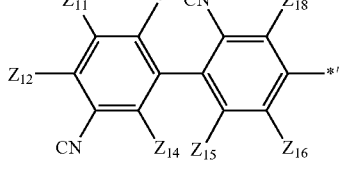
OP12
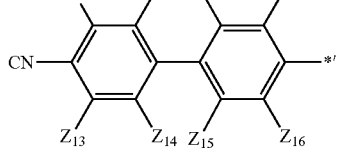
OP13
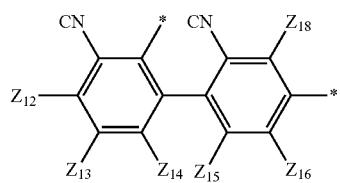
OP14
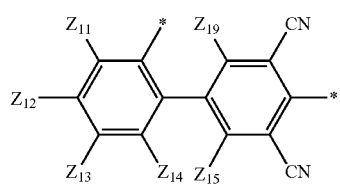
OP15
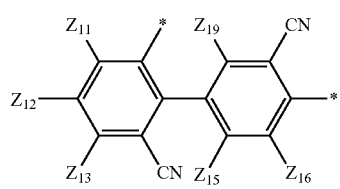
OP16
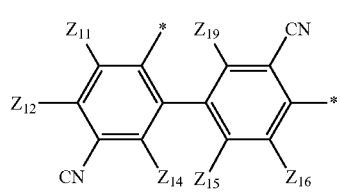
OP17
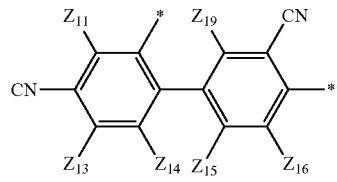
OP18
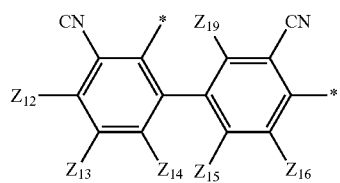
OP19
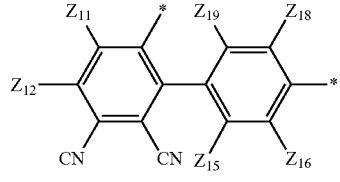
OP20
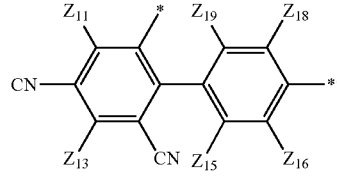
OP21

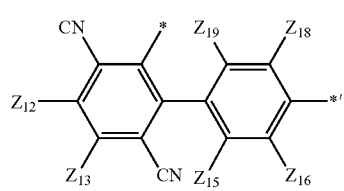
OP22
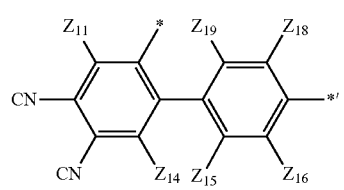
OP23
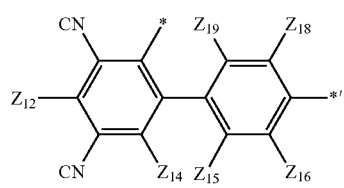
OP24
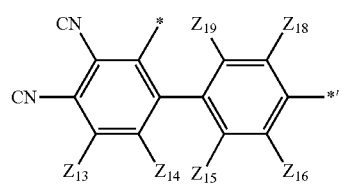
OP25
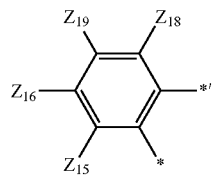
O1
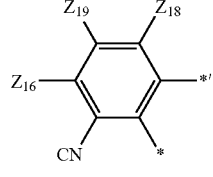
O2
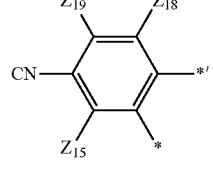
O3
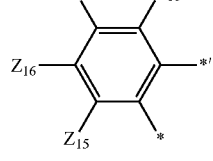
O4
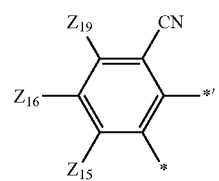
O5
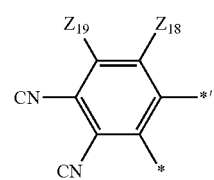
O6
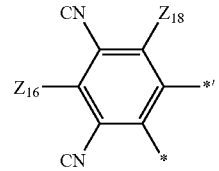
O7
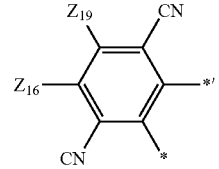
O8
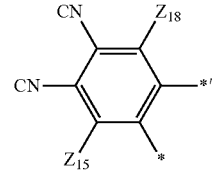
O9
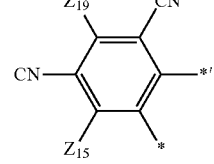
O11
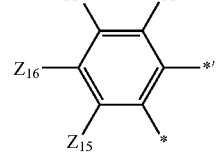
O11
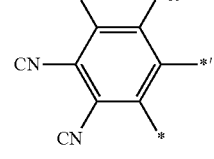
O12

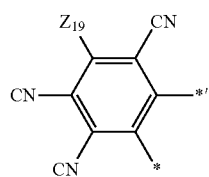 O13
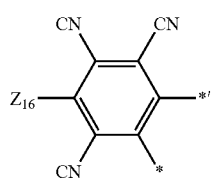 O14
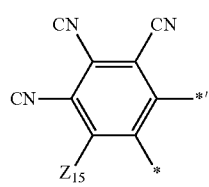 O15
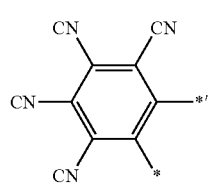 O16
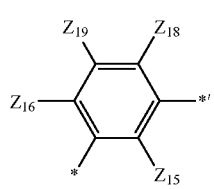 M1
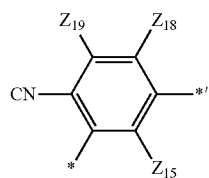 M2
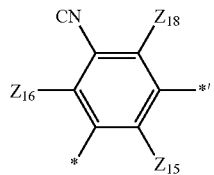 M3
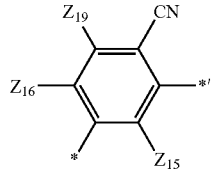 M4
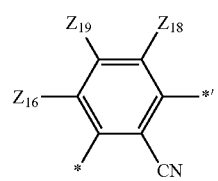 M5
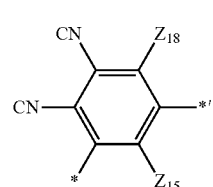 M6
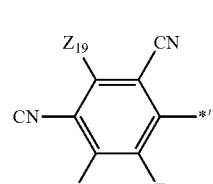 M7
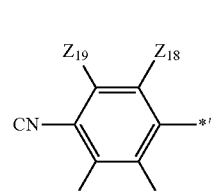 M8
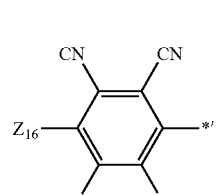 M9
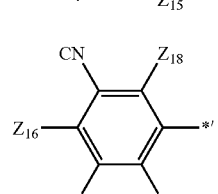 M10
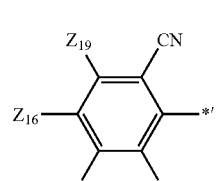 M11
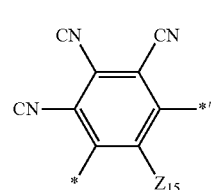 M12

M13 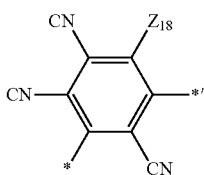

M14 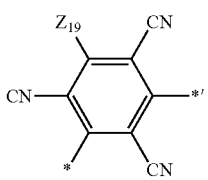

M15 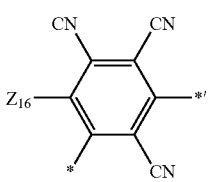

M16 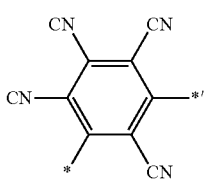

P1 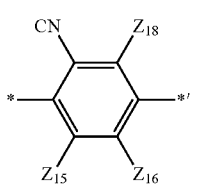

P2 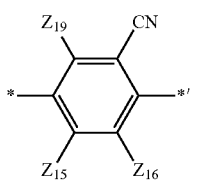

P3 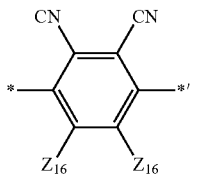

P4 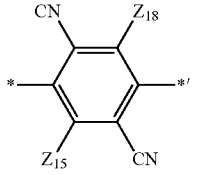

P5 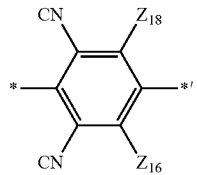

P6 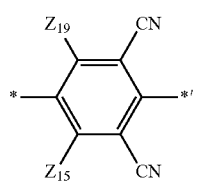

P7 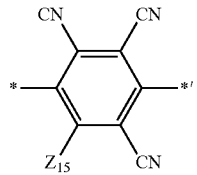

P8 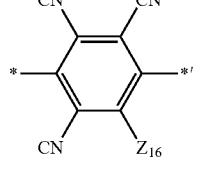

P9 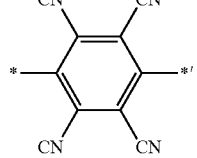

P9 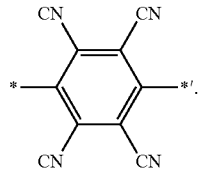

In Formulae PO1 to PO25, PM1 to PM25, PP1 to PP18, MO1 to MO37, MM1 to MM37, MP1 to MP25, OO1 to OO37, OM1 to OM37, OP1 to OP25, O1 to O16, M1 to M16, and P1 to P9, $Z_{10}$ to $Z_{19}$ are the same as described in connection with $Z_3$ and $Z_4$, and * and *' each indicate a binding site to a neighboring atom.

In an embodiment, in Formulae PO1 to PO25, PM1 to PM25, PP1 to PP18, MO1 to MO37, MM1 to MM37, MP1 to MP25, OO1 to OO37, OM1 to OM37, OP1 to OP25, O1 to O16, M1 to M16, and P1 to P9, $Z_{10}$ to $Z_{19}$ may not be a cyano group.

In one or more embodiments, in Formulae PO1 to PO25, PM1 to PM25, PP1 to PP18, MO1 to MO37, MM1 to MM37, MP1 to MP25, OO1 to OO37, OM1 to OM37, OP1 to OP25, O1 to O16, M1 to M16, and P1 to P9, $Z_{10}$ to $Z_{19}$ may each independently be:

hydrogen, deuterium, or a cyano group; or an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, a biphenyl group, or a terphenyl group, each unsubstituted or substituted with at least one selected from deuterium, a cyano group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a biphenyl group.

In an embodiment, the second material may include at least one compound selected from Compounds E1 to E6, but embodiments of the present disclosure are not limited thereto:

E1

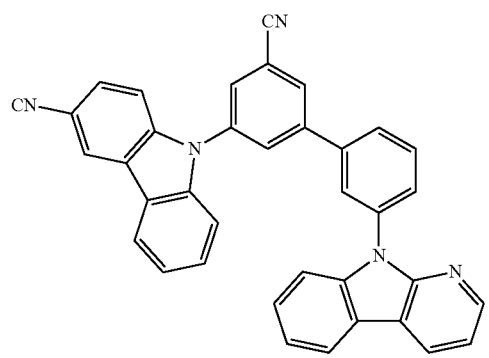

E2

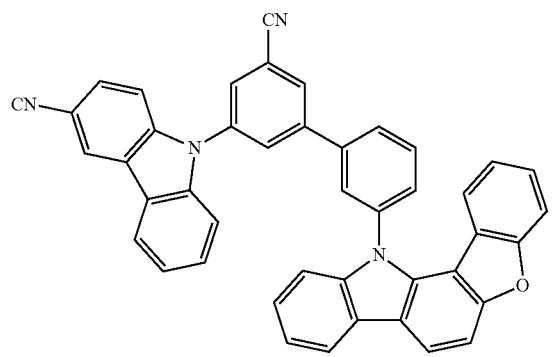

E3

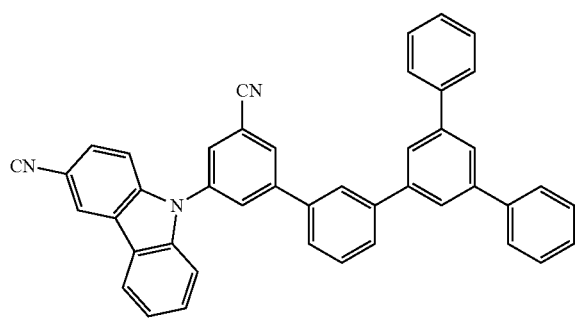

E4

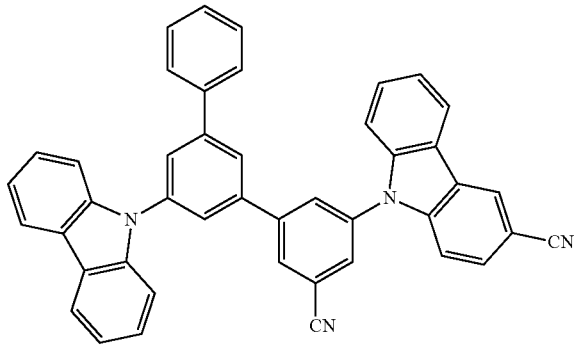

E5

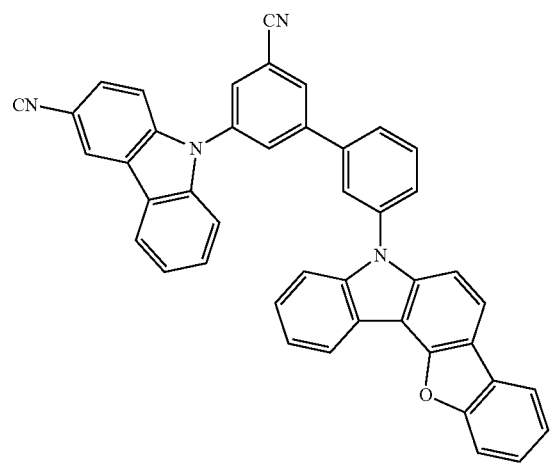

E6

In an embodiment, the light-emitting material may include a transition metal-containing organometallic compound that emits blue light.

The transition metal may be, for example, iridium (Ir), platinum (Pt), osmium (Os), titanium (Ti), zirconium (Zr), hafnium (Hf), europium (Eu), terbium (Tb), thulium (Tm), rhodium (Rh), ruthenium (Ru), rhenium (Re), cobalt (Co), copper (Cu), rhodium (Rh), palladium (Pd), silver (Ag), or gold (Au), but embodiments of the present disclosure are not limited thereto.

In an embodiment, the light-emitting material may include a transition metal-containing organometallic compound that emits blue light having a maximum emission wavelength in a range of about 420 nm to about 480 nm.

In one or more embodiments, the light-emitting material may include an organometallic compound including a bidentate ligand and a transition metal, the bidentate ligand including at least one cyano group or at least one fluoro group.

In one or more embodiments, the light-emitting material may include an organometallic compound including a cyano group-containing bidentate ligand and a transition metal.

In one or more embodiments, the light-emitting material may include an organometallic compound including a bidentate ligand and a transition metal, the bidentate ligand including at least one cyano group and at least one deuterium atom.

In one or more embodiments, the light-emitting material may include a homoleptic organometallic compound including a cyano group-containing phenylimidazole-based bidentate ligand and iridium.

In one or more embodiments, the light-emitting material may include an organometallic compound represented by Formula 1:

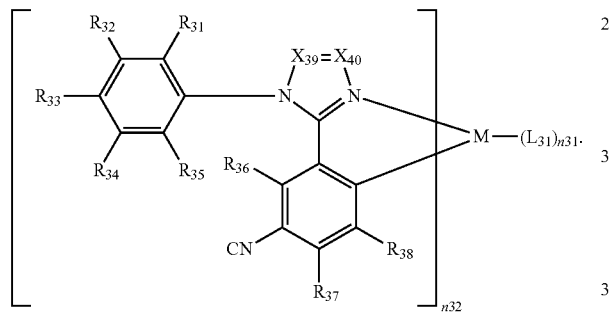

Formula 1

M in Formula 1 may be selected from a first-row transition metal, a second-row transition metal, and a third-row transition metal.

For example, M may be Ir, Os, Re, Pt, Pd, or Au, but embodiments of the present disclosure are not limited thereto.

In Formula 1, $L_{31}$ may be selected from a monodentate ligand and a bidentate ligand, and n31 may be 0, 1, 2, 3, or 4, wherein, when n31 is two or more, two or more groups $L_{31}$ may be identical to or different from each other.

n32 in Formula 1 may be 1, 2, or 3.

For example, when M is Ir or Os, the sum of n31 and n32 may be 3, and when M is Pt, the sum of n31 and n32 may be 2.

In Formula 1, $X_{39}$ may be N or $C(R_{39})$, and $X_{40}$ may be N or $C(R_{40})$.

$R_{31}$ to $R_{40}$ may each independently be selected from hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(=O)($Q_8$)($Q_9$). $Q_1$ to $Q_9$ are the same as described above.

For example, $R_{31}$ to $R_{40}$ may each independently be selected from:
hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and —N($Q_1$)($Q_2$), —Si($Q_3$)($Q_4$)($Q_5$), —B($Q_6$)($Q_7$), and —P(=O)($Q_8$)($Q_9$), and $Q_1$ to $Q_9$ may each independently be selected from:

—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, and —CD$_2$CDH$_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group;

but embodiments of the present disclosure are not limited thereto.

Two adjacent groups among $R_{31}$ to $R_{40}$ may optionally be linked to form a substituted or unsubstituted $C_5$-$C_{30}$ carbocyclic group or a substituted or unsubstituted $C_2$-$C_{30}$ heterocyclic group.

In an embodiment, in Formula 1, at least one selected from $R_{31}$, $R_{33}$, and $R_{35}$ (for example, $R_{31}$ and $R_{35}$) may each independently be selected from:

deuterium, a cyano group, a $C_1$-$C_{20}$ alkyl group, a phenyl group, a biphenyl group or a terphenyl group; or a $C_1$-$C_{20}$ alkyl group, a phenyl group, a biphenyl group, or a terphenyl group, each unsubstituted with substituted with at least one selected from deuterium, a cyano group, and a $C_1$-$C_{20}$ alkyl group.

In an embodiment, the organometallic compound represented by Formula 1 may have a maximum emission wavelength in a range of about 420 nm to about 480 nm (for example, in a range of about 440 nm to about 470 nm or about 440 nm to about 467 nm). When the maximum emission wavelength is in a range of about 440 nm to about 470 nm, an organic light-emitting device emitting light of deep blue color may be provided.

In an embodiment, the light-emitting material may include at least one compound selected from Compounds 1 to 24, Compounds D1 to D11, and $F_2$IrPic, but embodiments of the present disclosure are not limited thereto:

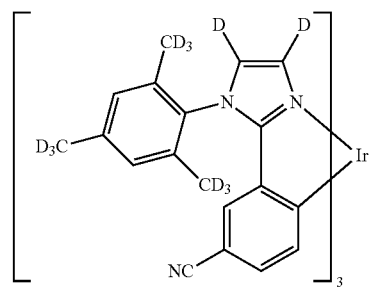

1

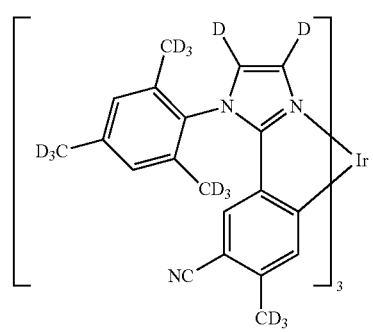

2

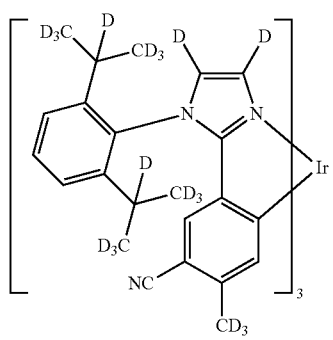
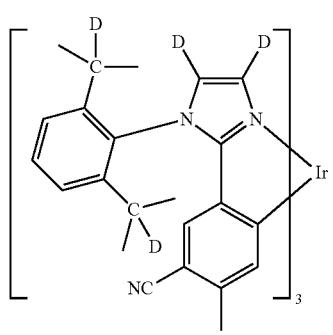
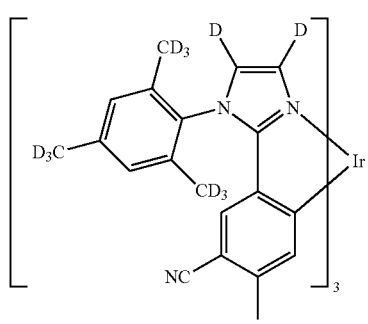
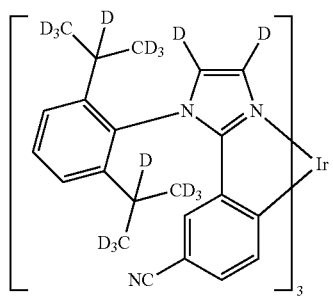
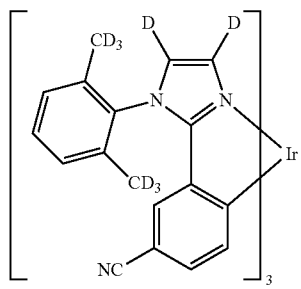
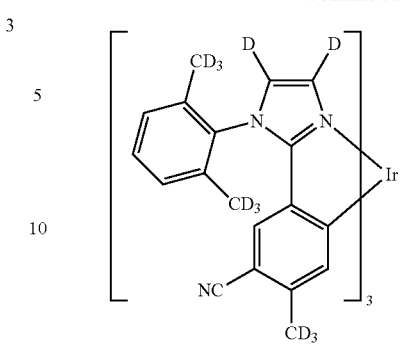
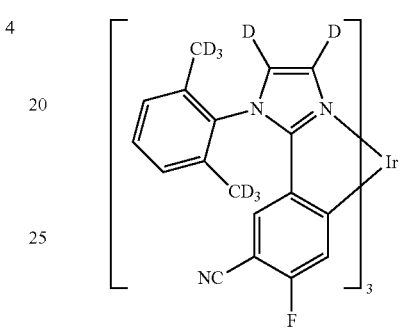
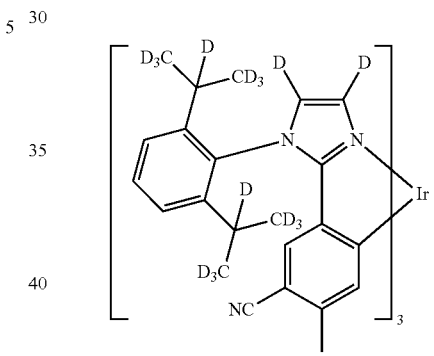
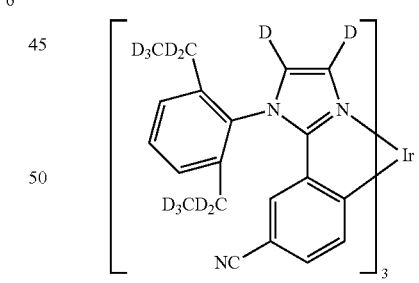
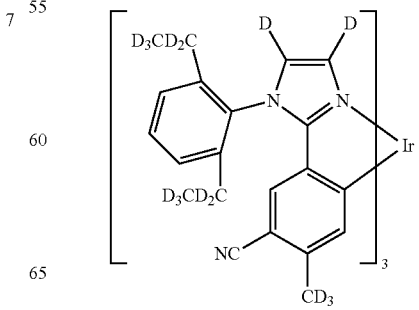

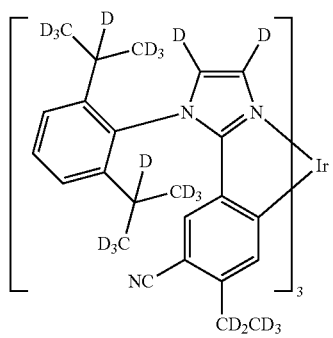
13
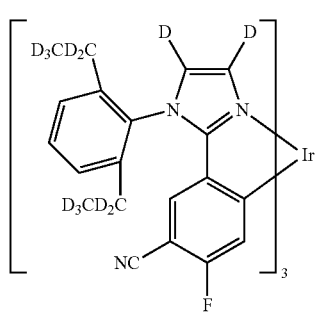
14
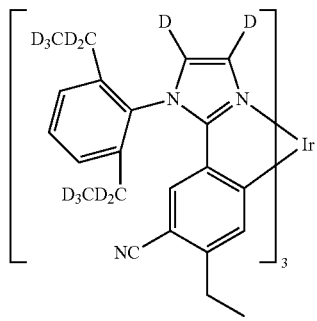
15
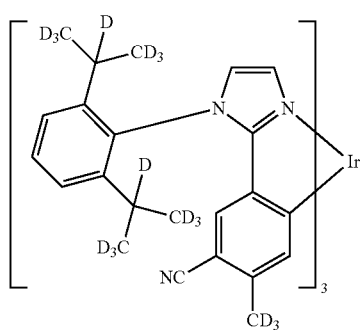
16
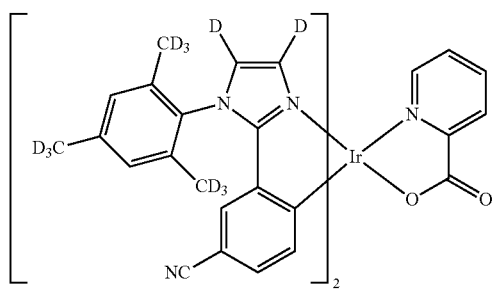
17
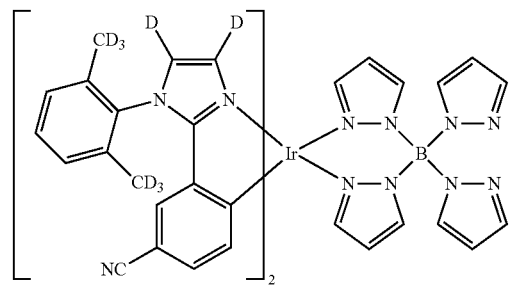
18
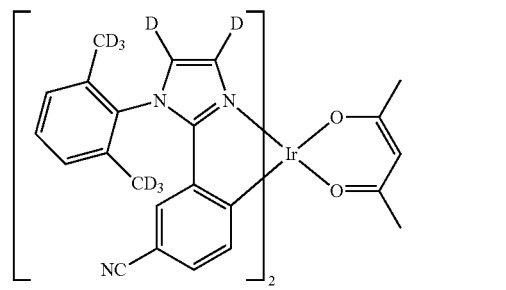
19
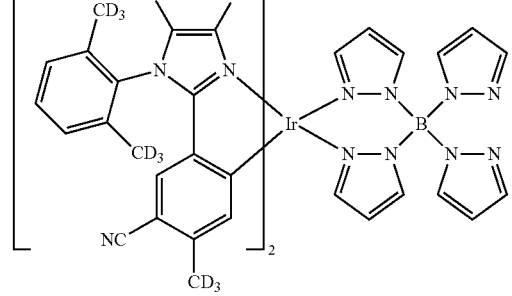
20
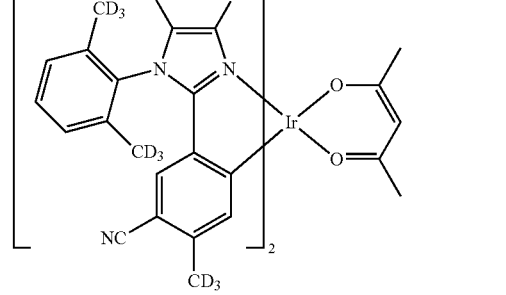
21
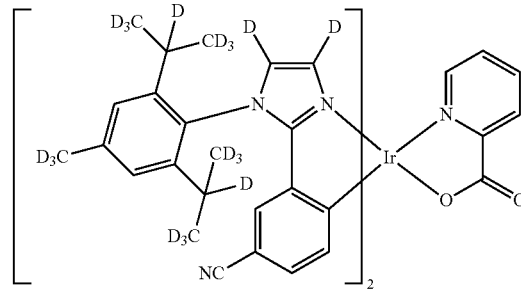
22

23
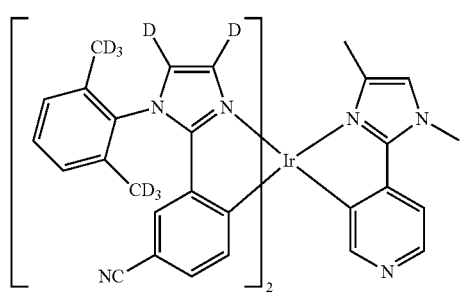
24
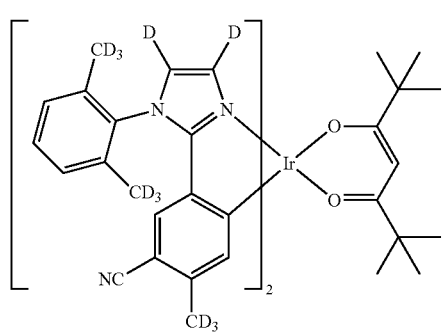
D1
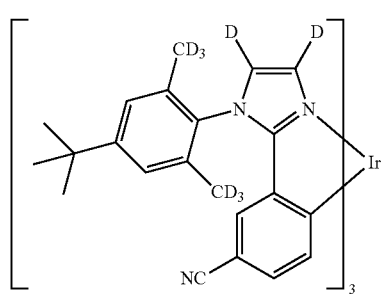
D2
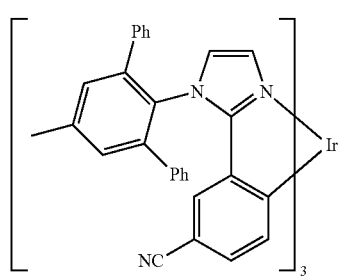
D3
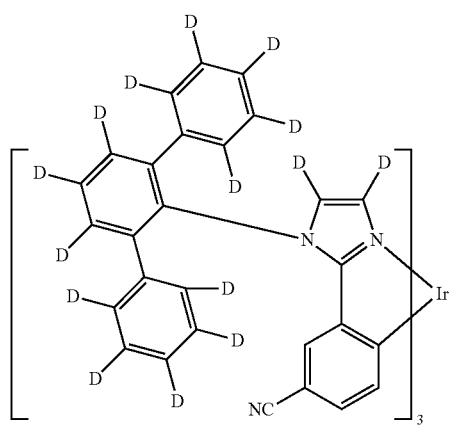
D4
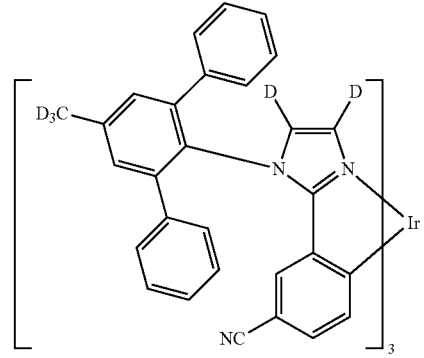
D5
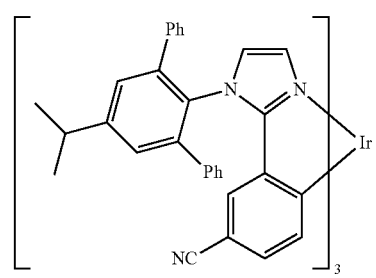
D6
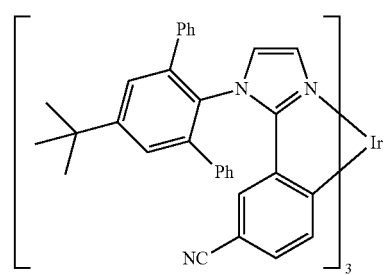
D7
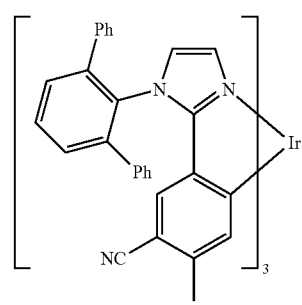
D8
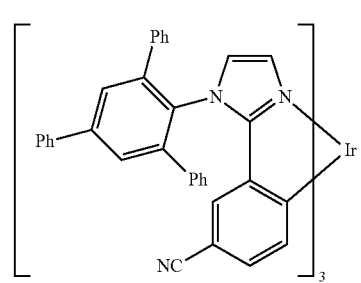

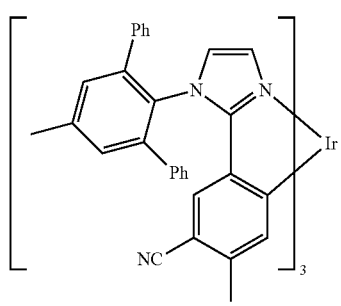

D9

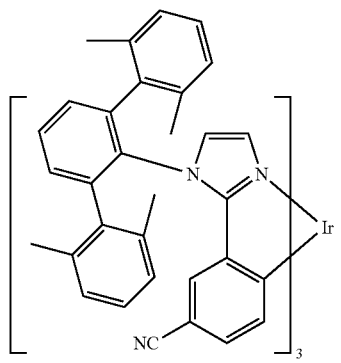

D10

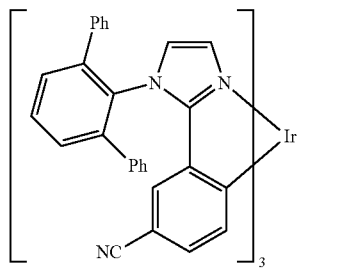

D11

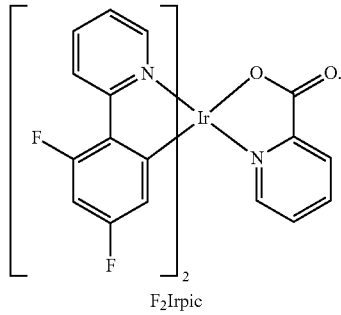

F₂Irpic

The first material, the second material, and the light-emitting material in the emission layer may be different from one another.

A ratio of the light-emitting component emitted from the light-emitting material to the entire light-emitting component emitted from the emission layer may be 90% or more, for example, 92% or more, 94% or more, 96% or more, or 98% or more.

A total amount of the first material and the second material may be greater than an amount of the light-emitting material.

For example, an amount of the light-emitting material may be about 10 parts by weight or less, for example, about 0.1 parts by weight to about 5 parts by weight, based on 100 parts by weight of the total amount of the first material, the second material, and the light-emitting material. While not wishing to be bound by theory, it is understood that when the amount of the light-emitting material is within this range, high luminescence efficiency may be achieved without concentration quenching.

A total amount of the first material and the second material may be in a range of about 50 parts by weight to 95 parts by weight, for example, about 60 parts by weight to about 90 parts by weight, based on 100 parts by weight of the total amount of the first material, the second material, and the light-emitting material. When the total amount of the first material and the second material is within this range, high luminescence efficiency may be achieved without concentration quenching.

The weight ratio of the first material to the second material may be selected from 1:9 to 9:1, 2:8 to 8:2, 3:7 to 7:3, or 4:6 to 6:4.

The first material and the second material may act as a host in the emission layer, and the light-emitting material may act as a dopant in the emission layer.

The FIGURE is a schematic view of an organic light-emitting device 10 according to an embodiment. Hereinafter, the structure of an organic light-emitting device according to an embodiment and a method of manufacturing an organic light-emitting device according to an embodiment will be described in connection with the FIGURE. The organic light-emitting device 10 includes a first electrode 11, an organic layer 15, and a second electrode 19, which are sequentially stacked.

A substrate may be additionally disposed under the first electrode 11 or above the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

The first electrode 11 may be formed by depositing or sputtering a material for forming the first electrode 11 on the substrate. The first electrode 11 may be an anode. The material for forming the first electrode 11 may be selected from materials with a high work function to facilitate hole injection. The first electrode 11 may be a reflective electrode, a semi-transmissive electrode, or a transmissive electrode. The material for forming the first electrode may be, for example, indium tin oxide (ITO), indium zinc oxide (IZO), tin oxide (SnO₂), and zinc oxide (ZnO). In one or more embodiments, magnesium (Mg), aluminum (Al), aluminum-lithium (Al—Li), calcium (Ca), magnesium-indium (Mg—In), or magnesium-silver (Mg—Ag) may be used as the material for forming the first electrode.

The first electrode 11 may have a single-layered structure or a multi-layered structure including two or more layers. For example, the first electrode 11 may have a three-layered structure of ITO/Ag/ITO, but the structure of the first electrode 110 is not limited thereto.

The organic layer 15 is disposed on the first electrode 11.

The organic layer 15 may include a hole transport region, an emission layer, and an electron transport region.

The hole transport region may be disposed between the first electrode 11 and the emission layer.

The hole transport region may include at least one selected from a hole injection layer, a hole transport layer, an electron blocking layer, and a buffer layer. The hole transport layer may be a single layer or may include two or more layers.

The hole transport region may include only either a hole injection layer or a hole transport layer. In an embodiment, the or hole transport region may include a hole injection layer/hole transport layer structure, a hole injection layer/ hole transport layer/electron blocking layer structure, a hole transport layer/electron blocking layer structure, a hole injection layer/first hole transport layer/second hole transport layer structure, a hole injection layer/first hole transport layer/second hole transport layer/electron blocking layer structure, or a first hole transport layer/second hole transport layer/electron blocking layer structure, wherein for each structure, constituting layers are sequentially stacked from the first electrode 100 in this stated order, but the structure of the hole transport region is not limited thereto.

A hole injection layer may be formed on the first electrode 11 by using one or more suitable methods selected from vacuum deposition, spin coating, casting, or Langmuir-Blodgett (LB) deposition.

When a hole injection layer is formed by vacuum deposition, the deposition conditions may vary according to a compound that is used to form the hole injection layer, and the structure and thermal characteristics of the hole injection layer. For example, the deposition conditions may include a deposition temperature of about 100° C. to about 500° C., a vacuum pressure of about $10^{-8}$ to about $10^{-3}$ torr, and a deposition rate of about 0.01 Angstroms per second (Å/sec) to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include at least one selected from m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzene sulfonic acid (PANI/ DBSA), poly(3,4-ethylenedioxythiophene)/poly(4-styrenesulfonate) (PEDOT/PSS), polyaniline/camphor sulfonic acid (PANI/CSA), polyaniline/poly(4-styrene sulfonate) (PANI/PSS), a compound represented by Formula 201 below, and a compound represented by Formula 202 below:

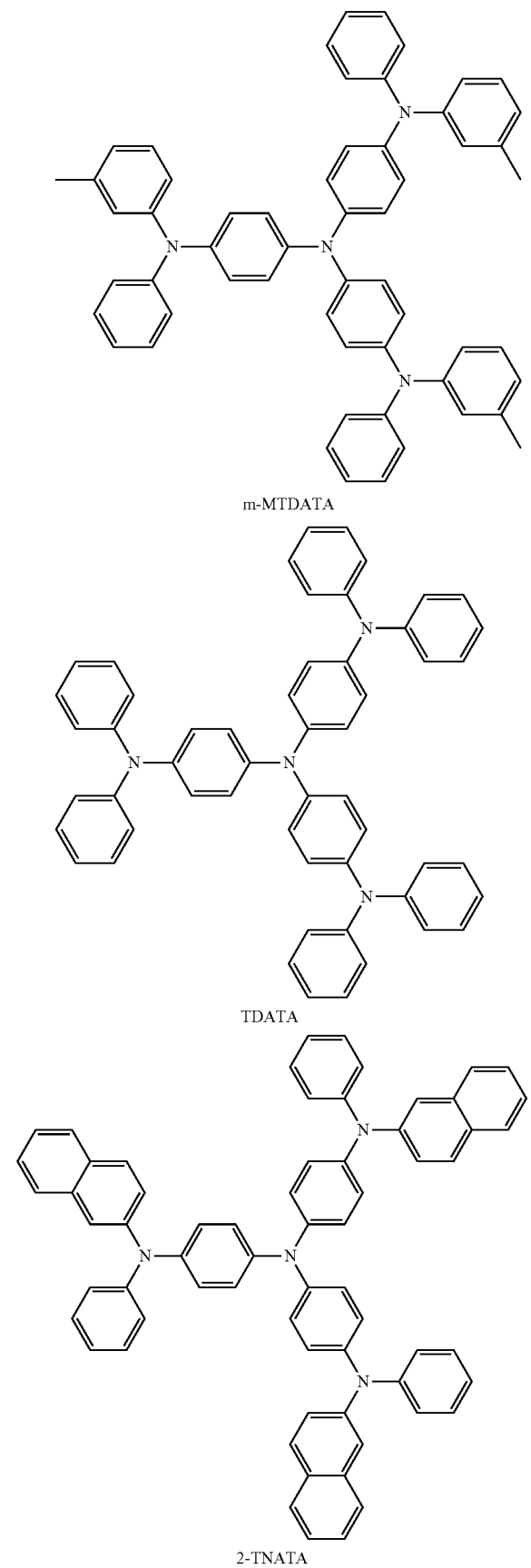

m-MTDATA

TDATA

2-TNATA

-continued
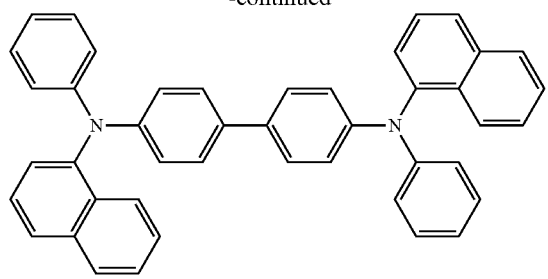
NPB
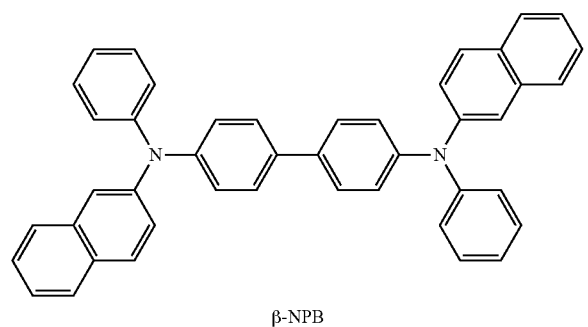
β-NPB
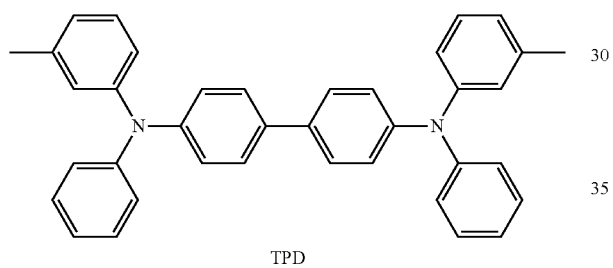
TPD
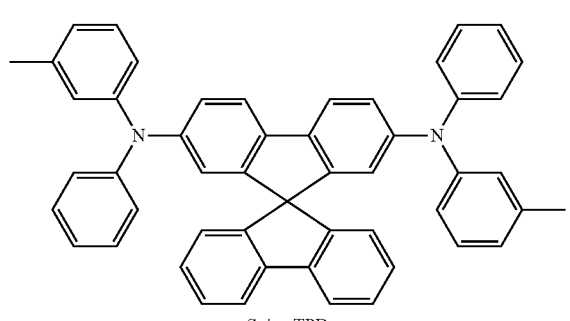
Spiro-TPD
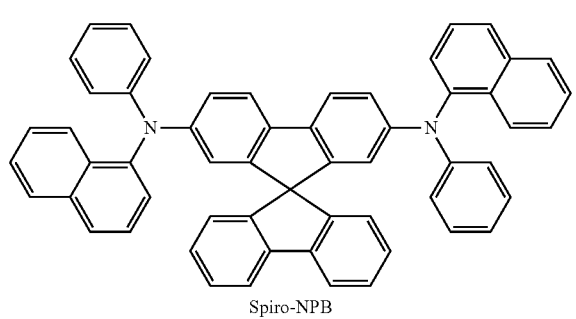
Spiro-NPB
-continued
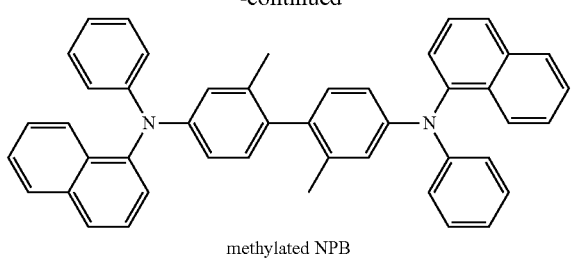
methylated NPB
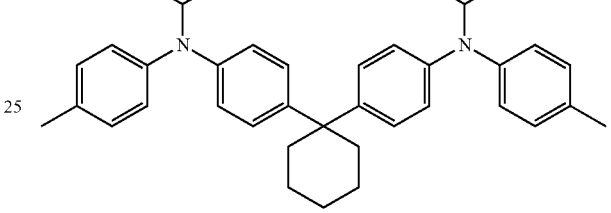
TAPC
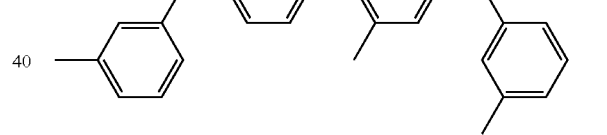
HMTPD
Formula 201
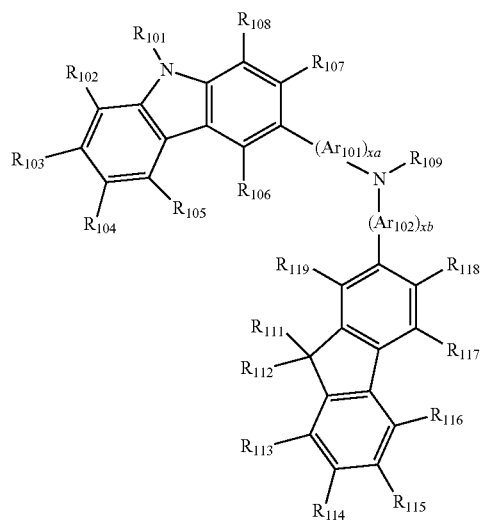

Formulaa 202

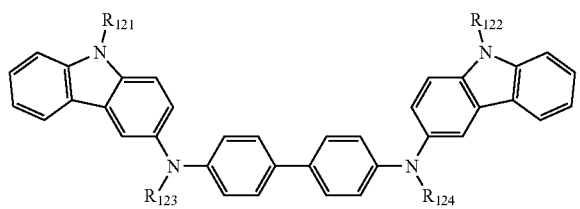

In Formula 201, $Ar_{101}$ and $Ar_{102}$ may each independently be selected from:
- a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and
- a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

In Formula 201, xa and xb may each independently be an integer of 0 to 5, or may be 0, 1, or 2. For example, xa is 1 and xb is 0, but xa and xb are not limited thereto.

In Formulae 201 and 202, $R_{101}$ to $R_{108}$, $R_{111}$ to $R_{119}$, and $R_{121}$ to $R_{124}$ may each independently be selected from:
- hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, a hexyl group, and the like), and a $C_1$-$C_{10}$ alkoxy group (for example, a methoxy group, an ethoxy group, a propoxy group, a butoxy group, a pentoxy group, and the like);
- a $C_1$-$C_{10}$ alkyl group and a $C_1$-$C_{10}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;
- a phenyl group, a naphthyl group, an anthracenyl group, a fluorenyl group, and a pyrenyl group; and
- a phenyl group, a naphthyl group, an anthracenyl group, a fluorenyl group, and a pyrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group, but embodiments of the present disclosure are not limited thereto.

In Formula 201, $R_{109}$ may be selected from:
- a phenyl group, a naphthyl group, an anthracenyl group, and a pyridinyl group; and
- a phenyl group, a naphthyl group, an anthracenyl group, and a pyridinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, and a pyridinyl group.

In an embodiment, the compound represented by Formula 201 may be represented by Formula 201A, but embodiments of the present disclosure are not limited thereto:

Formula 201A

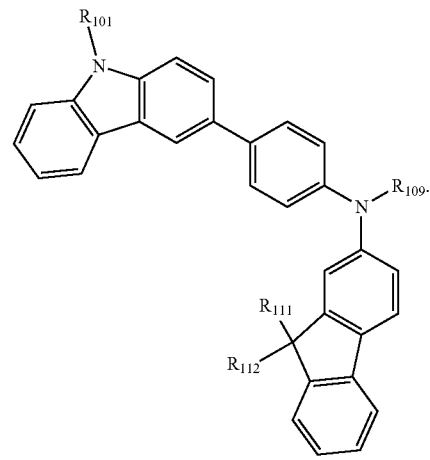

In Formula 201, $R_{101}$, $R_{111}$, $R_{112}$, and $R_{109}$ may respectively be defined the same as described above.

For example, the compound represented by Formula 201, and the compound represented by Formula 202 may include compounds HT1 to HT20 illustrated below, but are not limited thereto.

HT1
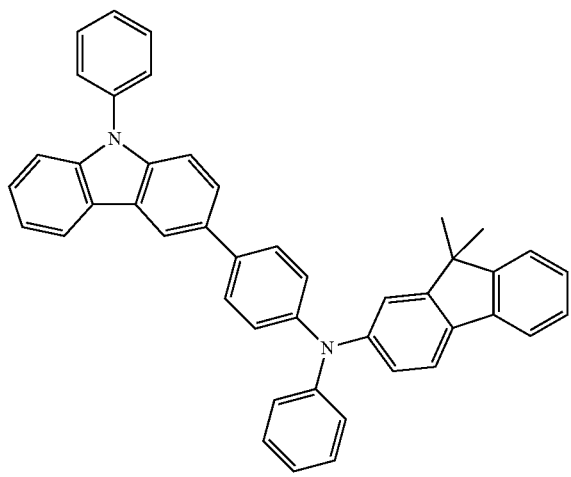
HT3
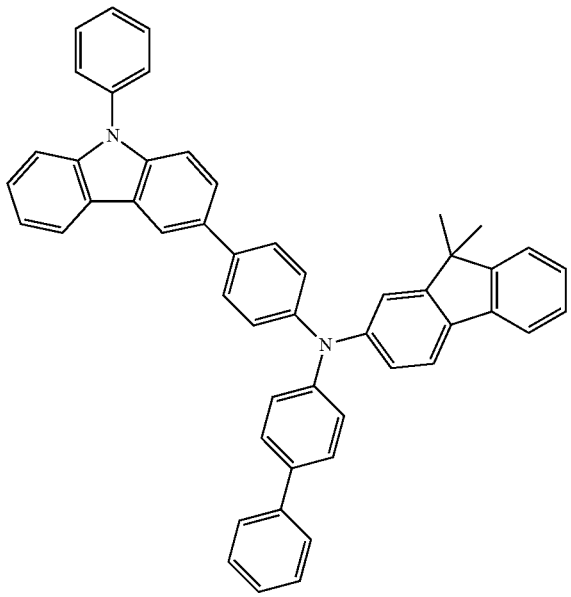
HT2
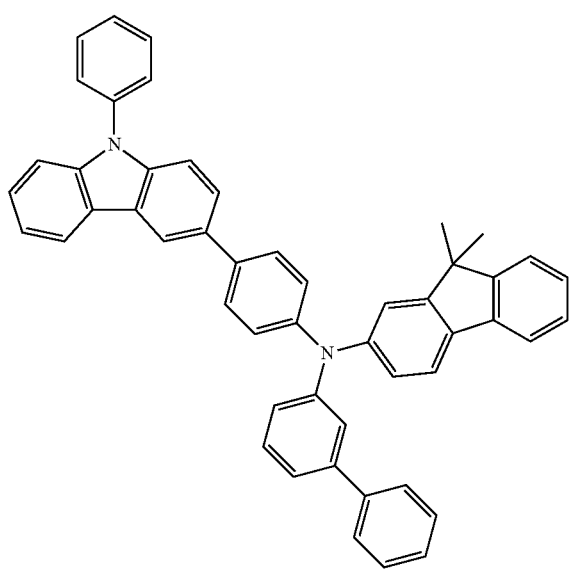
HT4
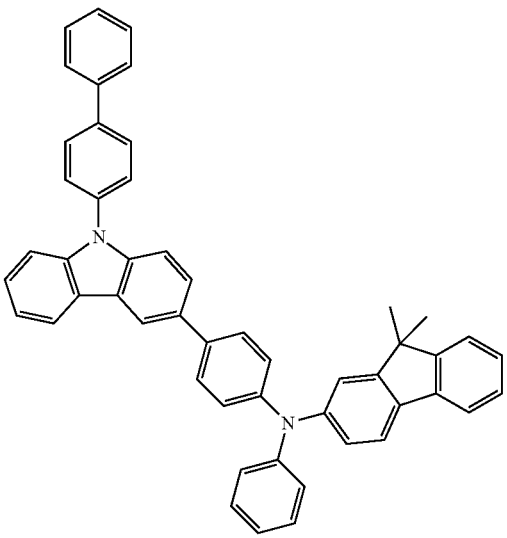

HT5
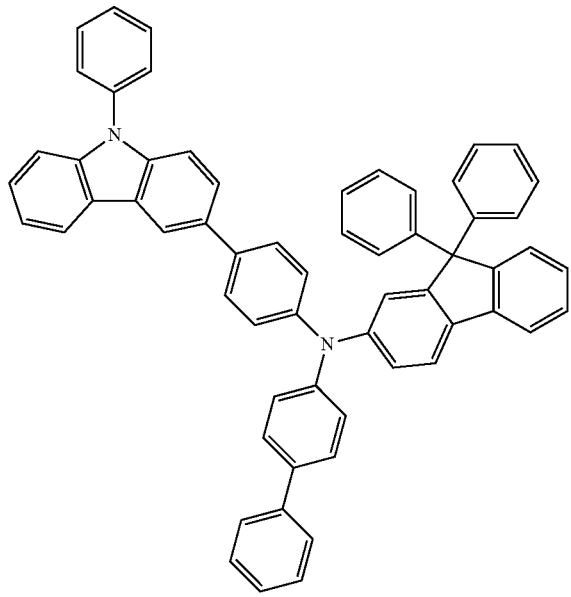
HT7
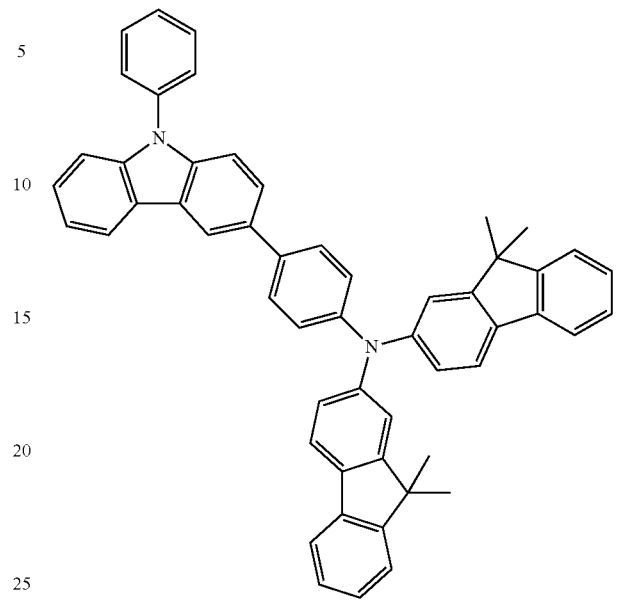
HT8
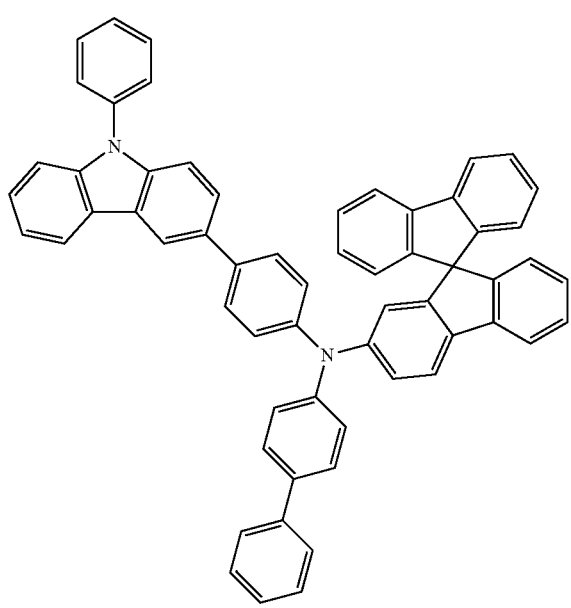
HT6
HT9
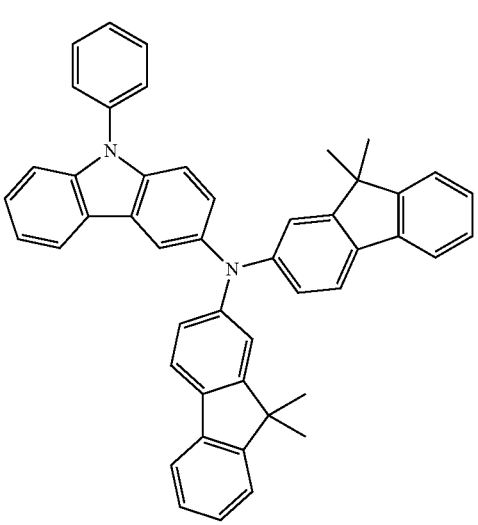

HT10
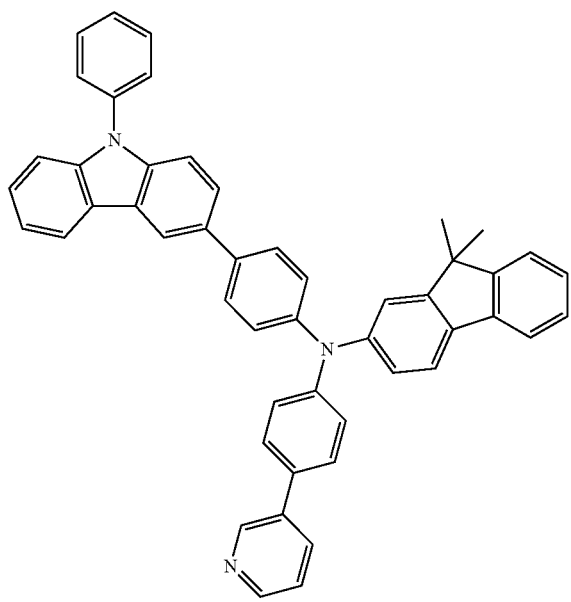
HT11
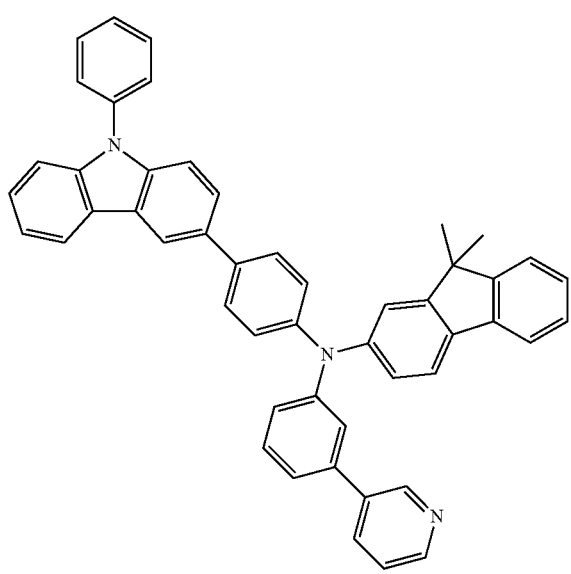
HT12
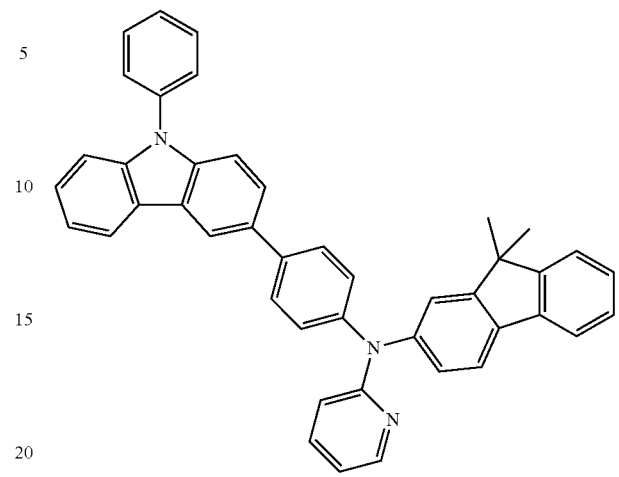
HT13
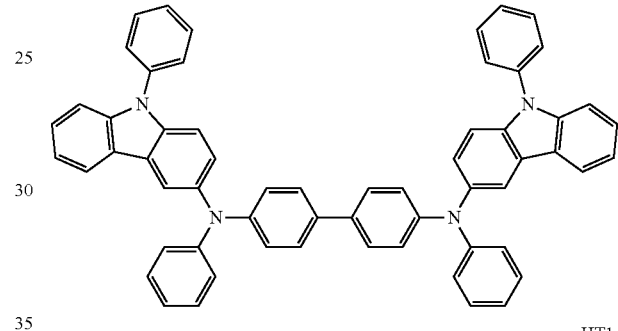
HT14
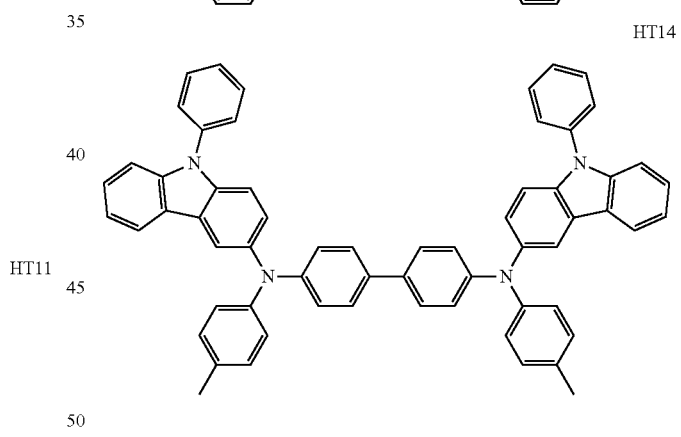
HT15
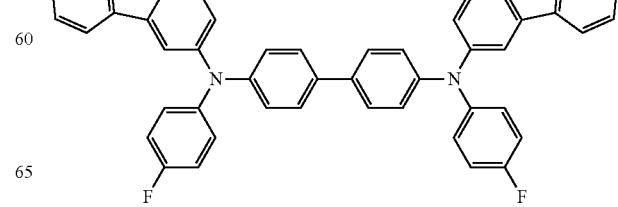

-continued

HT16
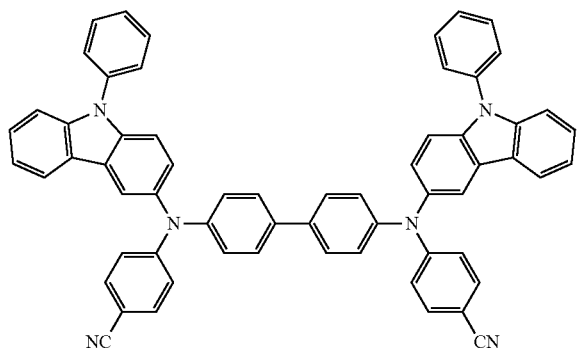

HT20
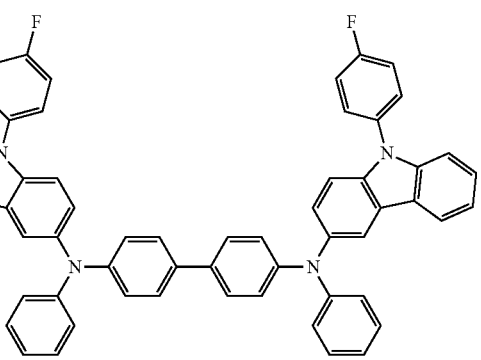

HT17, HT18, HT19
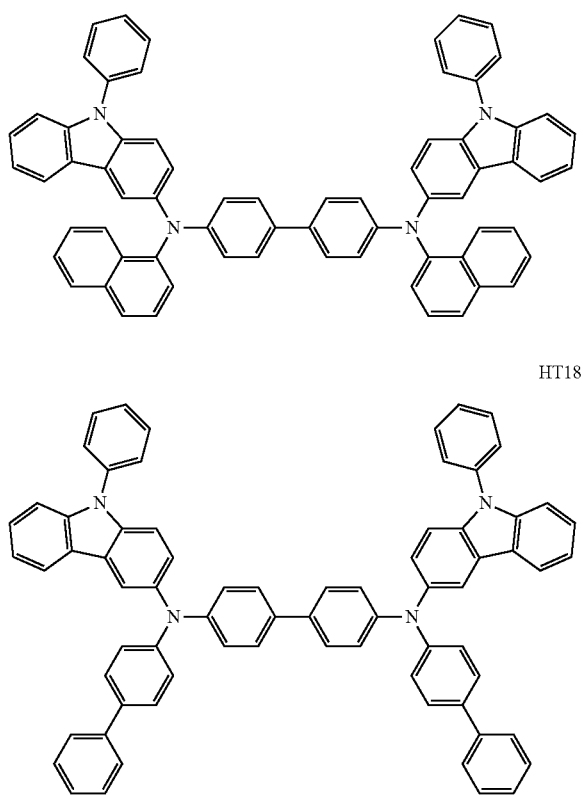

A thickness of the hole transport region may be in a range of about 100 Angstroms (Å) to about 10,000 Å, for example, about 100 Å to about 1,000 Å. When the hole transport region includes a hole injection layer and a hole transport layer, the thickness of the hole injection layer may be in a range of about 100 Å to about 10,000 Å, and for example, about 100 Å to about 1,000 Å, and the thickness of the hole transport layer may be in a range of about 50 Å to about 2,000 Å, and for example, about 100 Å to about 1,500 Å. While not wishing to be bound by theory, it is understood that when the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one selected from a quinone derivative, a metal oxide, and a cyano group-containing compound, but embodiments of the present disclosure are not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenium oxide; and a cyano group-containing compound, such as Compound HT-D1 or Compound HT-D2 below, but are not limited thereto.

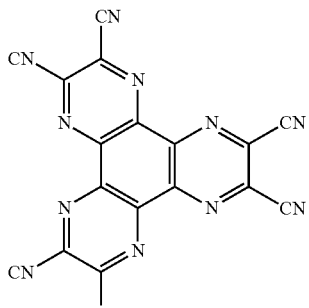

HT-D1

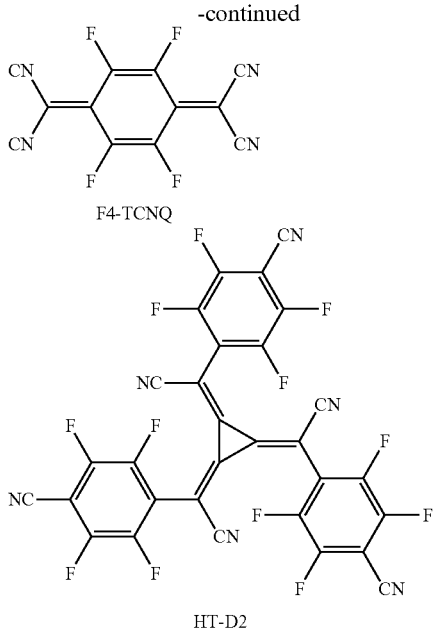

F4-TCNQ

HT-D2

The hole transport region may include a buffer layer.

Also, the buffer layer may compensate for an optical resonance distance according to a wavelength of light emitted from the emission layer, and thus, efficiency of a formed organic light-emitting device may be improved.

Then, an emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a compound that is used to form the emission layer.

Meanwhile, when the hole transport region includes an electron blocking layer, a material for the electron blocking layer may be selected from materials for the hole transport region described above and materials for a host to be explained later. However, the material for the electron blocking layer is not limited thereto. For example, when the hole transport region includes an electron blocking layer, a material for the electron blocking layer may be mCP.

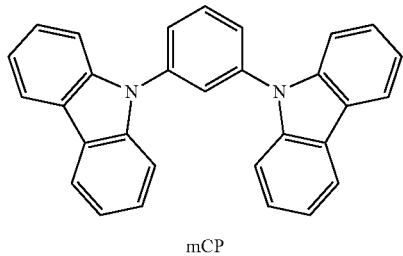 [SMILES: c1cc(-n2c3ccccc3c3ccccc32)cc(-n2c3ccccc3c3ccccc32)c1]

mCP

The emission layer may include the first material, the second material, and the light-emitting material that are described above.

When the organic light-emitting device is a full-color organic light-emitting device, the emission layer may be patterned into a red emission layer, a green emission layer, and a blue emission layer. In one or more embodiments, due to a stacked structure including a red emission layer, a green emission layer, and/or a blue emission layer, the emission layer may emit white light.

A thickness of the emission layer may be in a range of about 100 Å to about 1,000 Å, for example, about 200 Å to about 600 Å. While not wishing to be bound by theory, it is understood that when the thickness of the emission layer is within this range, excellent light-emission characteristics may be obtained without a substantial increase in driving voltage.

Then, an electron transport region may be disposed on the emission layer.

The electron transport region may include at least one selected from a hole blocking layer, an electron transport layer, and an electron injection layer.

For example, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP, BPhen, and BAlq but embodiments of the present disclosure are not limited thereto.

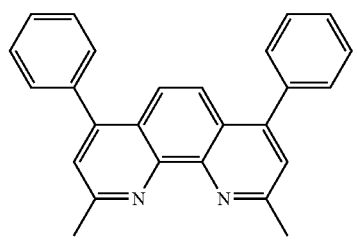

BCP

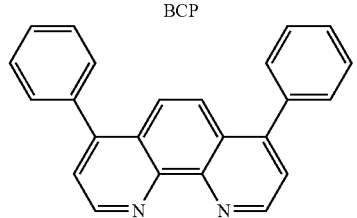

Bphen

A thickness of the hole blocking layer may be in a range of about 20 Å to about 1,000 Å, for example, about 30 Å to about 300 Å. While not wishing to be bound by theory, it is understood that when the thickness of the hole blocking layer is within these ranges, the hole blocking layer may have improved hole blocking ability without a substantial increase in driving voltage.

The electron transport layer may further include at least one selected from BCP, BPhen, Alq$_3$, BAlq, TAZ, and NTAZ.

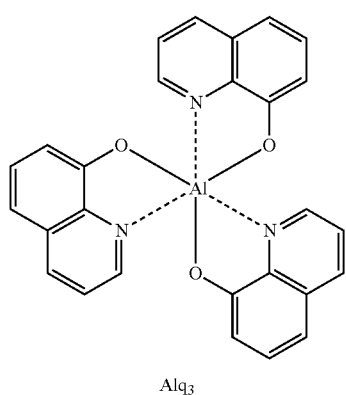
Alq₃
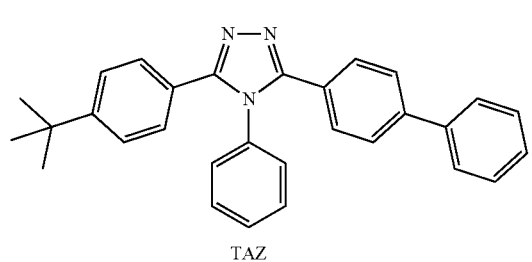
BAlq
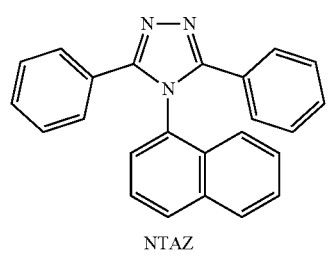
TAZ
NTAZ
In one or more embodiments, the electron transport layer may include at least one of ET1 to ET25, but are not limited thereto:
ET1
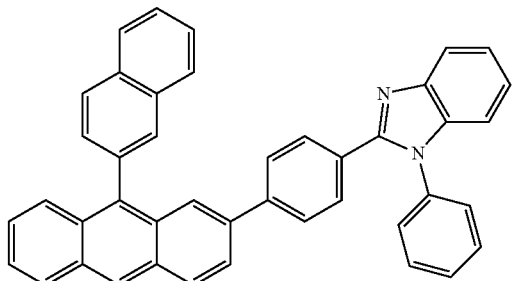
ET2
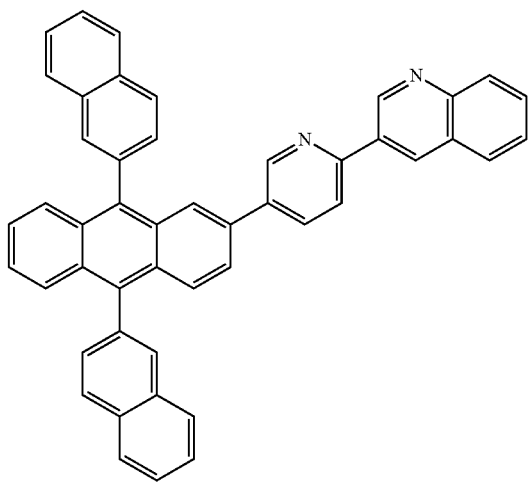
ET3
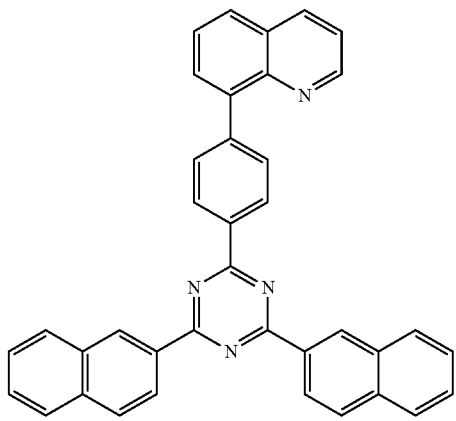

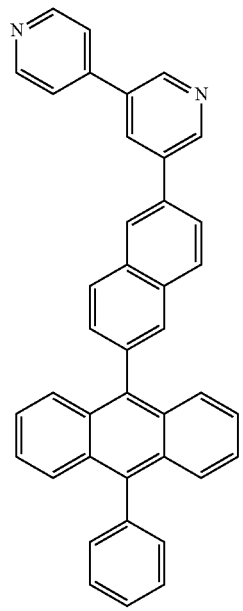
ET4
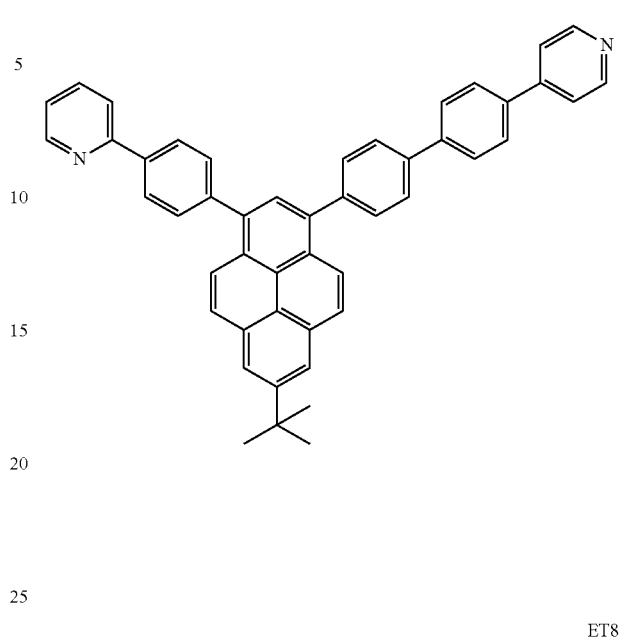
ET7
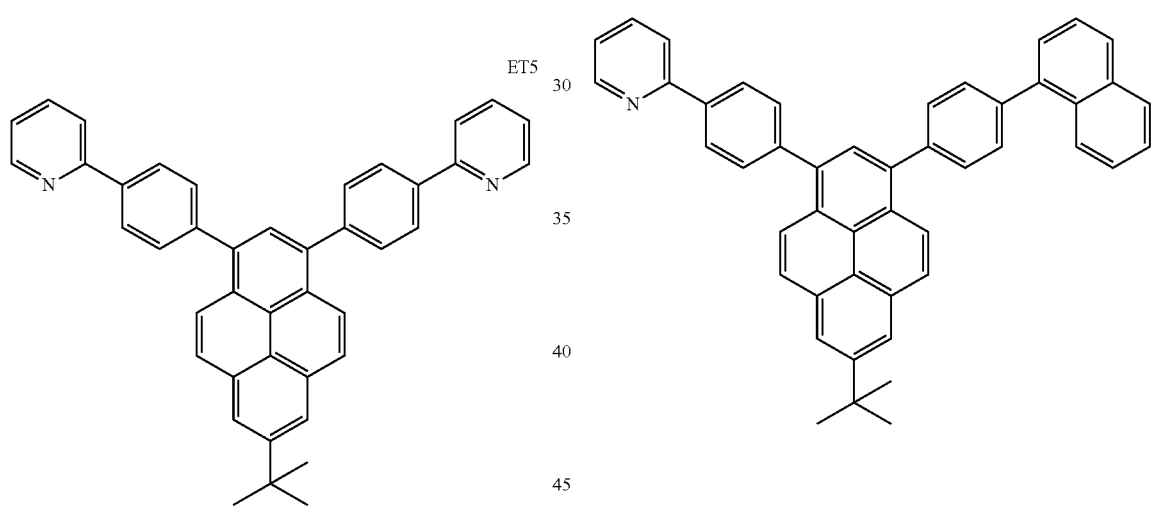
ET5
ET8
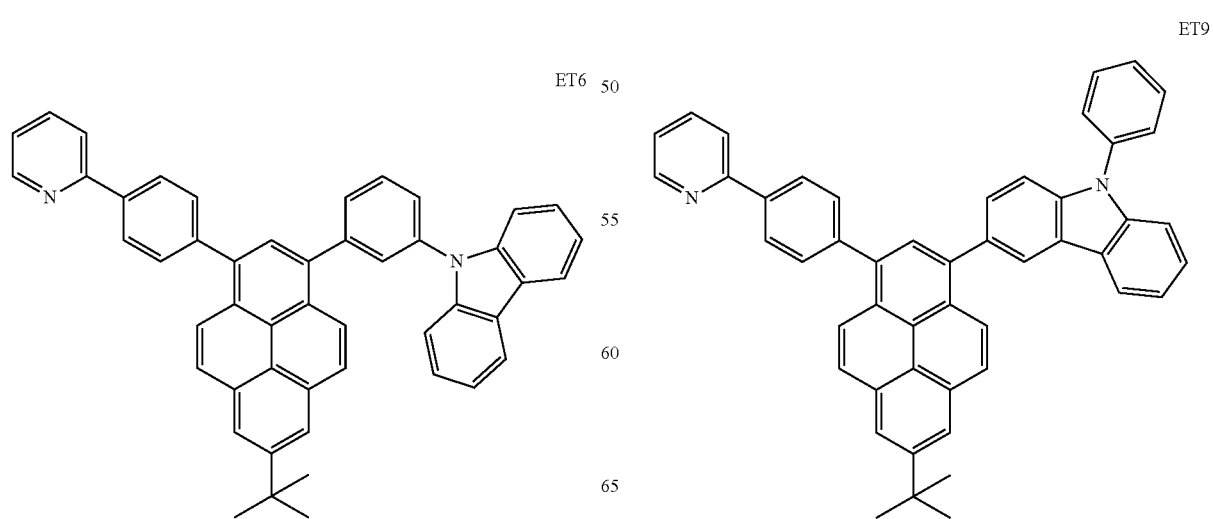
ET6
ET9

ET10
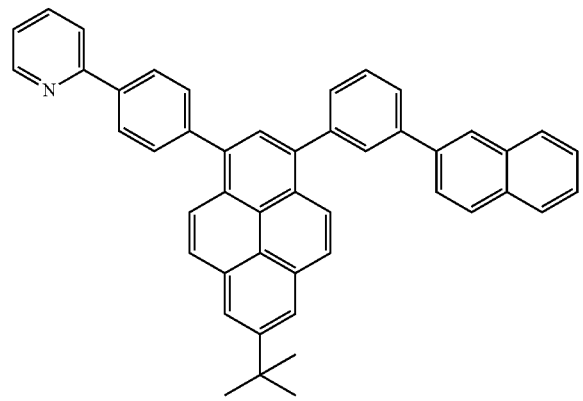
ET11
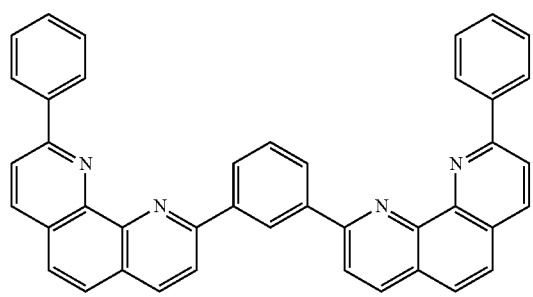
ET12
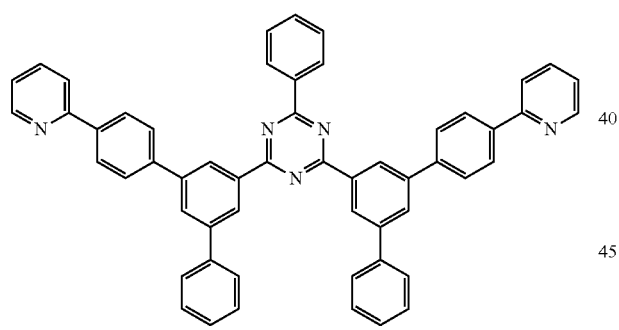
ET13
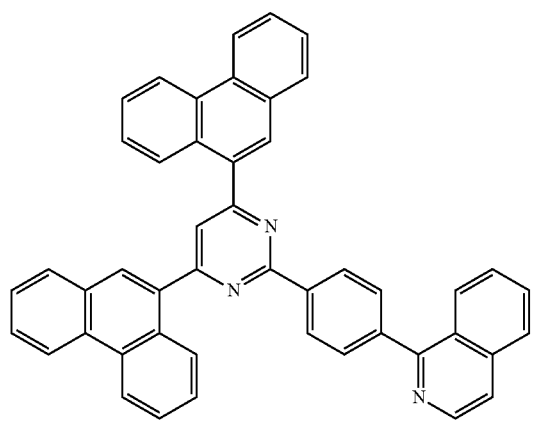
ET14
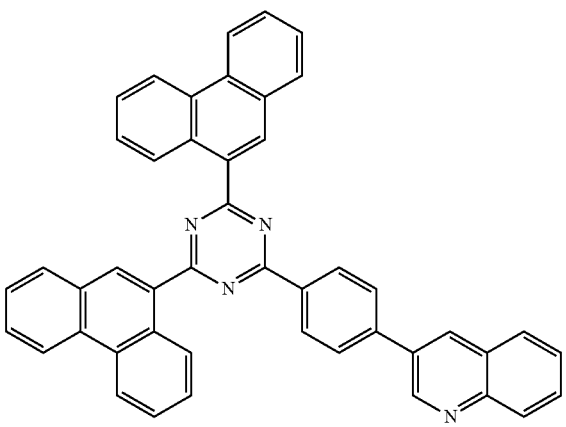
ET15
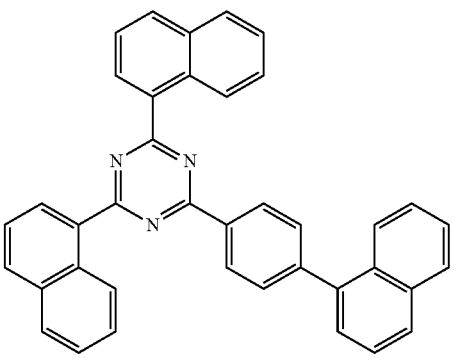
ET16
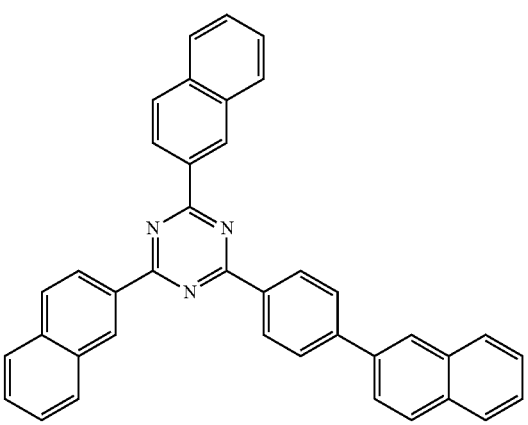

ET17
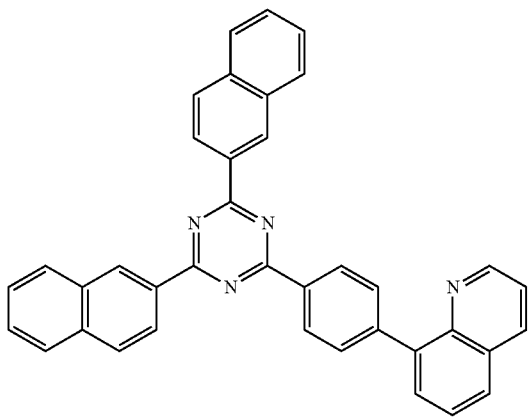
ET18
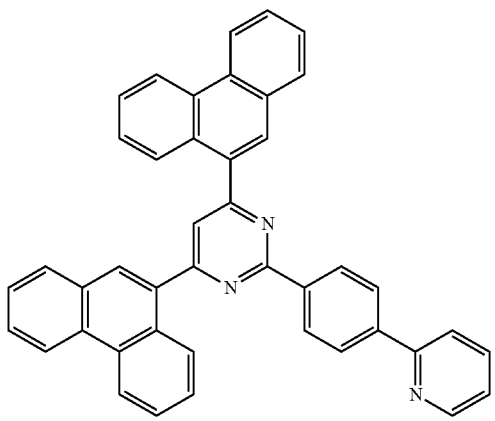
ET19
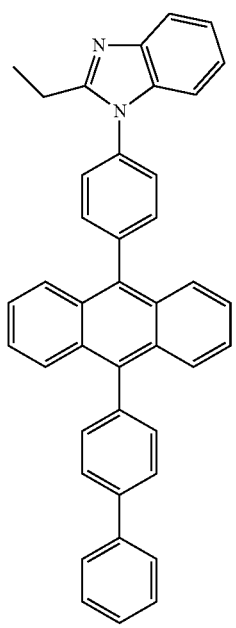
ET20
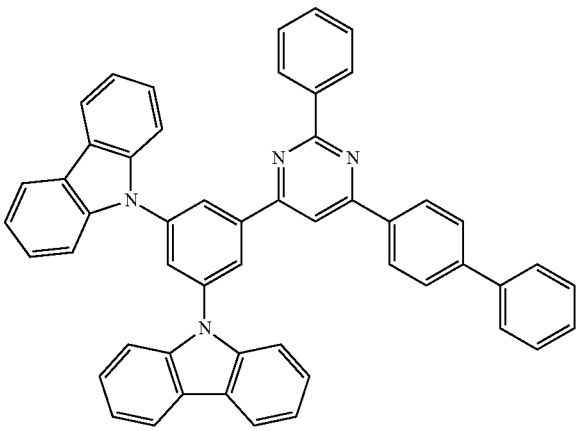
ET21
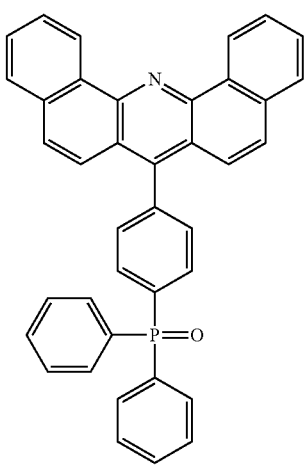
ET22
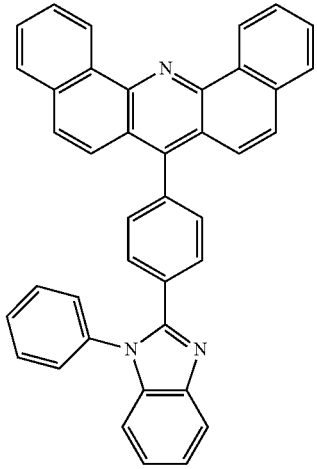

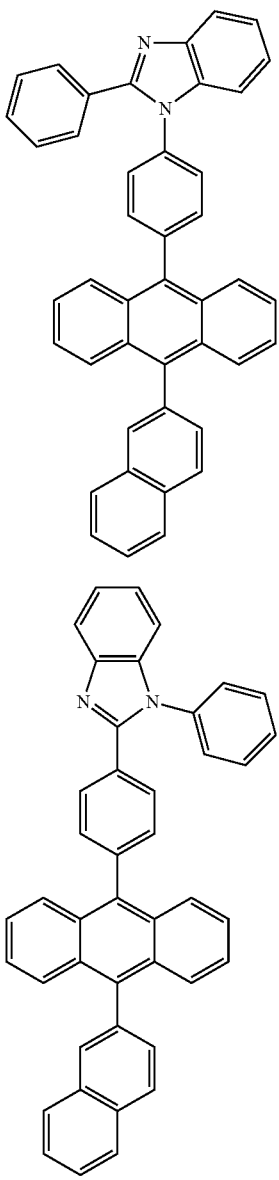

ET23

ET24

ET25

A thickness of the electron transport layer may be in a range of about 100 Å to about 1,000 Å, for example, about 150 Å to about 500 Å. While not wishing to be bound by theory, it is understood that when the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium 8-hydroxylquinolate, LiQ) or ET-D2.

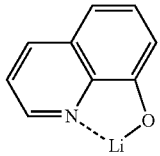

ET-D1

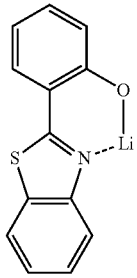

ET-D2

The electron transport region may include an electron injection layer (EIL) that promotes flow of electrons from the second electrode 19 thereinto.

The electron injection layer may include at least one selected from LiF, a NaCl, CsF, Li$_2$O, and BaO.

A thickness of the electron injection layer may be in a range of about 1 Å to about 100 Å, for example, about 3 Å to about 90 Å. While not wishing to be bound by theory, it is understood that when the thickness of the electron injection layer is within the range described above, the electron injection layer may have satisfactory electron injection characteristics without a substantial increase in driving voltage.

The second electrode 19 is disposed on the organic layer 15. The second electrode 19 may be a cathode. A material for forming the second electrode 19 may be selected from metal, an alloy, an electrically conductive compound, and a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as a material for forming the second electrode 19. In one or more embodiments, to manufacture a top-emission type light-emitting device, a transmissive electrode formed using ITO or IZO may be used as the second electrode 19.

Hereinbefore, the organic light-emitting device has been described with reference to the FIGURE, but embodiments of the present disclosure are not limited thereto.

The term "$C_1$-$C_{60}$ alkyl group" as used herein refers to a linear or branched saturated aliphatic hydrocarbon monovalent group having 1 to 60 carbon atoms, and non-limiting examples thereof include a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and non-limiting examples thereof include a methoxy group, an ethoxy group, and an iso-propyloxy group.

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom selected from N, O, P, Si and S as a ring-forming atom and 1 to 10 carbon atoms, and non-limiting examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, and S as a ring-forming atom, 1 to 10 carbon atoms, and at least one double bond in its ring. Examples of the $C_1$-$C_{10}$ heterocycloalkenyl group are a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and a $C_6$-$C_{60}$ arylene group as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a heterocyclic aromatic system that has at least one heteroatom selected from N, O, P, Si, and S as a ring-forming atom, and 1 to 60 carbon atoms. The term "$C_1$-$C_{60}$ heteroarylene group," as used herein refers to a divalent group having a heterocyclic aromatic system that has at least one heteroatom selected from N, O, P, Si, and S as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_6$-$C_{60}$ aryloxy group" as used herein indicates —$OA_{102}$ (wherein $A_{102}$ is the $C_6$-$C_{60}$ aryl group), and a $C_6$-$C_{60}$ arylthio group as used herein indicates —$SA_{103}$ (wherein $A_{103}$ is the $C_6$-$C_{60}$ aryl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom selected from N, O, P, Si, and S, other than carbon atoms, as a ring-forming atom, and no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The term "$C_5$-$C_{30}$ carbocyclic group" as used herein refers to a monocyclic group or a polycyclic group, and, according to its chemical structure, a monovalent, divalent, trivalent, tetravalent, pentavalent, or hexavalent group.

The term "$C_2$-$C_{30}$ heterocyclic group" as used herein refers to a saturated or unsaturated cyclic group having, as a ring-forming atom, at least one heteroatom selected from N, O, Si, P, and S other than 2 to 30 carbon atoms. The term "$C_2$-$C_{30}$ heterocyclic group" as used herein refers to a monocyclic group or a polycyclic group, and, according to its chemical structure, a monovalent, divalent, trivalent, tetravalent, pentavalent, or hexavalent group.

At least one substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, and —$P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, and —$P(=O)(Q_{28})(Q_{29})$; and —$N(Q_{31})(Q_{32})$, —$Si(Q_{33})(Q_{34})(Q_{35})$, —$B(Q_{36})(Q_{37})$, and —$P(=O)(Q_{38})(Q_{39})$, and $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

Hereinafter, a compound and an organic light-emitting device according to embodiments are described in detail with reference to Synthesis Example and Examples. However, the organic light-emitting device is not limited thereto. In Synthesis Examples below, the wording "B was used instead of A" used in describing Synthesis Examples refers to that an identical molar equivalent of B was used in place of A.

EXAMPLES

Synthesis Example 1: Synthesis of D1

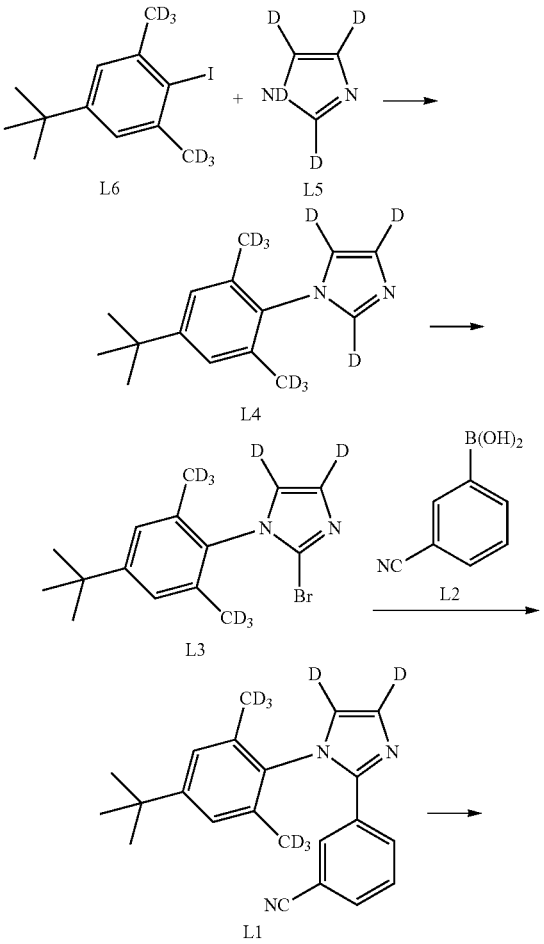

-continued

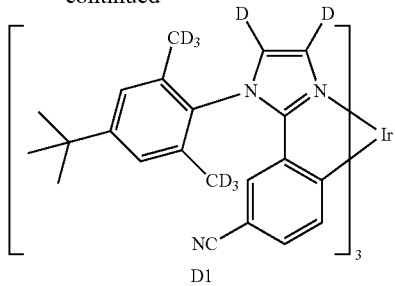

(1) Synthesis of Compound L4

Compound L6 (34.70 millimoles, mmol), Compound L5 (41.64 mmol), $K_2CO_3$ (173.51 mmol), CuI (1.74 mmol), 1,10-phenanthroline (3.47 mmol), and DMF (500 milliliters, mL) were added to a 1-L reaction container and refluxed for 12 hours in a nitrogen atmosphere. After the reaction was completed, the mixture was cooled to room temperature, and dichloromethane and distilled water were added thereto to extract the organic layer. The extracted organic layer was washed twice by using distilled water and dried by using $MgSO_4$, and a solvent was evaporated. The crude product obtained therefrom was purified by silica gel column chromatography (eluent: ethylacetate and n-hexane) to obtain Compound L4 (26.37 mmol). The obtained Compound L4 was identified by LC-MS.

LC-MS (m/z): 237.22 [M+1].

(2) Synthesis of Compound L3

Compound L4 (26.37 mmol) and tetrahydrofuran were added to a reaction container and cooled to a temperature of −78° C. in a nitrogen atmosphere. n-BuLi (2.5 molar (M) in n-hexane, 27.69 mmol) was slowly added thereto at a temperature of −78° C. and stirred. After stirring for 1 hour, $Br_2$ (52.74 mmol) was slowly added thereto at a temperature of −78° C. After 30 minutes, a cooling bath was removed, and the mixture was heated to room temperature and stirred for 6 hours. After the reaction was completed, dichloromethane and distilled water were added thereto to extract the organic layer. The extracted organic layer was washed twice by using distilled water and dried by using $MgSO_4$, and a solvent was evaporated. The crude product obtained therefrom was purified by silica gel column chromatography (eluent: ethylacetate and n-hexane) to obtain Compound L3 (18.72 mmol). The obtained Compound L3 was identified by LC-MS.

LC-MS (m/z): 314.12 [M+1].

(3) Synthesis of Compound L1

Compound L3 (18.72 mmol), Compound L2 (28.08 mmol), $Pd(PPh_3)_4$ (1.87 mmol), $K_2CO_3$ (210.63 mmol), and THF:distilled water (=2:1) were added to a reaction container and refluxed for 12 hours in a nitrogen atmosphere. After the reaction was completed, the mixture was cooled to room temperature, and dichloromethane and distilled water were added thereto to extract the organic layer. The extracted organic layer was washed twice by using distilled water and dried by using $MgSO_4$, and a solvent was evaporated. The crude product obtained therefrom was purified by silica gel column chromatography (eluent: ethylacetate and n-hexane) to obtain Compound L1 (16.47 mmol). The obtained Compound L1 was identified by LC-MS.

LC-MS (m/z): 337.24 [M+1].

(4) Synthesis of Compound D1

$Ir(acac)_3$ (3.29 mmol), Compound L1 (16.47 mmol), and glycerol were added to a reaction container and refluxed for 12 hours in a nitrogen atmosphere. After the reaction was completed, the mixture was cooled to room temperature, and dichloromethane and distilled water were added thereto to extract the organic layer. The extracted organic layer was washed twice by using distilled water and dried by using $MgSO_4$, and a solvent was evaporated. The crude product obtained therefrom was purified by silica gel column chromatography (eluent: dichloromethane and n-hexane) to obtain Compound D1 (0.49 mmol). The obtained Compound D1 was identified by MALDI-TOF.

MALDI-TOF (m/z): 529.19 [M]$^+$.

Evaluation Example 1

The LUMO energy level, HOMO energy level, $T_1$ energy level, and/or $S_1$ energy level of exciplex and each Compound of Combinations 1, 2, and A of Table 2 were evaluated according to methods of Table 1, and results thereof are shown in Table 3.

TABLE 1

| | |
|---|---|
| LUMO and HOMO energy level evaluation method | An evaluation is performed by using DFT method of Gaussian program (structurally optimized at a level of B3LYP, 6-31G(d, p)) |
| $T_1$ energy level evaluation method | A mixture of 2-MeTHF and each Compound (each Compound is dissolved in 3 mL of 2-MeTHF so that the concentration thereof is 10 micromolar, μM) is put into a quartz cell and put into cryostat (Oxford, DN) including liquid nitrogen (77 Kelvins), a phosphorescence spectrum is measured by using a light emission measurement equipment (PTI, Quanta Master 400), and a triplet energy level is calculated from a peak wavelength of the phosphorescence spectrum. |
| $S_1$ energy level evaluation method of exciplex | A maximum emission wavelength (nm) among emission peaks of a fluorescence spectrum measured at room temperature with respect to a 50-nanometer-thick thin film formed by co-depositing a first material and a second material at a weight ratio of 5:5 is converted in units of electron volts and evaluated. |

TABLE 2

| | First material (HT host) | Second material (ET host) | Light-emitting material (dopant) |
|---|---|---|---|
| Combination 1 | H19 | E1 | D1 |
| Combination 2 | H19 | E2 | D1 |
| Combination A | H19 | EA | D1 |

E1
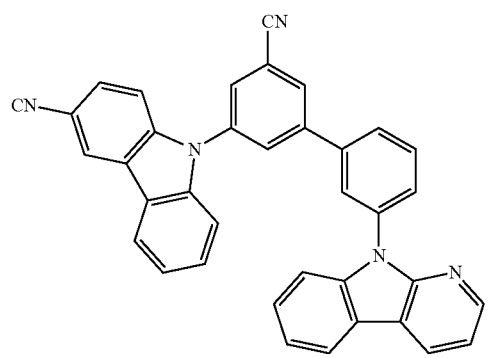
H19
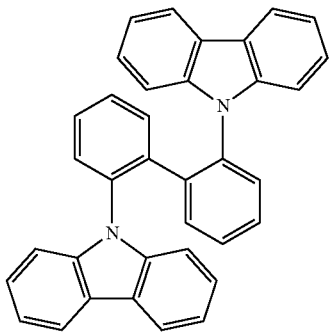
E2
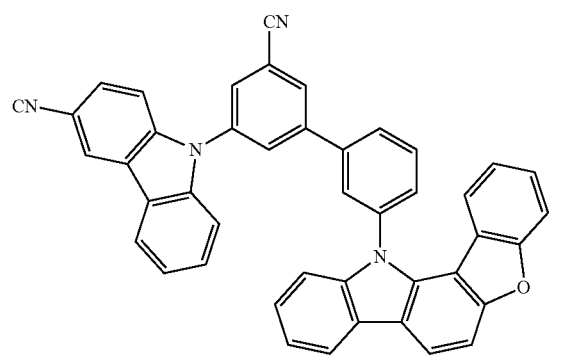
EA
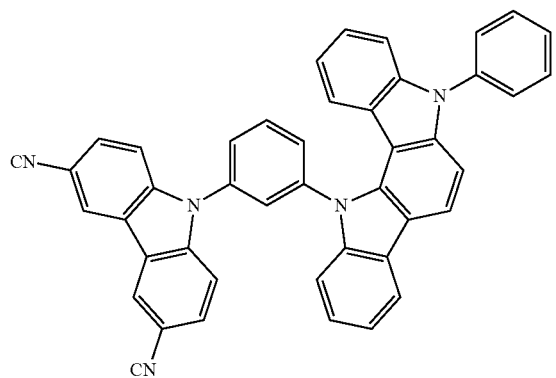
D1
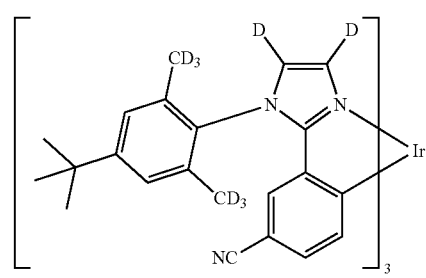
TABLE 3
|  | First material (HT host) | | | Second material (ET host) | | | Exciplex of first material and second material | | | Light-emitting material (dopant) |
| --- | --- | --- | --- | --- | --- | --- | --- | --- | --- | --- |
|  | HOMO (eV) | LUMO (eV) | $T_1$ (eV) | HOMO (eV) | LUMO (eV) | $T_1$ (eV) | HOMO (eV) | LUMO (eV) | $S_1$ (eV) | $T_1$ (eV) |
| Combination 1 | −5.42 | −1.07 | 3.00 | −5.94 | −1.99 | 2.92 | −5.42 | −1.99 | 2.92 | 2.69 |
| Combination 2 | −5.42 | −1.07 | 3.00 | −5.66 | −2.04 | 2.91 | −5.42 | −2.04 | 2.86 | 2.69 |
| Combination A | −5.42 | −1.07 | 3.00 | −5.35 | −1.66 | 2.89 | −5.42 | −1.66 | 3.14 | 2.69 |

TABLE 4

|  | Absolute value of difference (eV) between triplet energy (eV) of first material (HT host) and singlet energy (eV) of exciplex | Absolute value of difference between triplet energy (eV) of second material (ET host) and singlet energy (eV) of exciplex |
|---|---|---|
| Combination 1 | 0.08 | 0 |
| Combination 2 | 0.14 | 0.05 |
| Combination A | 0.14 | 0.25 |

Referring to Table 4, it is confirmed that regarding both Combinations 1 and 2, at least one of the absolute value of the difference between the triplet energy (eV) of the first material and the singlet energy (eV) of the exciplex and the absolute value of the difference between the triplet energy (eV) of the second material and the singlet energy (eV) of the exciplex is less than or equal to 0.1 eV, while regarding Combination A, both the absolute value of the difference between the triplet energy (eV) of the first material and the singlet energy (eV) of the exciplex and the absolute value of the difference between the triplet energy (eV) of the second material and the singlet energy (eV) of the exciplex exceeds 0.1 eV.

Evaluation Example 2: Evaluation of PLQY 50-nm-thick thin films were manufactured by co-depositing the first material and the second material of Combinations 1, 2, and A shown in Table 2 at a weight ratio of 5:5.

The PLQYs in the thin films were evaluated by using a Hamamatsu Photonics absolute PL quantum yield measurement system including a xenon light source, a monochromator, a photonic multichannel analyzer, and an integrating sphere and employing PLQY measurement software (Hamamatsu Photonics, Ltd., Shizuoka, Japan), and the PLQY in film of the exciplex formed from the first material and the second material of each of Combinations 1, 2, and A was evaluated. Results thereof are shown in Table 5.

TABLE 5

|  | First material (HT host) | Second material (ET host) | PLQY of exciplex formed from first material and second material |
|---|---|---|---|
| Combination 1 | H19 | E1 | 0.113 |
| Combination 2 | H19 | E2 | 0.09 |
| Combination A | H19 | EA | 0.196 |

Referring to Table 5, the exciplex formed from the first material and the second material of Combinations 1 and 2 has low PLQY, as compared with the exciplex formed from the first material and the second material of Combination A. Therefore, it is expected that the exciplex formed from the first material and the second material of Combinations 1 and 2 can easily transfer energy to the transition metal-containing phosphorescent material (dopant) that emits blue light having a maximum emission wavelength in a range of 420 nm to 480 nm.

Example 1

A glass substrate, on which a 1,500-thick Å ITO electrode (first electrode, anode) was formed, was cleaned by ultrasonic waves using distilled water. After distilled water cleaning was completed, the glass substrate was sequentially sonicated with iso-propyl alcohol, acetone, and methanol, dried, and then transferred to a plasma cleaner. Then, the glass substrate was cleaned by using oxygen plasma for 5 minutes. Then, the glass substrate was provided to a vacuum deposition apparatus.

Compound HT3 and HT-D2 (the concentration of HT-D2 was 3 weight %) were co-deposited on the anode to form a hole injection layer having a thickness of 100 Å, Compound HT3 was deposited on the hole injection layer to form a hole transport layer having a thickness of 1,350 Å, and H19 was deposited on the hole transport layer to form an electron blocking layer having a thickness of 100 Å, thereby forming a hole transport region.

H19 (a first material), E1 (a second material), and D1 (a light-emitting material) were co-deposited on the hole transport region, so that i) an amount of the light-emitting material was 10 percent by weight (weight %) based on 100 weight % of the emission layer and ii) a weight ratio of the first material to the second material was 5:5, thereby forming an emission layer having a thickness of 400 Å.

E1 was vacuum-deposited on the emission layer to form a hole blocking layer having a thickness of 100 Å, Compound ET3 and LiQ were co-deposited on the hole blocking layer at a weight ratio of 5:5 to form an electron transport layer having a thickness of 300 Å, LiQ was deposited on the electron transport layer to form an electron injection layer having a thickness of 10 Å, and Al was deposited on the electron injection layer to a thickness of 1,000 Å as a cathode, thereby completing the manufacture of an organic light-emitting device.

HT3

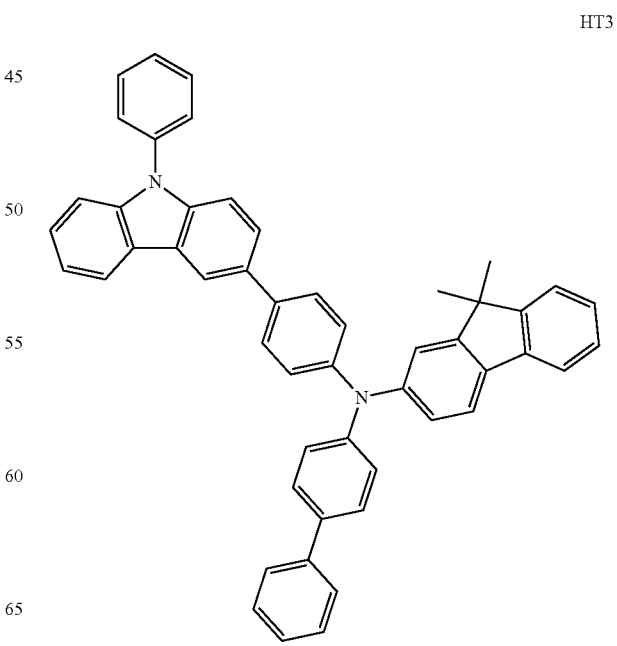

HT-D2 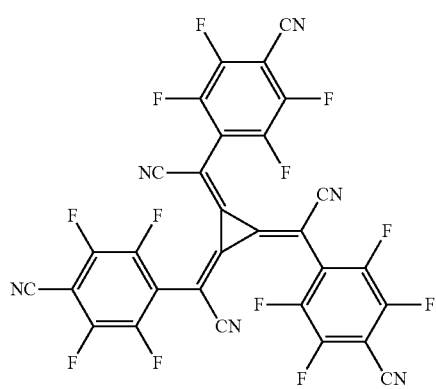

ET3 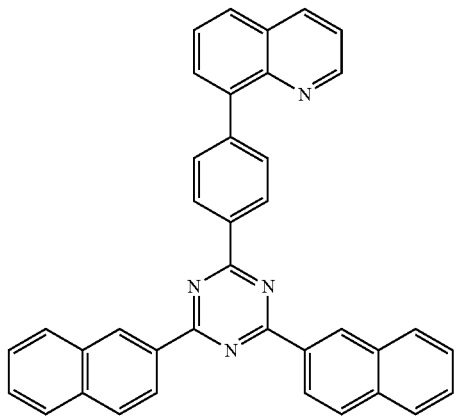

Example 2 and Comparative Example A

Organic light-emitting devices were manufactured in the same manner as in Example 1, except that Compounds shown in Table 6 were each used as a second material in forming an emission layer.

Evaluation Example 3: Evaluation of Characteristics of Organic Light-Emitting Devices The maximum emission wavelength (the peak emission wavelength) of EL spectrum, the maximum external quantum efficiency and lifespan ($T_{95}$) of the organic light-emitting devices manufactured according to Examples 1 and 2 and Comparative Example A were evaluated, and results thereof are shown in Table 6. The lifespan ($T_{95}$) indicates an amount of time (hours, hr) that lapsed when luminance was 95% of initial luminance (100%) (the EL spectrum, the external quantum efficiency and the luminance was measured by using a current-voltmeter (Keithley 2400) and a luminance meter (Minolta Cs-1000A)). The lifespan ($T_{95}$) was indicated by the relative value of data of Comparative Example A.

H19 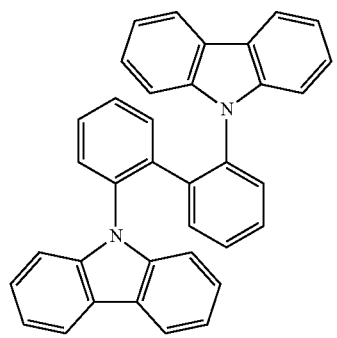

TABLE 6

| | Emission layer | | | maximum emission wavelength of EL spectrum (nm) | Maximum external quantum efficiency (%) | Lifespan ($T_{95}$) (at 1,000 cd/m$^2$) (%) |
|---|---|---|---|---|---|---|
| | First material | Second material | Light-emitting material | | | |
| Example 1 | H19 | E1 | D1 | 462 | 26 | 730 |
| Example 2 | H19 | E2 | D1 | 462 | 23 | 800 |
| Comparative Example A | H19 | EA | D1 | 462 | 20 | 100 |

E1
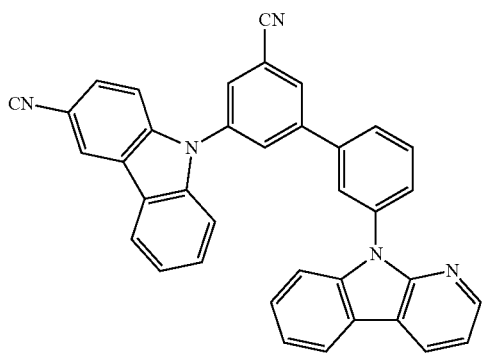

E2
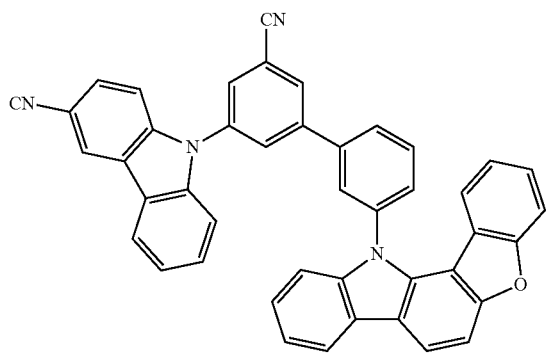

EA
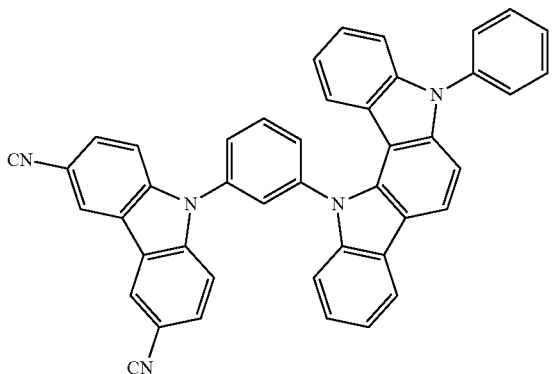

H19
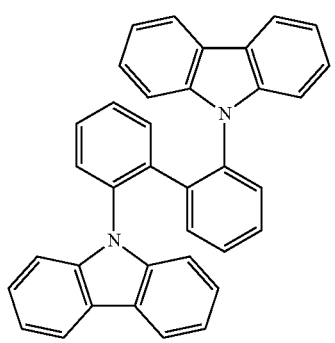

D1
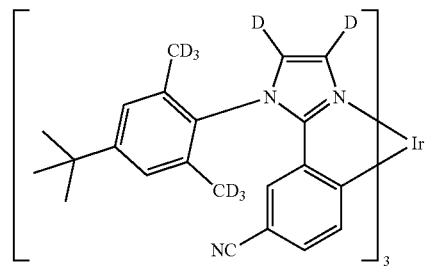

Referring to Table 6, it is confirmed that the organic light-emitting device of Examples 1 and 2 have improved external quantum efficiency and have remarkably improved lifespan, as compared with the organic light-emitting device of Comparative Example A.

Since the organic light-emitting device includes the first material, the second material, and the light-emitting material satisfying certain conditions, the organic light-emitting device may have a high external quantum efficiency and a long lifespan.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the FIGURES, it will be understood by those of ordinary skill in the art that various changes in form and details may be made therein without departing from the spirit and scope of the present description as defined by the following claims.

What is claimed is:
1. An organic light-emitting device comprising:
    a first electrode;
    a second electrode facing the first electrode; and
    an emission layer disposed between the first electrode and the second electrode,
    wherein
    the emission layer comprises a first material, a second material, and a light-emitting material,
    the light-emitting material comprises a transition metal-containing phosphorescent material that emits blue light having a maximum emission wavelength in a range of about 420 nanometers to about 480 nanometers,
    the emission layer emits blue phosphorescence generated when an exciton of the transition metal-containing phosphorescent material transits from a triplet excited state to a ground state,
    the first material and the second material are different from each other,
    the first material and the second material form an exciplex,
    at least one of an absolute value of a difference between triplet energy (expressed in electron volts) of the first material and singlet energy (expressed in electron volts) of the exciplex and an absolute value of a difference between triplet energy (expressed in electron volts) of the second material and the singlet energy (expressed in electron volts) of the exciplex is about 0.1 electron volts or less, the triplet energy of the first material is calculated from a peak wavelength of a phosphorescence spectrum measured at 77 Kelvins with respect to a mixture of the first material and 2-MeTHF, the triplet energy of the second material is calculated from a peak wavelength of a phosphorescence spectrum measured at 77 Kelvins with respect to a mixture of the second material and 2-MeTHF, and the singlet energy of the exciplex is calculated from a peak wavelength of a fluorescence spectrum measured at room temperature with respect to a 50-nanometer-thick thin film formed by co-depositing the first material and the second material at a weight ratio of 5:5, wherein the second material comprises at least one selected from a compound represented by Formula E-1(1), a compound represented by Formula E-1(2), and a compound represented by Formula E-1(3):

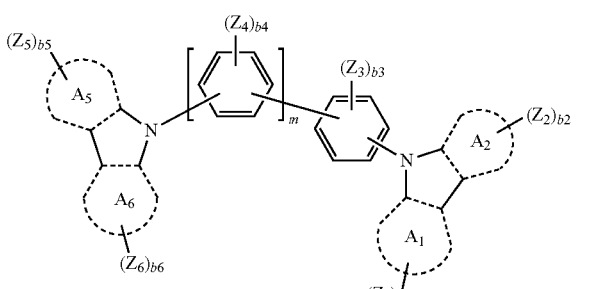

E-1(1)

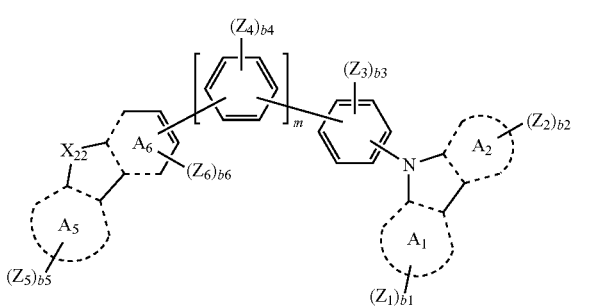

E-1(2)

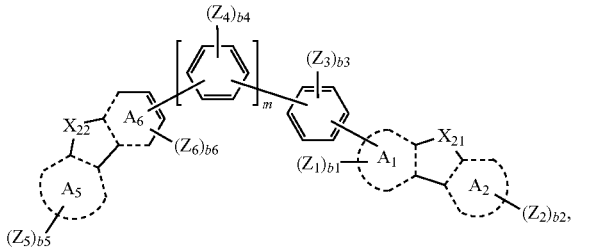

E-1(3)

wherein, in Formulae E-1(1) to E-1(3), rings $A_1$, $A_2$, $A_5$, and $A_6$ are each independently selected from a benzene group, a naphthalene group, an anthracene group, a phenanthrene group, a triphenylene group, a pyrene group, a chyrsene group, a cyclopentadiene group, a thiophene group, a furan group, an indole group, a benzoborole group, a benzophosphole group, and indene group, a benzosilole group, a benzogermole group, a benzothiophene group, a benzoselenophene group, a benzofuran group, a carbazole group, a dibenzogermole group, a dibenzothiophene group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzoselenophene group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, and a phenanthroline group, $Z_1$ to $Z_6$ are each independently;

hydrogen, deuterium, or a cyano group (CN); or a $C_1$-$C_{20}$ alkyl group, a phenyl group, a biphenyl group, a terphenyl group, a dibenzofuranyl group, or a dibenzothiophenyl group, each unsubstituted or substituted with at least one selected from deuterium, a cyano group, a $C_1$-$C_{20}$ alkyl group, a phenyl group, and a biphenyl group, b1 to b6 are each independently 1, 2, or 3, at least one of groups $Z_1$ in the number of b1, groups $Z_2$ in the number of b2, groups $Z_3$ in the number of b3, groups $Z_4$ in the number of b4, groups $Z_5$ in the number of b5, and groups $Z_6$ in the number of b6 is a cyano group, $X_{21}$ and $X_{22}$ are each independently O or S, and m is 0 or 1, a group represented by

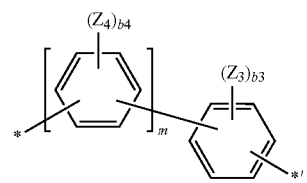

in Formulae E-1(1) to E-1(3) is one of groups represented by Formulae PO1 to PO25, PM1 to PM25, PP1 to PP18, MO1 to MO37, MM1 to MM37, MP1 to MP25, OO1 to OO37, OM1 to OM37, OP1 to OP25, O1 to O16, M1 to M16, and P1 to P9;

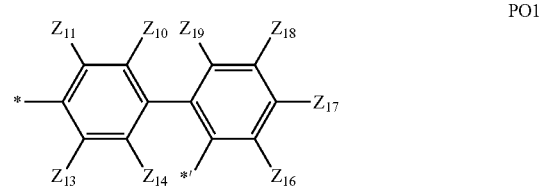

PO1

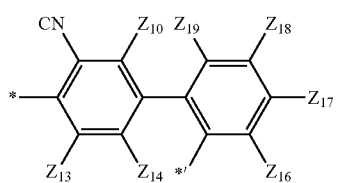 PO2
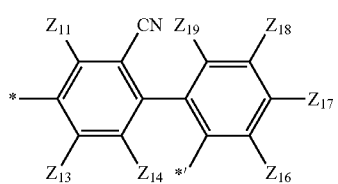 PO3
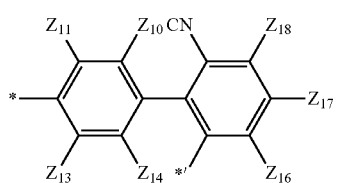 PO4
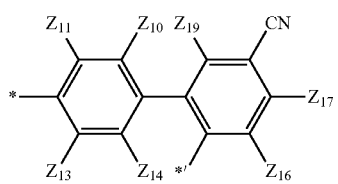 PO5
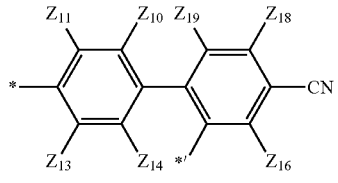 PO6
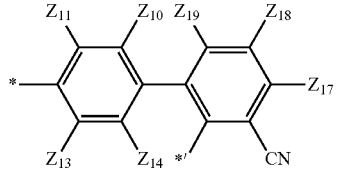 PO7
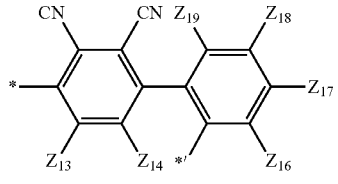 PO8
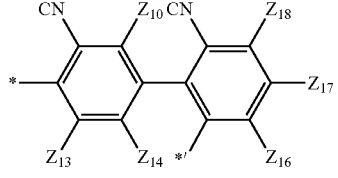 PO9
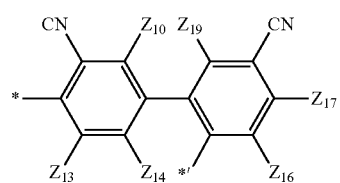 PO10
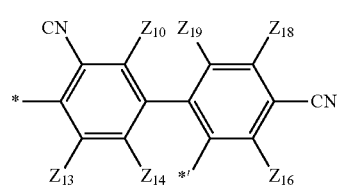 PO11
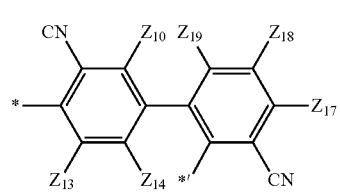 PO12
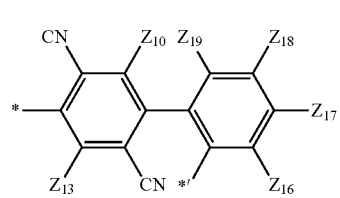 PO13
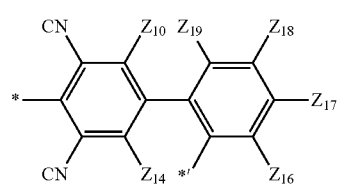 PO14
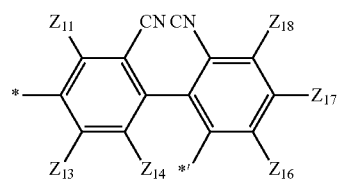 PO15
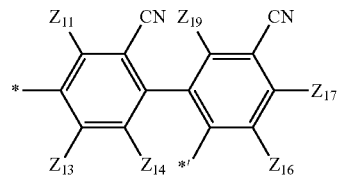 PO16
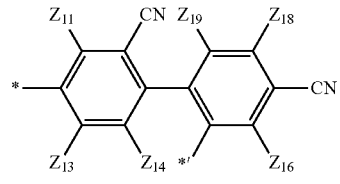 PO17

121
-continued
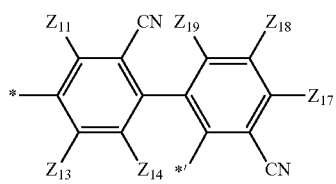
PO18
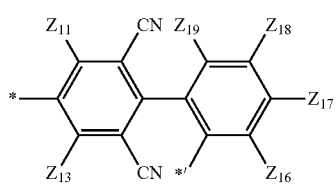
PO19
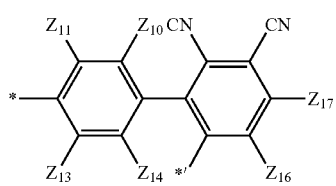
PO20
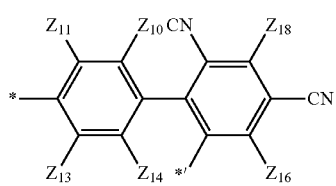
PO21
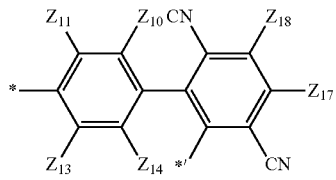
PO22
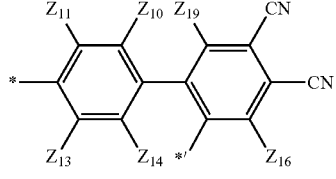
PO23
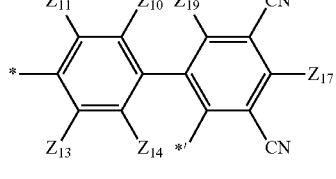
PO24
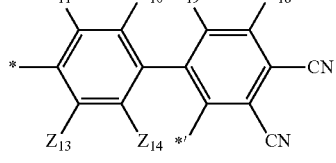
PO25
122
-continued
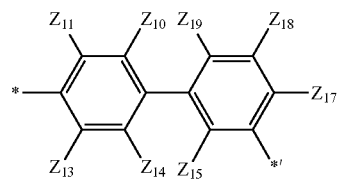
PM1
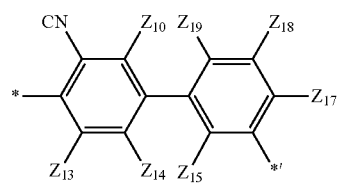
PM2
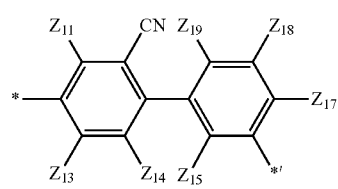
PM3
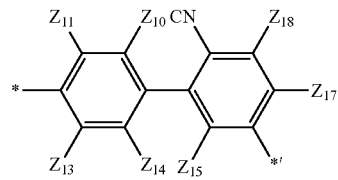
PM4
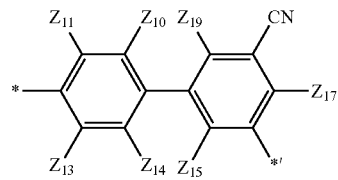
PM5
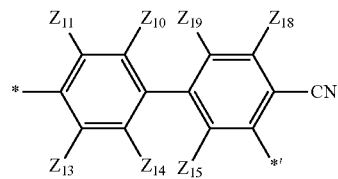
PM6
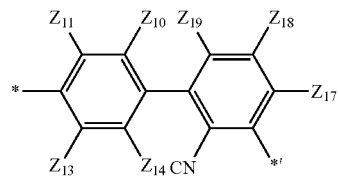
PM7
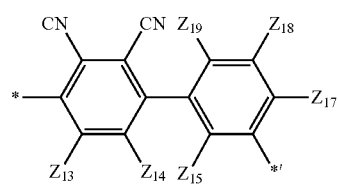
PM8

123
-continued
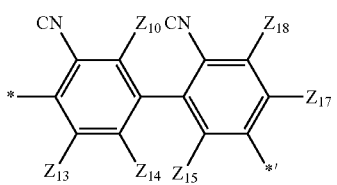
PM9
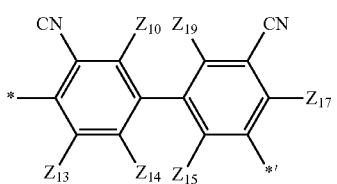
PM10
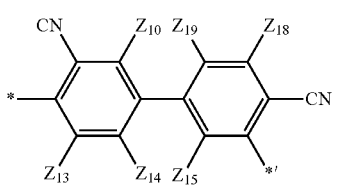
PM11
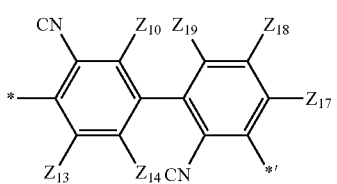
PM12
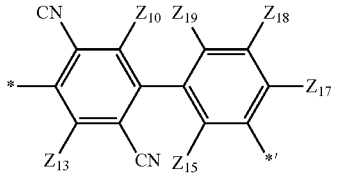
PM13
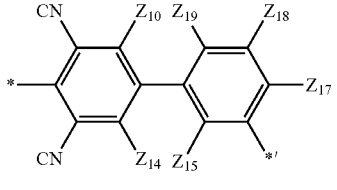
PM14
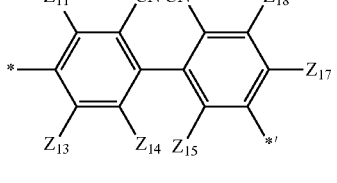
PM15
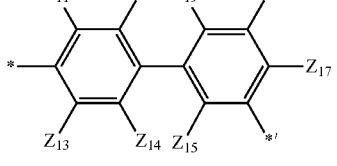
PM16
124
-continued
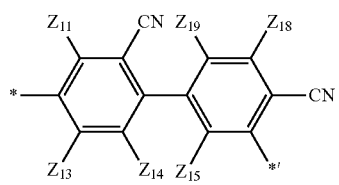
PM17
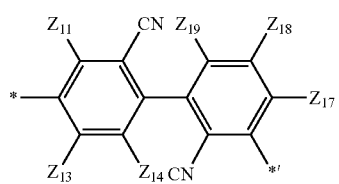
PM18
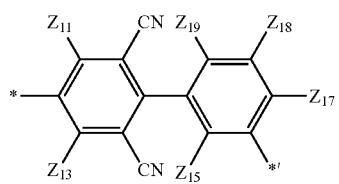
PM19
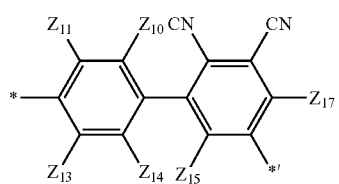
PM20
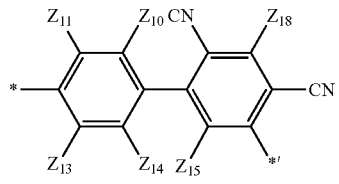
PM21
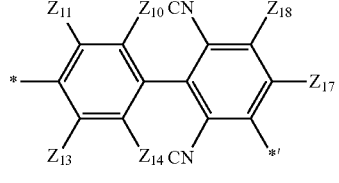
PM22
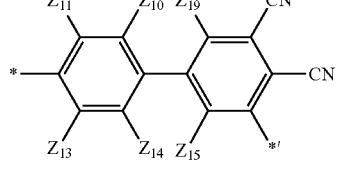
PM23
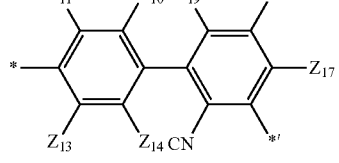
PM24

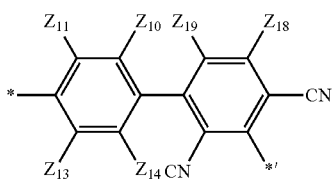 PM25
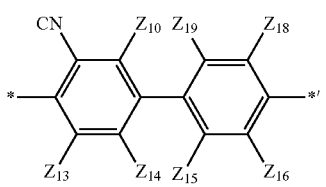 PP1
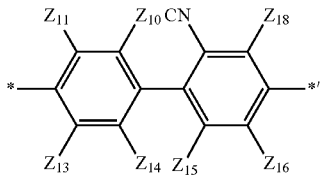 PP2
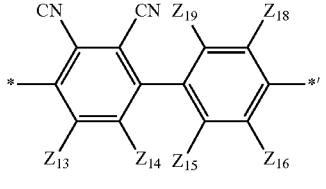 PP3
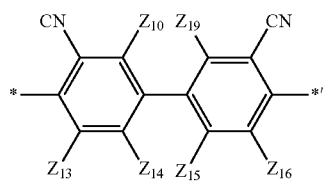 PP8
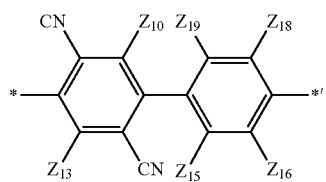 PP9
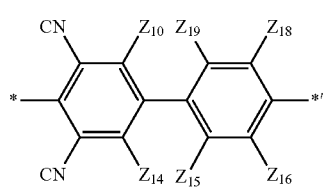 PP10
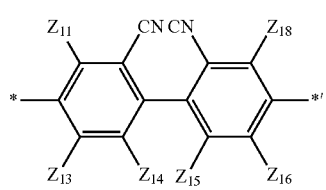 PP11
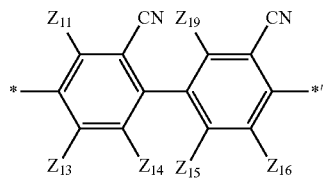 PP12
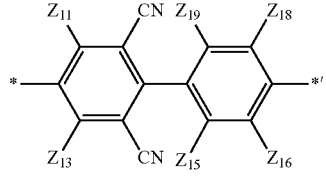 PP13
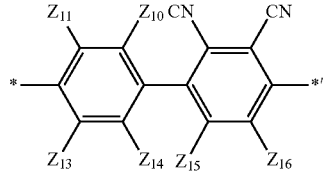 PP14
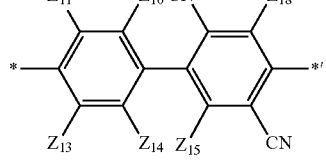 PP15

PP16 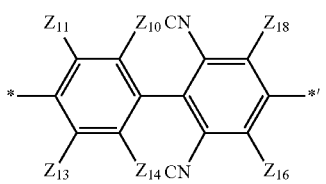
PP17 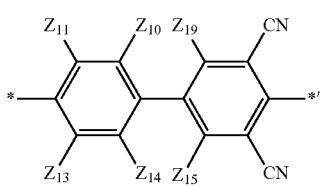
PP18 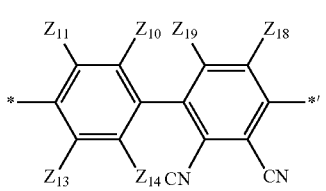
MO1 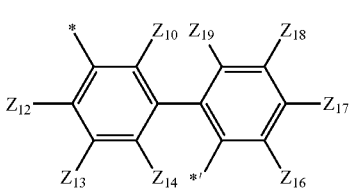
MO2 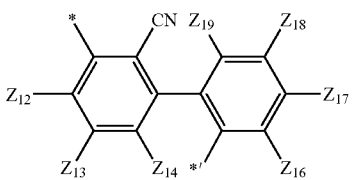
MO3 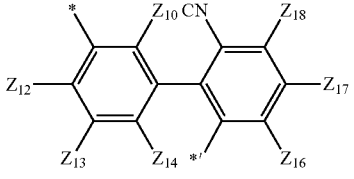
MO4 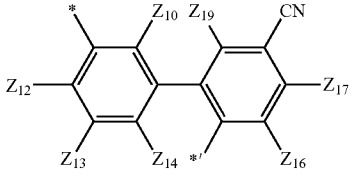
MO5 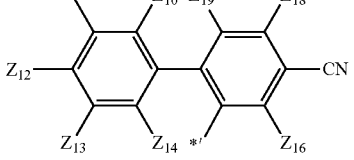
MO6 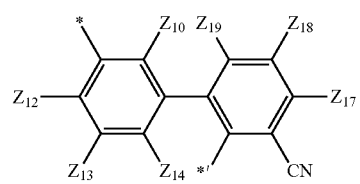
MO7 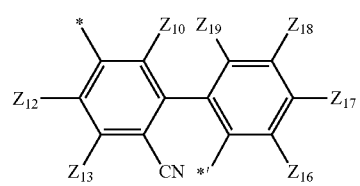
MO8 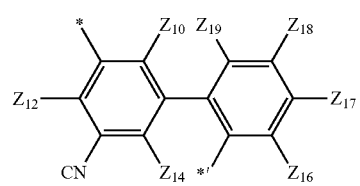
MO9 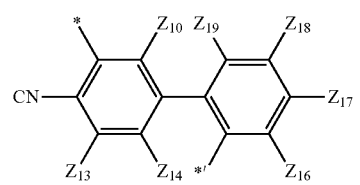
MO10 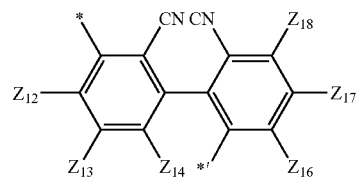
MO11 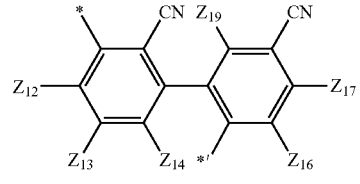
MO12 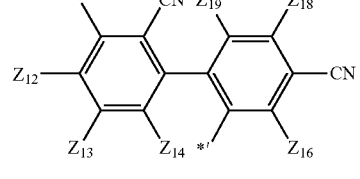
MO13 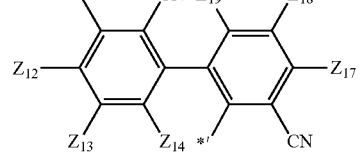

-continued
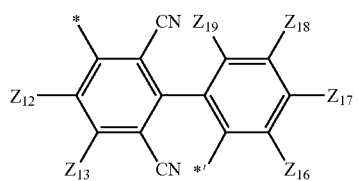 MO14
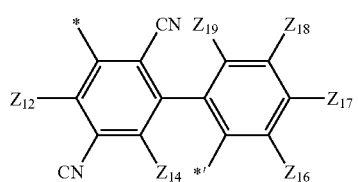 MO15
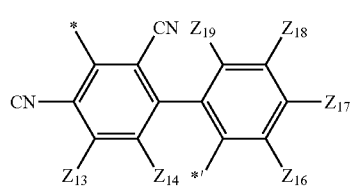 MO16
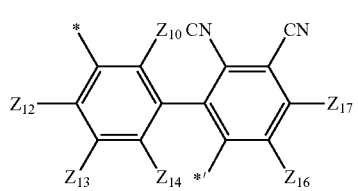 MO17
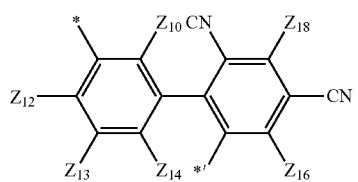 MO18
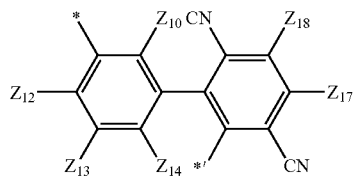 MO19
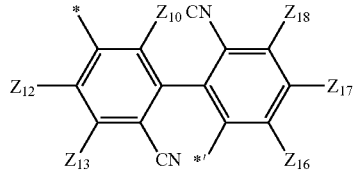 MO20
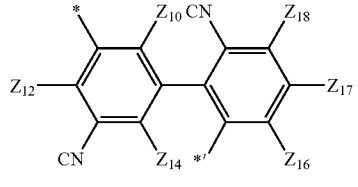 MO21
-continued
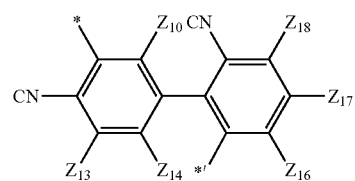 MO22
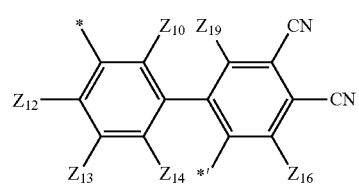 MO23
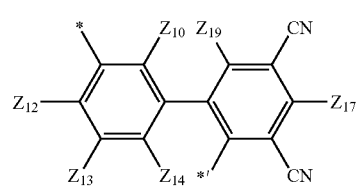 MO24
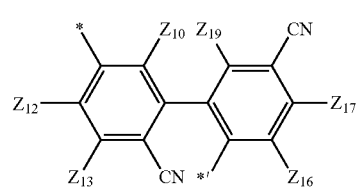 MO25
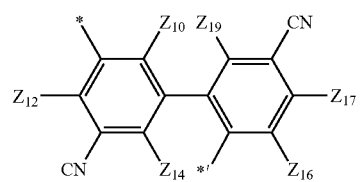 MO26
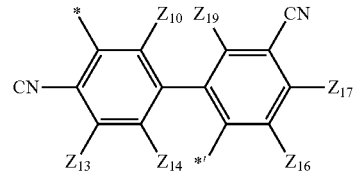 MO27
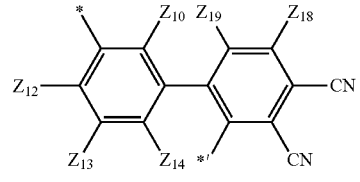 MO28
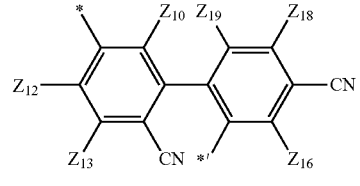 MO29

MO30
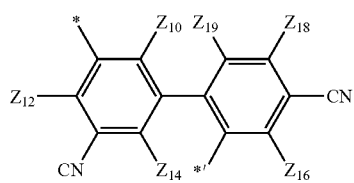
MO31
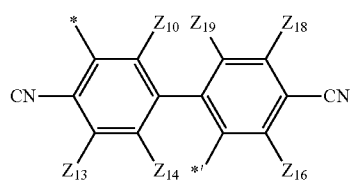
MO32
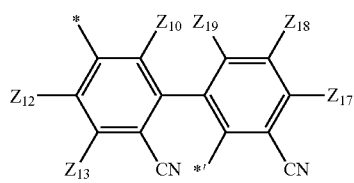
MO33
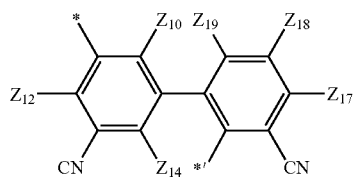
MO34
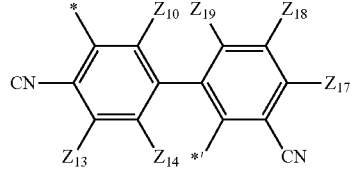
MO35
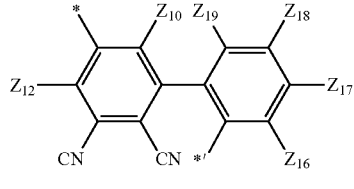
MO36
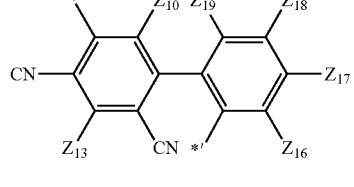
MO37
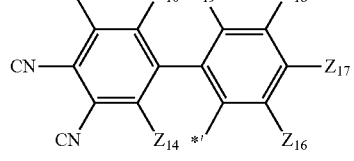
MM1
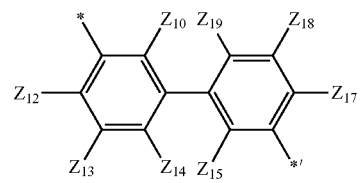
MM2
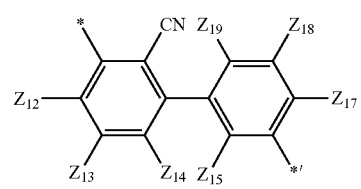
MM3
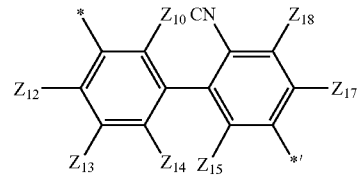
MM4
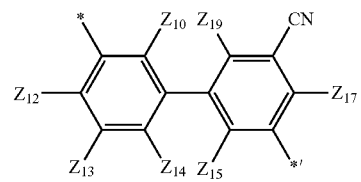
MM5
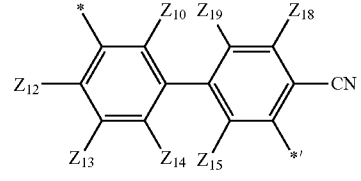
MM6
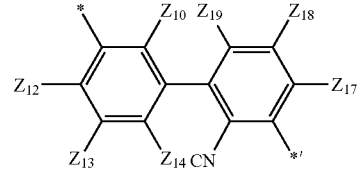
MM7
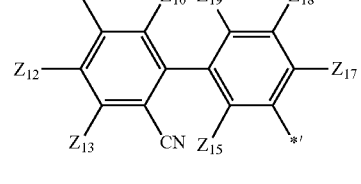
MM8
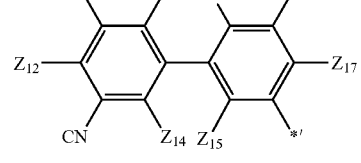

-continued
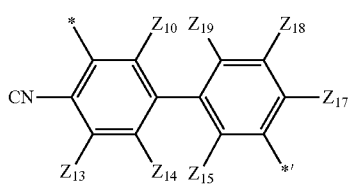 MM9
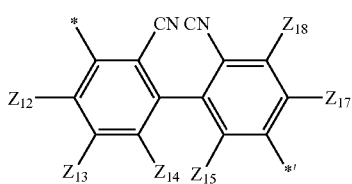 MM10
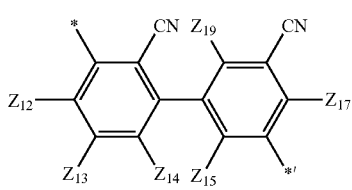 MM11
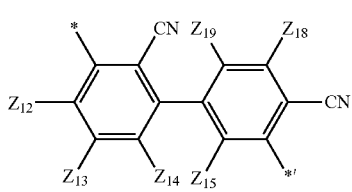 MM12
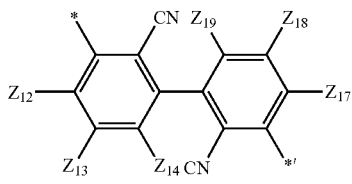 MM13
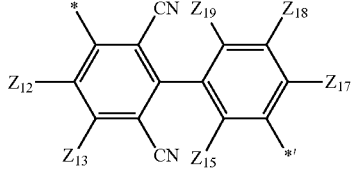 MM14
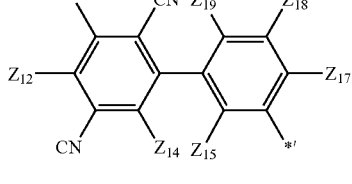 MM15
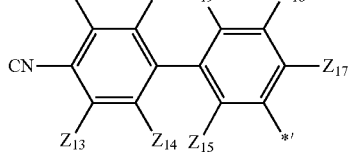 MM16
-continued
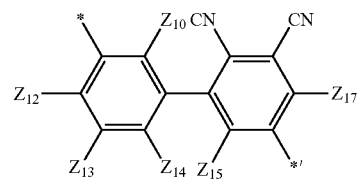 MM17
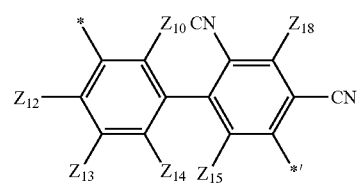 MM18
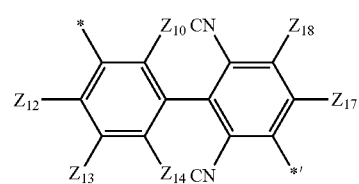 MM19
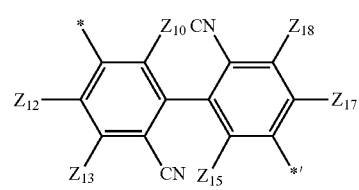 MM20
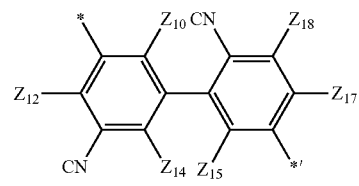 MM21
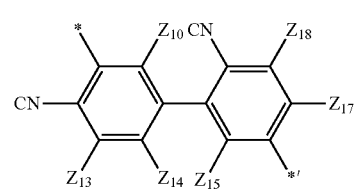 MM22
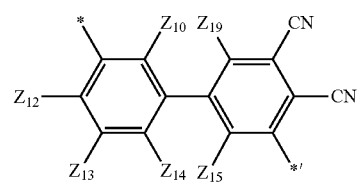 MM23
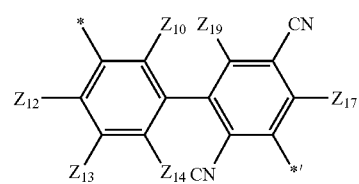 MM24

MM25 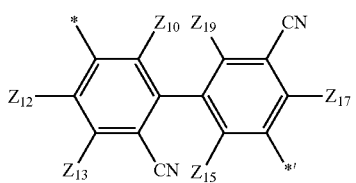
MM26 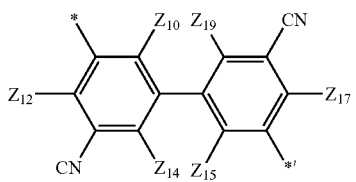
MM27 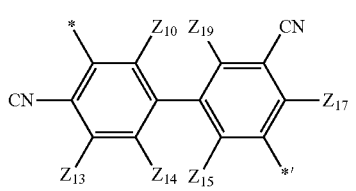
MM28 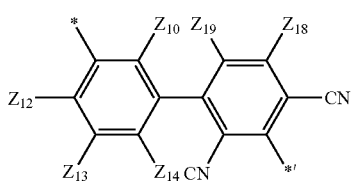
MM29 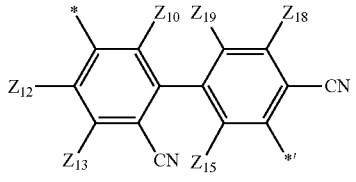
MM30 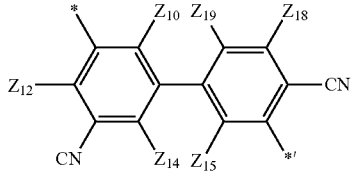
MM31 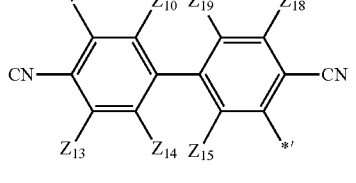
MM32 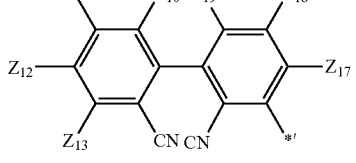
MM33 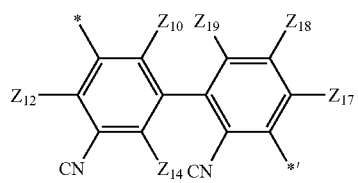
MM34 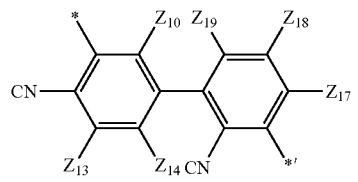
MM35 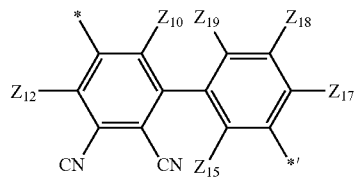
MM36 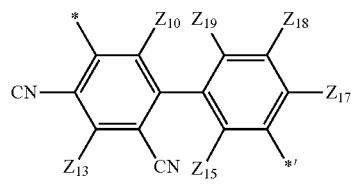
MM37 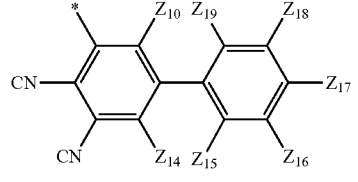
MP1 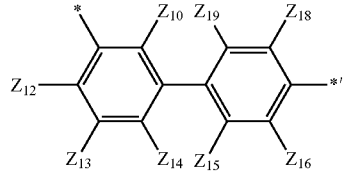
MP2 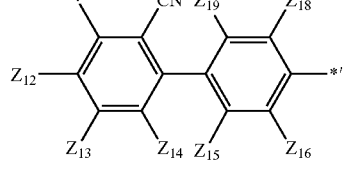
MP3 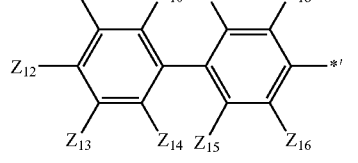

MP4 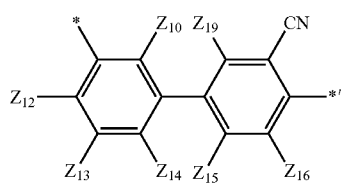
MP5 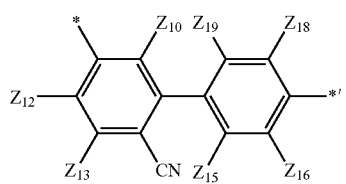
MP6 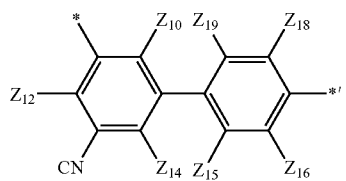
MP7 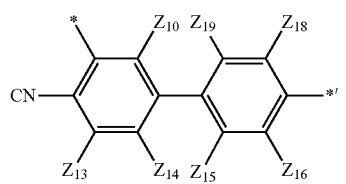
MP8 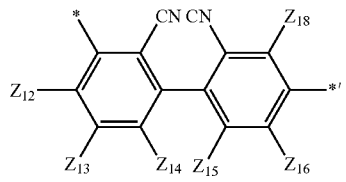
MP9 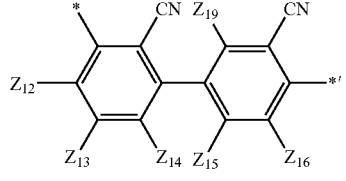
MP10 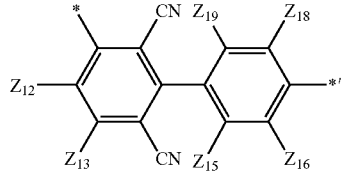
MP11 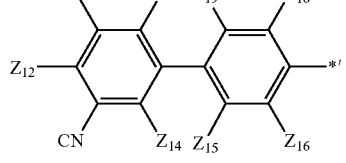
MP12 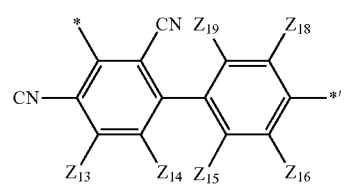
MP13 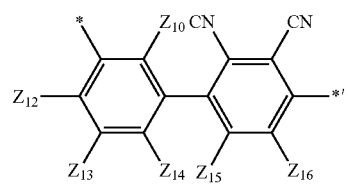
MP14 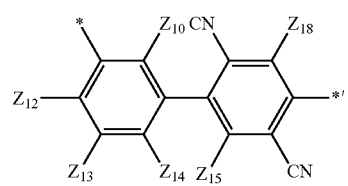
MP15 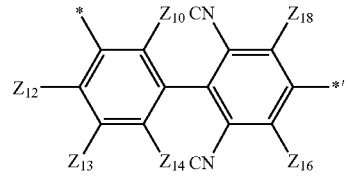
MP16 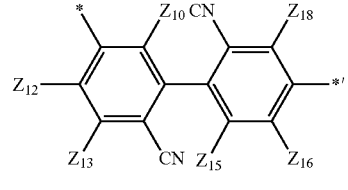
MP17 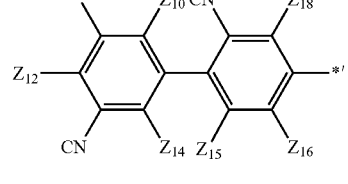
MP18 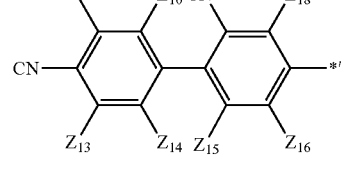
MP19 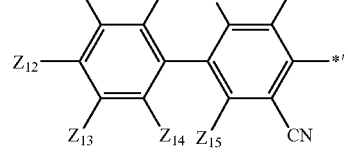

| | | | |
|---|---|---|---|
| 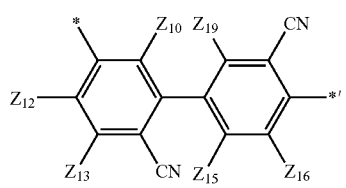 | MP20 | 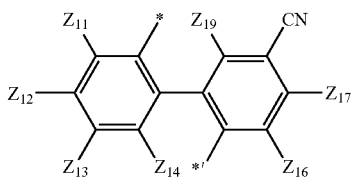 | OO3 |
| 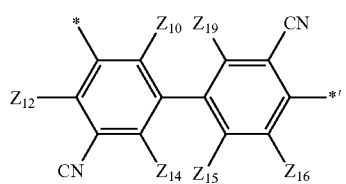 | MP21 | 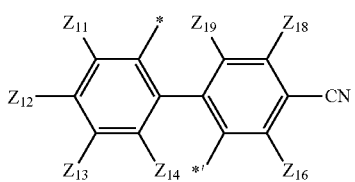 | OO4 |
| 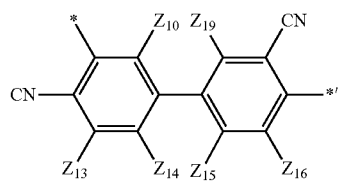 | MP22 | 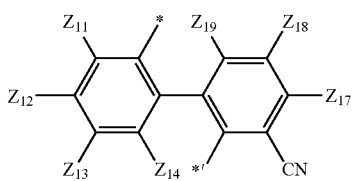 | OO5 |
| 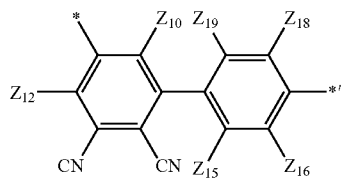 | MP23 | 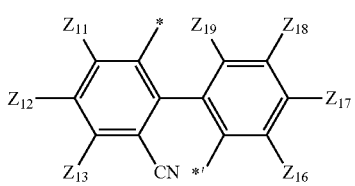 | OO6 |
| 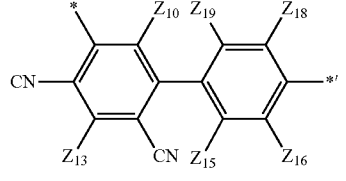 | MP24 | 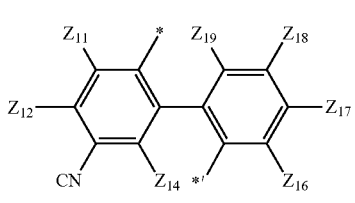 | OO7 |
| 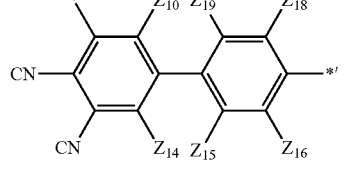 | MP25 | 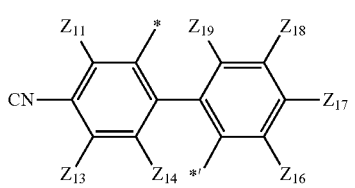 | OO8 |
| 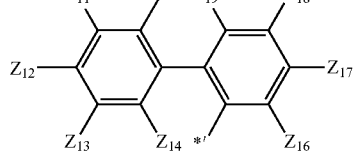 | OO1 | 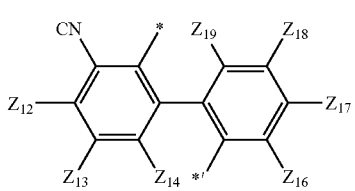 | OO9 |
| 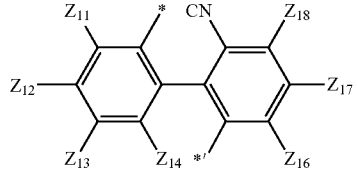 | OO2 | 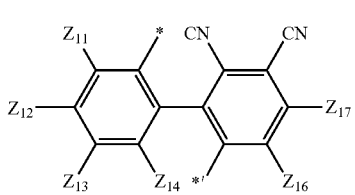 | OO10 |

-continued
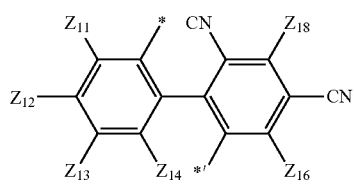 OO11
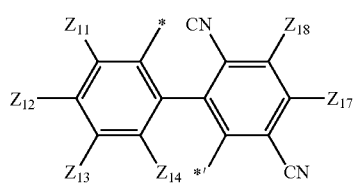 OO12
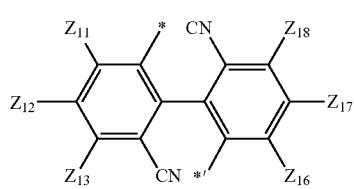 OO13
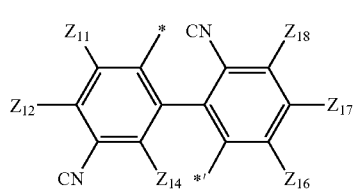 OO14
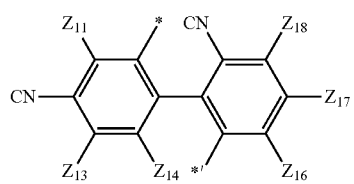 OO15
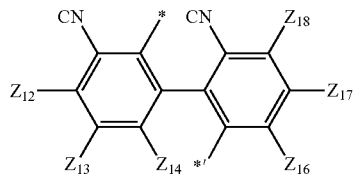 OO16
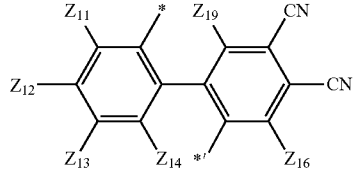 OO17
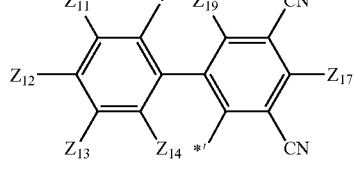 OO18
-continued
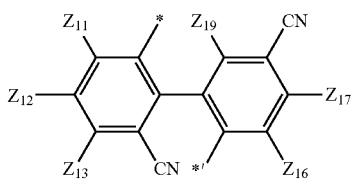 OO19
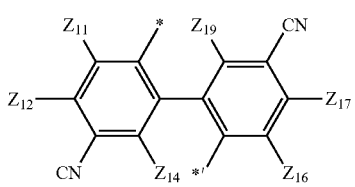 OO20
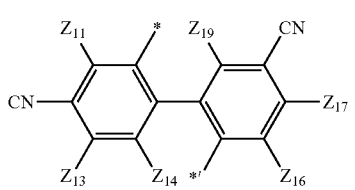 OO21
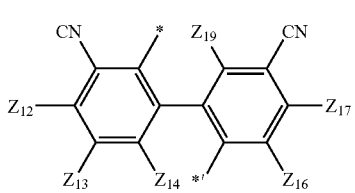 OO22
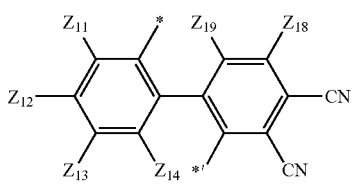 OO23
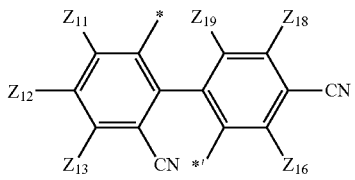 OO24
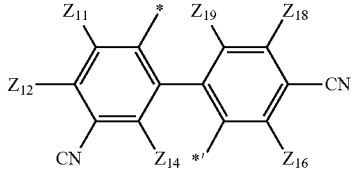 OO25
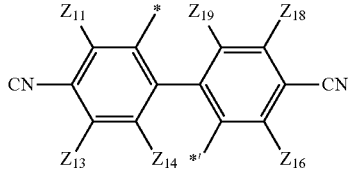 OO26

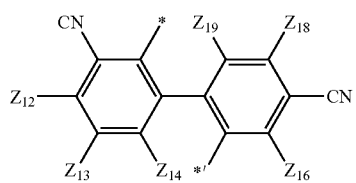 OO27
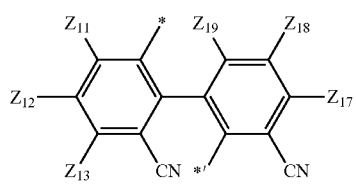 OO28
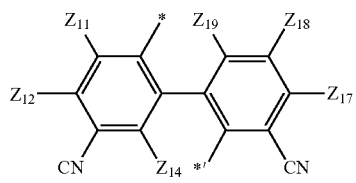 OO29
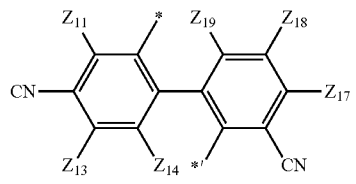 OO30
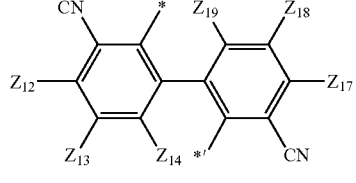 OO31
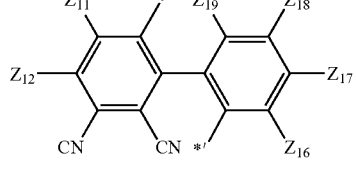 OO32
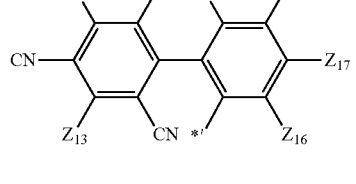 OO33
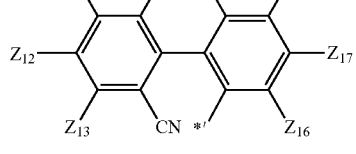 OO34
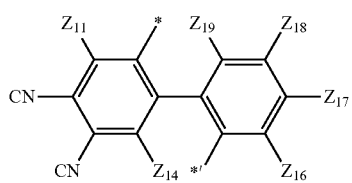 OO35
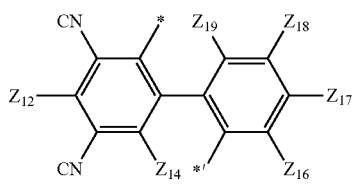 OO36
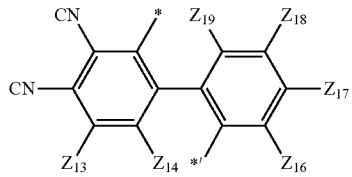 OO37
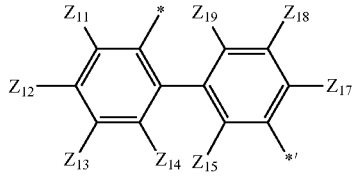 OM1
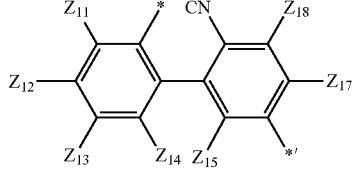 OM2
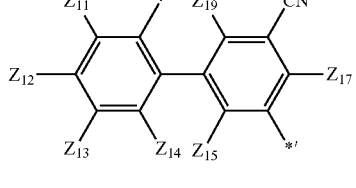 OM3
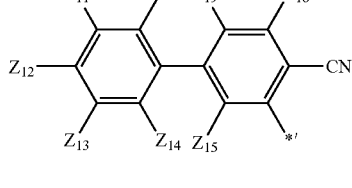 OM4
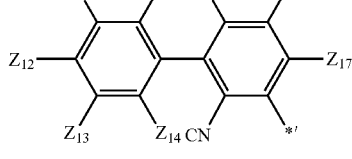 OM5

OM6
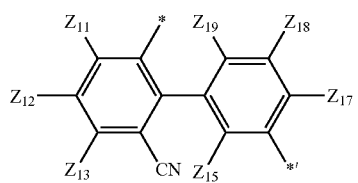
OM7
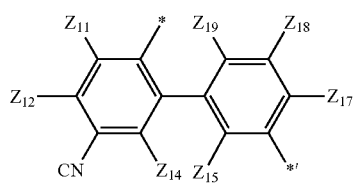
OM8
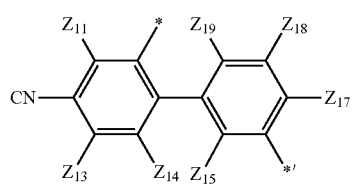
OM9
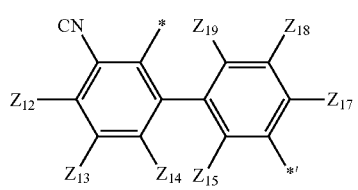
OM10
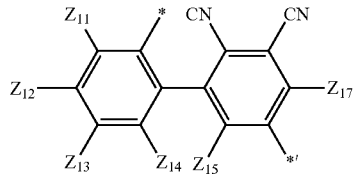
OM11
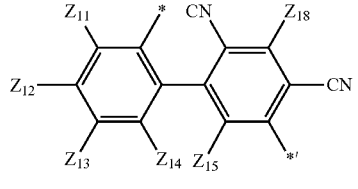
OM12
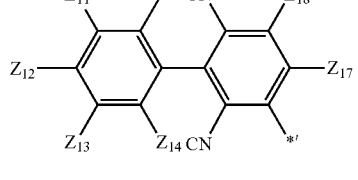
OM13
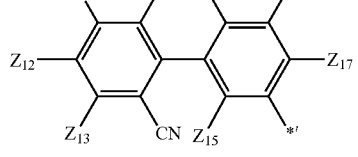
OM14
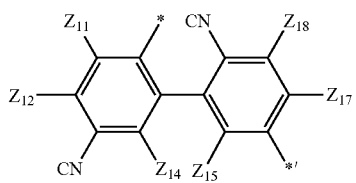
OM15
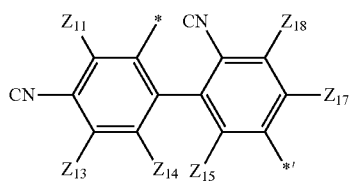
OM16
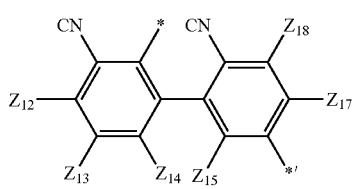
OM17
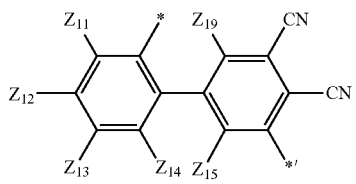
OM18
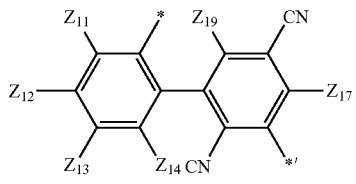
OM19
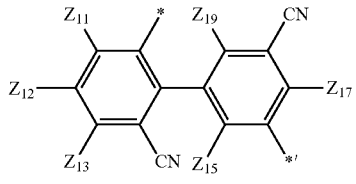
OM20
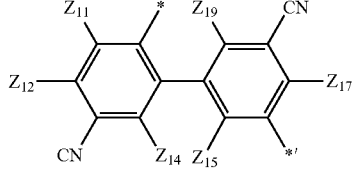
OM21
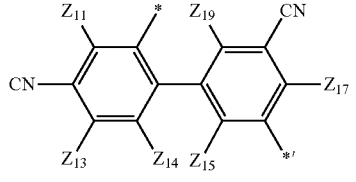

| | |
|---|---|
| 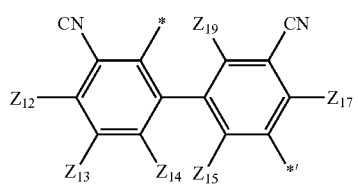 OM22 | 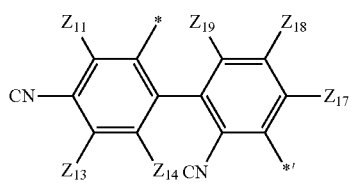 OM30 |
| 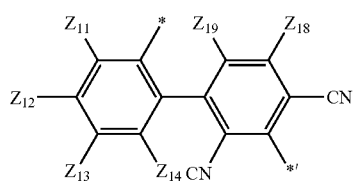 OM23 | 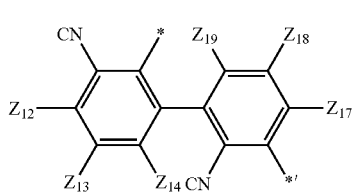 OM31 |
| 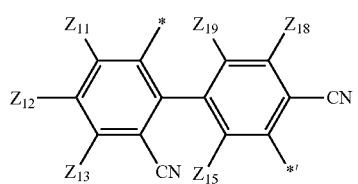 OM24 | 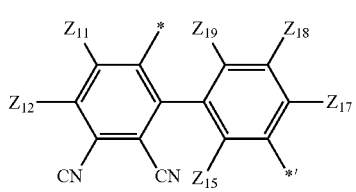 OM32 |
| 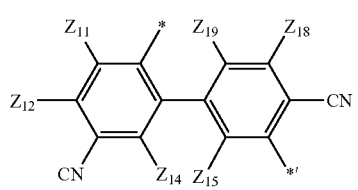 OM25 | 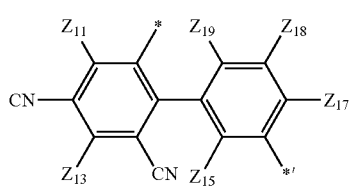 OM33 |
| 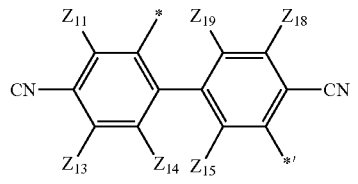 OM26 | 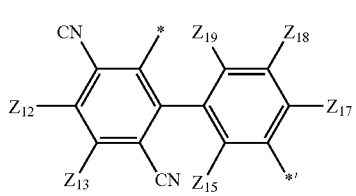 OM34 |
| 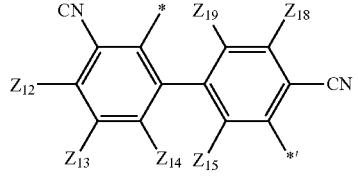 OM27 | 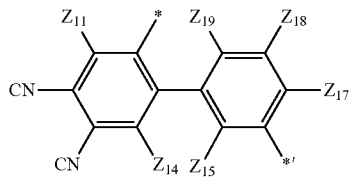 OM35 |
| 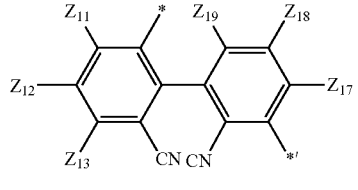 OM28 | 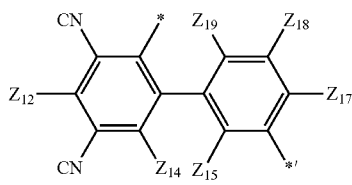 OM36 |
| 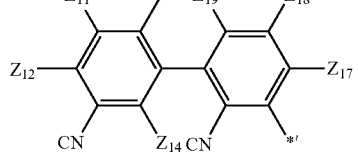 OM29 | 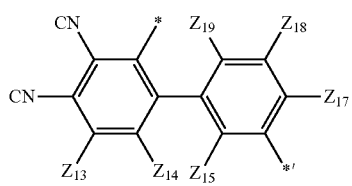 OM37 |

-continued
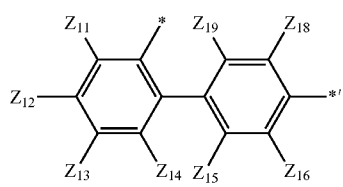
OP1
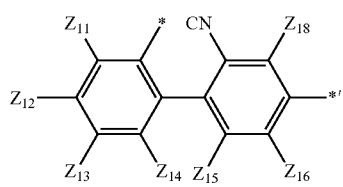
OP2
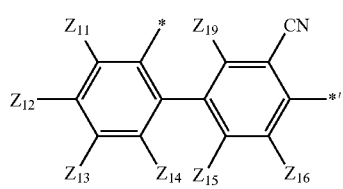
OP3
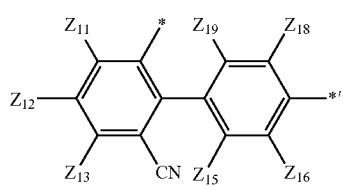
OP4
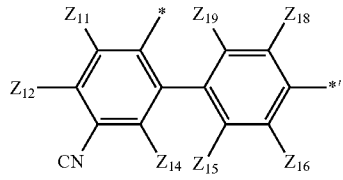
OP5
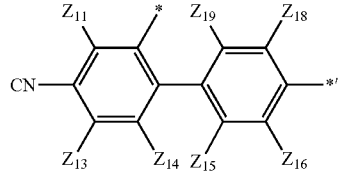
OP6
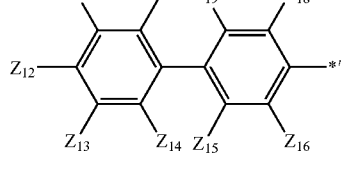
OP7
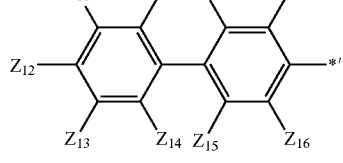
OP8
-continued
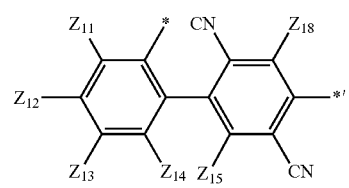
OP9
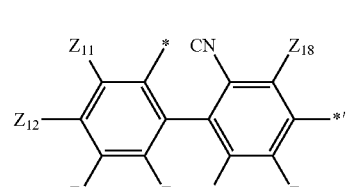
OP10
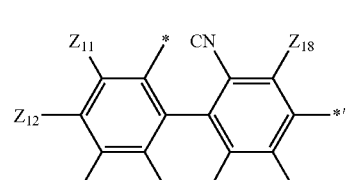
OP11
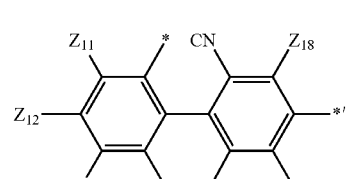
OP12
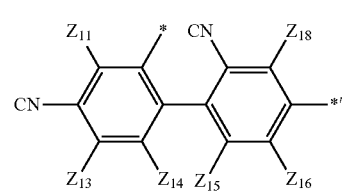
OP13
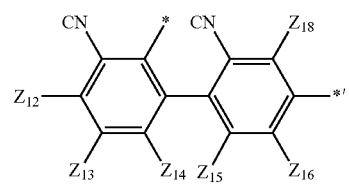
OP14
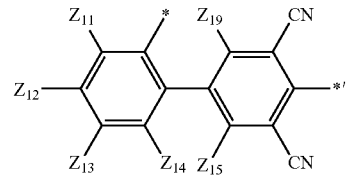
OP15
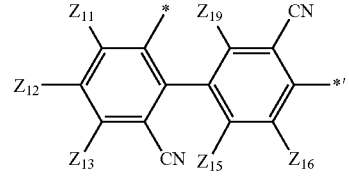
OP16

-continued
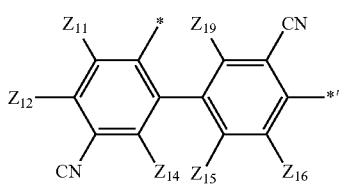 OP17
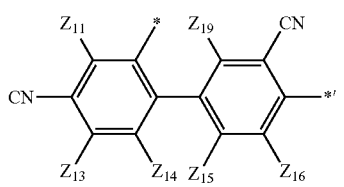 OP18
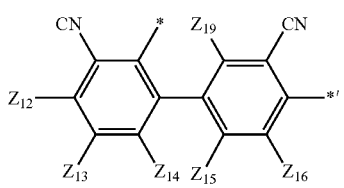 OP19
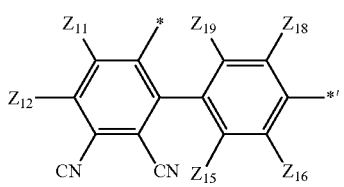 OP20
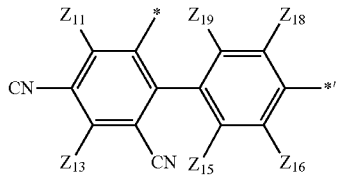 OP21
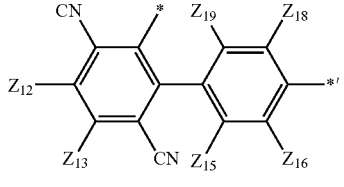 OP22
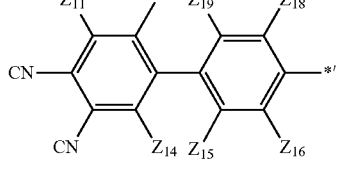 OP23
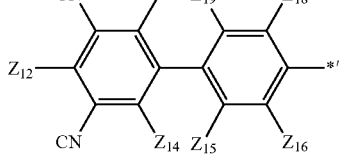 OP24
-continued
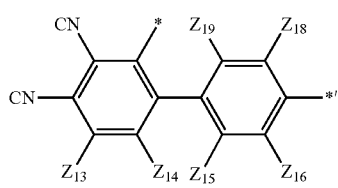 OP25
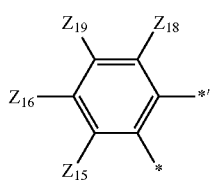 O1
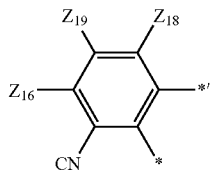 O2
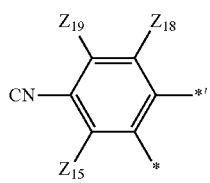 O3
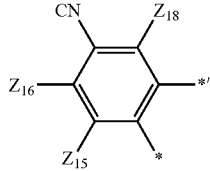 O4
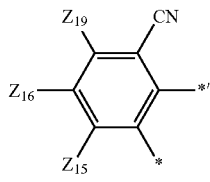 O5
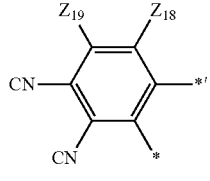 O6
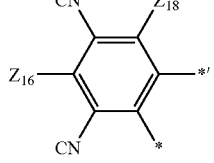 O7

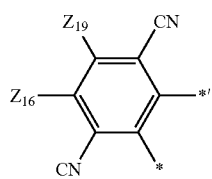 O8
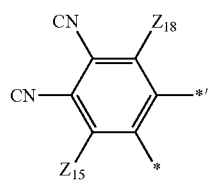 O9
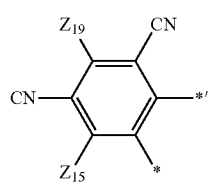 O11
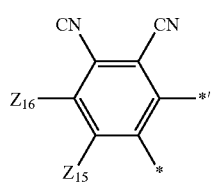 O11
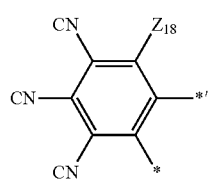 O12
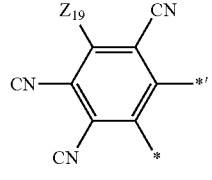 O13
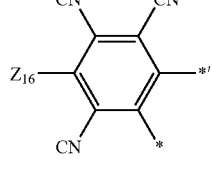 O14
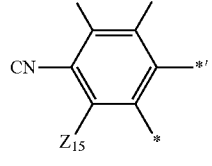 O15
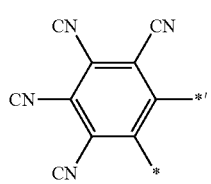 O16
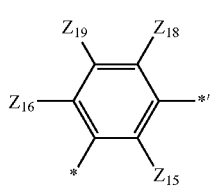 M1
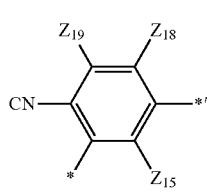 M2
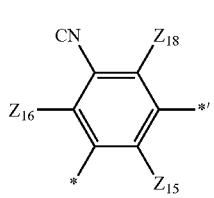 M3
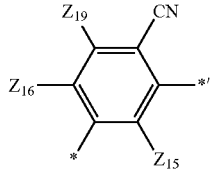 M4
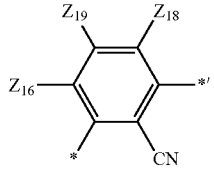 M5
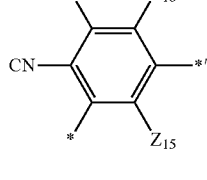 M6
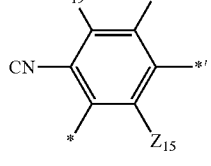 M7

| | |
|---|---|
| 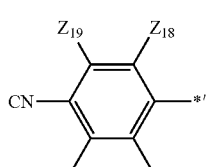 M8 | 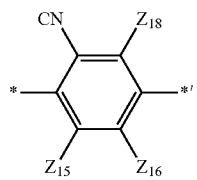 P1 |
| 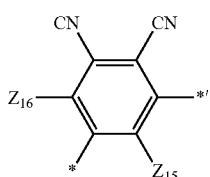 M9 | 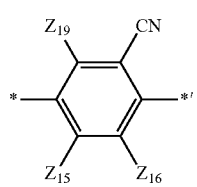 P2 |
| 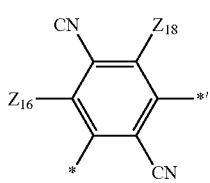 M10 | 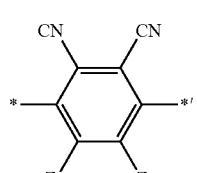 P3 |
| 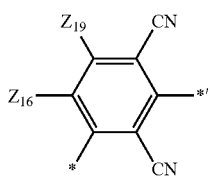 M11 | 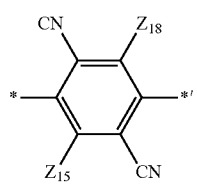 P4 |
| 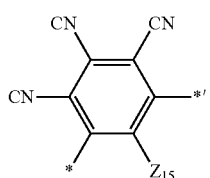 M12 | 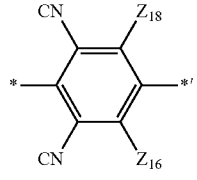 P5 |
| 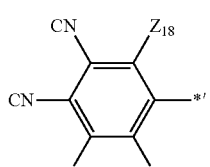 M13 | 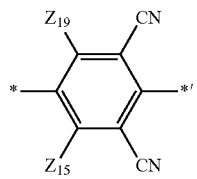 P6 |
| 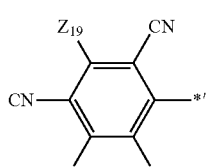 M14 | 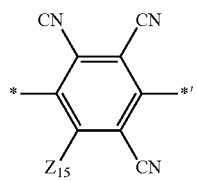 P7 |
| 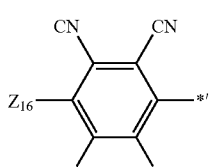 M15 | 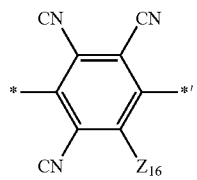 P8 |
| 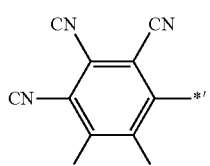 M16 | |

-continued

P9

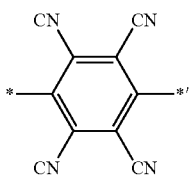

wherein, in Formulae PO1 to PO25, PM1 to PM25, PP1 to PP18, MO1 to MO37, MM1 to MM37, MP1 to MP25, OO1 to OO37, OM1 to OM37, OP1 to OP25, O1 to O16, M1 to M16, and P1 to P9, $Z_{10}$ to $Z_{19}$ are each independently;

Hydrogen or deuterium; or a $C_1$-$C_{20}$ alkyl group, a phenyl group, a biphenyl group, a terphenyl group, a dibenzofuranyl group, or a dibenzothiophenyl group, each unsubstituted or substituted with at least one selected from deuterium, a cyano group, a $C_1$-$C_{20}$ alkyl group, a phenyl group, and a biphenyl group, and

* and *' each indicate a binding site to a neighboring atom, provided that when the second material comprises a compound represented by Formula E-1(1) and the group represented by

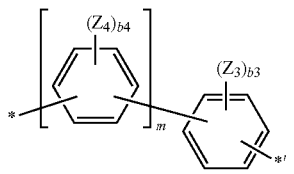

in Formula E-1(1) is one of groups represented by Formulae MM4, MM26, and M3, then (i) at least one of $Z_{10}$ and $Z_{12}$ to $Z_{19}$ is deuterium, a $C_1$-$C_{20}$ alkyl group, a phenyl group, a biphenyl group, a terphenyl group, a dibenzofuranyl group, or a dibenzothiophenyl group, each unsubstituted or substituted with at least one selected from deuterium, a cyano group, a $C_1$-$C_{20}$ alkyl group, a phenyl group, or a biphenyl group; or (ii) $A_1$, $A_2$, $A_5$, and $A_6$ are not simultaneously a benzene group, wherein the light-emitting material comprises an organometallic compound represented by Formula 1:

Formula 1

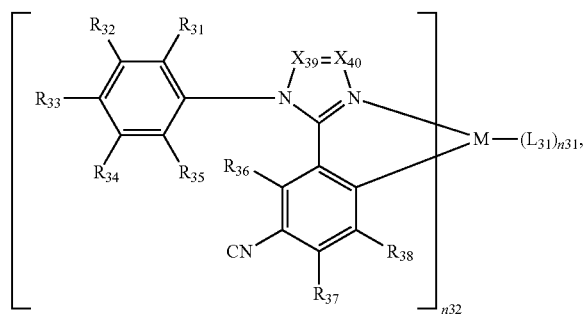

wherein, in Formula 1,

M is selected from a first-row transition metal, a second-row transition metal, and a third-row transition metal, $L_{31}$ is selected from a monodentate ligand and a bidentate ligand, n31 is 0, 1, 2, 3, or 4, wherein, when n31 is two or more, two or more groups $L_{31}$ are identical to or different from each other, n32 is 1, 2, or 3, $X_{39}$ is N or $C(R_{39})$ and $X_{40}$ is N or $C(R_{40})$, $R_{31}$ to $R_{35}$ are each independently selected from:

hydrogen, deuterium, a $C_1$-$C_{20}$ alkyl group, a phenyl group, a biphenyl group or a terphenyl group; or a $C_1$-$C_{20}$ alkyl group, a phenyl group, a biphenyl group, or a terphenyl group, each substituted with at least one selected from deuterium and a $C_1$-$C_{20}$ alkyl group, $R_{36}$ to $R_{40}$ are each independently selected from hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, and —$P(=O)(Q_8)(Q_9)$, wherein at least one of $R_{31}$ to $R_{40}$ comprises a $C_1$-$C_{20}$ alkyl group and a $C_1$-$C_{20}$ alkoxy group, each substituted with at least one deuterium, —$CD_3$, —$CD_2H$, and —$CDH_2$;

a cyclopentyl group, a cyclohexyl group, a cycloheptyl group, a cyclooctyl group, an adamantanyl group, a norbornanyl group, each substituted with at least one selected from deuterium, —$CD_3$, —$CD_2H$, and —$CDH_2$;

a norbornenyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from —$CD_3$, —$CD_2H$, and —$CDH_2$; —$N(Q_1)(Q_2)$, —$Si(Q_3)(Q_4)(Q_5)$, —$B(Q_6)(Q_7)$, and —$P(=O)(Q_8)(Q_9)$, wherein at least one of $Q_1$ to $Q_9$ is selected from —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one deuterium;

two or more adjacent groups among $R_{31}$ to $R_{40}$ are optionally linked to form a substituted or unsubstituted $C_5$-$C_{30}$ carbocyclic group or a substituted or unsubstituted $C_2$-$C_{30}$ heterocyclic group, at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, and —$P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, and —$P(=O)(Q_{28})(Q_{29})$, and —$N(Q_{31})(Q_{32})$, —$Si(Q_{33})(Q_{34})(Q_{35})$, —$B(Q_{36})(Q_{37})$, and —$P(=O)(Q_{38})(Q_{39})$, and $Q_1$ to $Q_9$, $Q_{11}$ to $Q_{19}$, $Q_{21}$ to $Q_{29}$, and $Q_{31}$ to $Q_{39}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

2. The organic light-emitting device of claim 1, wherein photoluminescence quantum yield (PLQY) of the exciplex is about 0.12 or less, and the PLQY of the exciplex is evaluated by measuring PLQY of a 50-nanometer-thick thin film formed by co-depositing the first material and the second material at a weight ratio of 5:5.

3. The organic light-emitting device of claim 1, wherein the singlet energy of the exciplex is in a range of about 2.80 electron volts to about 3.00 electron volts.

4. The organic light-emitting device of claim 1, wherein the first material does not comprise an electron transport moiety, and the second material comprises at least one electron transport moiety.

5. The organic light-emitting device of claim 4, wherein the absolute value of the difference between the triplet energy (expressed in electron volts) of the second material and the singlet energy (expressed in electron volts) of the exciplex is 0.1 electron volts or less.

6. The organic light-emitting device of claim 4, wherein the triplet energy (expressed in electron volts) of the first material is higher than or equal to the singlet energy (expressed in electron volts) of the exciplex.

7. The organic light-emitting device of claim 4, wherein the triplet energy (expressed in electron volts) of the second material is higher than or equal to the singlet energy (expressed in electron volts) of the exciplex.

8. The organic light-emitting device of claim 1, wherein triplet energy of the light-emitting material is in a range of about 2.60 electron volts to about 2.80 electron volts, and the triplet energy of the light-emitting material is calculated from a peak wavelength of a phosphorescence spectrum measured at 77 Kelvins with respect to a mixture of the light-emitting material and 2-MeTHF.

9. The organic light-emitting device of claim 1, wherein the first material comprises at least one π electron-depleted nitrogen-free cyclic group and does not comprise an electron transport moiety, the second material comprises at least one π electron-depleted nitrogen-free cyclic group and at least one electron transport moiety, and the electron transport moiety is selected from a cyano group, a π electron-depleted nitrogen-containing cyclic group, and a group represented by one of the following Formulae:

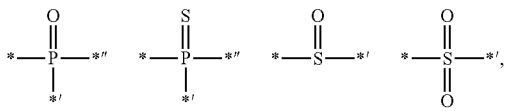

wherein, in the Formulae above, *, *', and *" each indicate a binding site to a neighboring atom.

10. The organic light-emitting device of claim 1, wherein the first material comprises at least one selected from a compound represented by Formula H-1(1), a compound represented by Formula H-1(2), and a compound represented by Formula H-1(3):

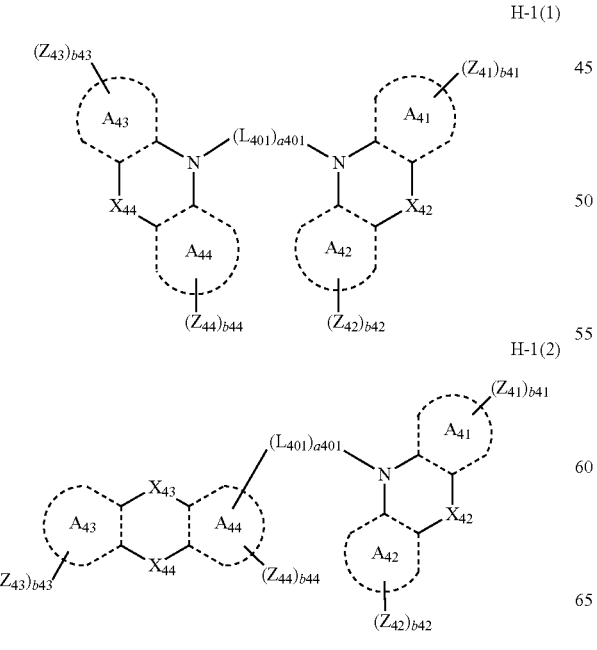

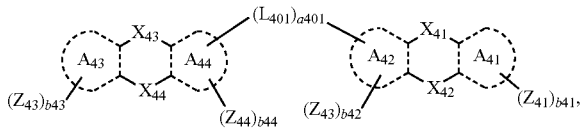

wherein, in Formulae H-1(1) to H-1(3), rings $A_{41}$ to $A_{44}$ are each independently a benzene group, a naphthalene group, an indene group, an indole group, a benzofuran group, a benzothiophene group, a benzosilole group, a fluorene group, a carbazole group, a dibenzofuran group, a dibenzothiophene group, or a dibenzosilole group, $X_{41}$ is $N\text{-}[(L_{411})_{c411}\text{-}Z_{411}]$, $C(Z_{415})(Z_{416})$, O, or S, $X_{42}$ is a single bond, $N\text{-}[(L_{412})_{c412}\text{-}Z_{412}]$, $C(Z_{417})(Z_{418})$, O, or S, $X_{43}$ is $N\text{-}[(L_{413})_{c413}\text{-}Z_{413}]$, $C(Z_{419})(Z_{420})$, O, or S, $X_{44}$ is a single bond, $N\text{-}[(L_{414})_{c414}\text{-}Z_{414}]$, $C(Z_{421})(Z_{422})$, O, or S, $L_{401}$ and $L_{411}$ to $L_{414}$ are each independently selected from:

a single bond; and a π electron-depleted nitrogen-free cyclic group unsubstituted or substituted with at least one selected from deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, a tetraphenyl group, and $-\text{Si}(Q_{401})(Q_{402})(Q_{403})$, a401 and c411 to c414 are each independently an integer from 1 to 10, wherein, when a401 is two or more, two or more groups $L_{401}$ are identical to or different from each other, when c411 is two or more, two or more groups $L_{411}$ are identical to or different from each other, when c412 is two or more, two or more groups $L_{412}$ are identical to or different from each other, when c413 is two or more, two or more groups $L_{413}$ are identical to or different from each other, and when c414 is two or more, two or more groups $L_{414}$ are identical to or different from each other, $Z_{41}$ to $Z_{44}$ and $Z_{411}$ to $Z_{422}$ are each independently selected from:

hydrogen, deuterium, a $C_1$-$C_{10}$ alkyl group, and a $C_1$-$C_{10}$ alkoxy group; and a π electron-depleted nitrogen-free cyclic group unsubstituted or substituted with at least one selected from deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, a tetraphenyl group, and $-\text{Si}(Q_{401})(Q_{402})(Q_{403})$, b41 to b44 are each independently 1, 2, 3, or 4, and $Q_{401}$ to $Q_{403}$ are each independently hydrogen, deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, or a tetraphenyl group.

11. The organic light-emitting device of claim 10, wherein $L_{401}$ and $L_{411}$ to $L_{414}$ are each independently selected from:

a single bond; and a benzene group, a fluorene group, a dibenzofuran group, a dibenzothiophene group, a carbazole group, a dibenzosilole group, an indenocarbazole group, an indolocarbazole group, a benzofurocarbazole group, a benzothienocarbazole group, a benzosilolocarbazole group, an acridine group, or a dihydroacridine group, each unsubstituted or substituted with at least one selected from deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, and a tetraphenyl group, and $Z_{41}$ to $Z_{44}$ and $Z_{411}$ to $Z_{422}$ are each independently selected from:

hydrogen, deuterium, a $C_1$-$C_{10}$ alkyl group, and a $C_1$-$C_{10}$ alkoxy group; and a phenyl group, a biphenyl group, a terphenyl group, a tetraphenyl group, a fluorenyl group, a dibenzocarbazolyl group, a dibenzofuranyl group, a dibenzothiophenyl group, a carbazolyl group, a dibenzosilolyl group, an indenocarbazolyl group, an indolocarbazolyl group, a benzofurocarbazolyl group, a benzothienocarbazolyl group, a benzosilolocarbazolyl group, an acridinyl group, or a dihydroacridinyl group, each unsubstituted or substituted with at least one selected from deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, and a tetraphenyl group.

12. The organic light-emitting device of claim 1, wherein the second material comprises at least one cyano group.

13. The organic light-emitting device of claim 1, wherein the second material comprises a benzene moiety substituted with at least one cyano group, and the benzene moiety substituted with at least one cyano group is not condensed to a neighboring ring and is bound to a neighboring ring via a single bond.

14. The organic light-emitting device of claim 1, wherein, in Formulae E-1(1) to E-1(3), at least one of groups $Z_1$ in the number of b1 and groups $Z_2$ in the number of b2 is a cyano group, at least one of groups $Z_3$ in the number of b3 and groups $Z_4$ in the number of b4 is a cyano group, at least one of groups $Z_5$ in the number of b5 and groups $Z_6$ in the number of b6 is a cyano group, at least one of groups $Z_1$ in the number of b1 and groups $Z_2$ in the number of b2 is a cyano group, and at least one of groups $Z_3$ in the number of b3 and groups $Z_4$ in the number of b4 is a cyano group, at least one of groups $Z_1$ in the number of b1 and groups $Z_2$ in the number of b2 is a cyano group, and at least one of groups $Z_5$ in the number of b5 and groups $Z_6$ in the number of b6 is a cyano group, at least one of groups $Z_3$ in the number of b3 and groups $Z_4$ in the number of b4 is a cyano group, and at least one of groups $Z_5$ in the number of b5 and groups $Z_6$ in the number of b6 is a cyano group, or at least one of groups $Z_1$ in the number of b1 and groups $Z_2$ in the number of b2 is a cyano group, at least one of groups $Z_3$ in the number of b3 and groups $Z_4$ in the number of b4 is a cyano group, and at least one of groups $Z_5$ in the number of b5 and groups $Z_6$ in the number of b6 is a cyano group.

15. The organic light-emitting device of claim 1, wherein the transition metal-containing phosphorescent material comprises a bidentate ligand and a transition metal, the bidentate ligand comprising at least one cyano group or at least one fluoro group.

16. The organic light-emitting device of claim 1, wherein at least one of $R_{31}$, $R_{33}$, and $R_{35}$ in Formula 1 is independently:

deuterium, a cyano group, a $C_1$-$C_{20}$ alkyl group, a phenyl group, a biphenyl group, or a terphenyl group; or a $C_1$-$C_{20}$ alkyl group, a phenyl group, a biphenyl group, or a terphenyl group, each unsubstituted or substituted with at least one selected from deuterium, a cyano group, and a $C_1$-$C_{20}$ alkyl group.

17. The organic light-emitting device of claim 1, wherein a total amount of the first material and the second material is larger than an amount of the light-emitting material.

18. An organic light-emitting device comprising:

a first electrode;

a second electrode facing the first electrode; and an emission layer disposed between the first electrode and the second electrode, wherein the emission layer comprises a first material, a second material, and a light-emitting material, the light-emitting material comprises a transition metal-containing phosphorescent material that emits blue light having a maximum emission wavelength in a range of about 420 nanometers to about 480 nanometers, the emission layer emits blue phosphorescence generated when an exciton of the transition metal-containing phosphorescent material transits from a triplet excited state to a ground state, the first material and the second material are different from each other, the first material and the second material form an exciplex, at least one of an absolute value of a difference between triplet energy (expressed in electron volts) of the first material and singlet energy (expressed in electron volts) of the exciplex and an absolute value of a difference between triplet energy (expressed in electron volts) of the second material and the singlet energy (expressed in electron volts) of the exciplex is about 0.1 electron volts or less, the triplet energy of the first material is calculated from a peak wavelength of a phosphorescence spectrum measured at 77 Kelvins with respect to a mixture of the first material and 2-MeTHF, the triplet energy of the second material is calculated from a peak wavelength of a phosphorescence spectrum measured at 77 Kelvins with respect to a mixture of the second material and 2-MeTHF, and the singlet energy of the exciplex is calculated from a peak wavelength of a fluorescence spectrum measured at room temperature with respect to a 50-nanometer-thick thin film formed by co-depositing the first material and the second material at a weight ratio of 5:5, wherein the second material is selected from at least one of Compounds E2 to E6

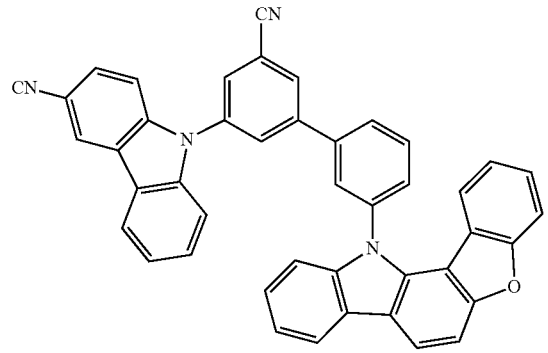

E2

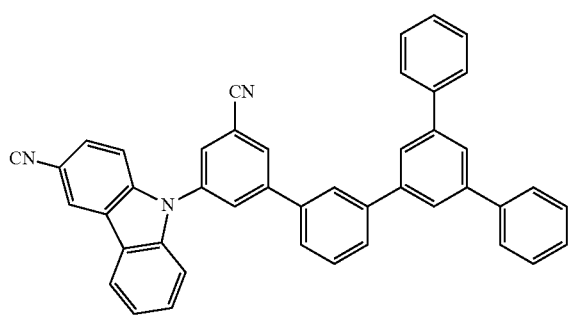

E3

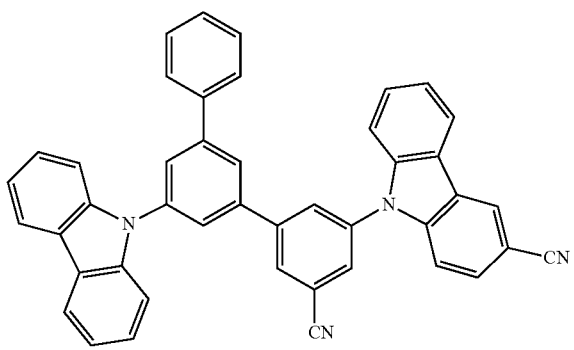

E4

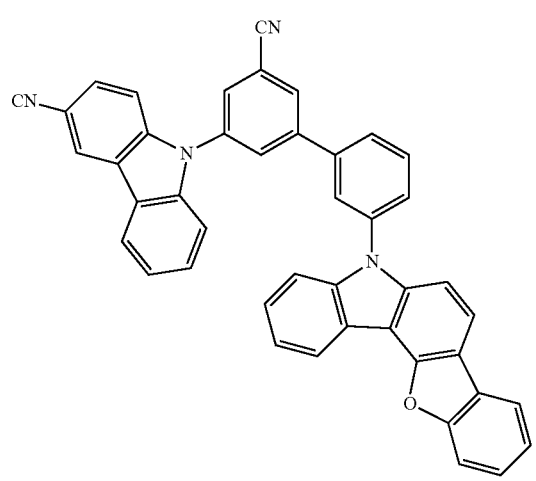

E5

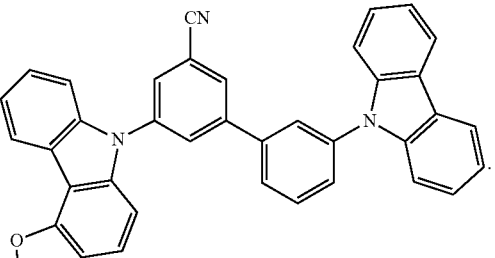

E6

19. An organic light-emitting device comprising:

a first electrode;

a second electrode facing the first electrode; and an emission layer disposed between the first electrode and the second electrode, wherein the emission layer comprises a first material, a second material, and a light-emitting material, the light-emitting material comprises a transition metal-containing phosphorescent material that emits blue light having a maximum emission wavelength in a range of about 420 nanometers to about 480 nanometers, the emission layer emits blue phosphorescence generated when an exciton of the transition metal-containing phosphorescent material transits from a triplet excited state to a ground state, the first material and the second material are different from each other, the first material and the second material form an exciplex, at least one of an absolute value of a difference between triplet energy (expressed in electron volts) of the first material and singlet energy (expressed in electron volts) of the exciplex and an absolute value of a difference between triplet energy (expressed in electron volts) of the second material and the singlet energy (expressed in electron volts) of the exciplex is about 0.1 electron volts or less, the triplet energy of the first material is calculated from a peak wavelength of a phosphorescence spectrum measured at 77 Kelvins with respect to a mixture of the first material and 2-MeTHF, the triplet energy of the second material is calculated from a peak wavelength of a phosphorescence spectrum measured at 77 Kelvins with respect to a mixture of the second material and 2-MeTHF, and the singlet energy of the exciplex is calculated from a peak wavelength of a fluorescence spectrum measured at room temperature with respect to a 50-nanometer-thick thin film formed by co-depositing the first material and the second material at a weight ratio of 5:5, wherein
the light-emitting material is selected from at least one of Compounds D2, and D5 to D11:
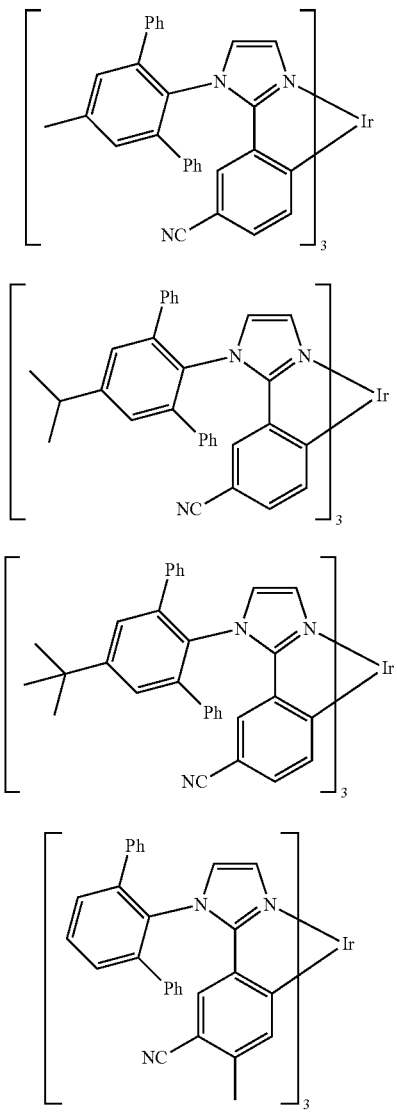
-continued
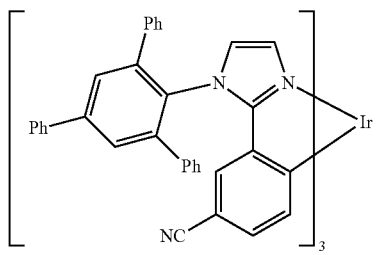
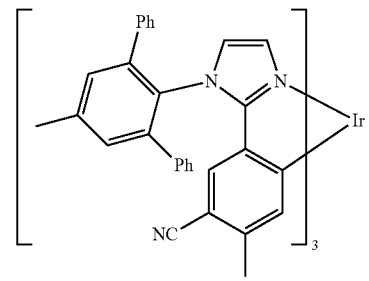
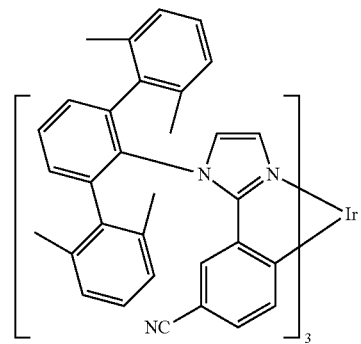
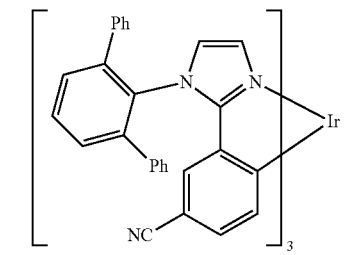
* * * * *